United States Patent
Ando et al.

(10) Patent No.: US 7,894,023 B2
(45) Date of Patent: Feb. 22, 2011

(54) METHOD OF PRODUCING FINE PARTICLES OF ANTHRAQUINONE STRUCTURE-CONTAINING PIGMENT, FINE PARTICLES OF ANTHRAQUINONE STRUCTURE-CONTAINING PIGMENT PRODUCED THEREBY, COLORED PIGMENT DISPERSION COMPOSITION THEREWITH, COLORED PHOTOSENSITIVE RESIN COMPOSITION THEREWITH AND PHOTOSENSITIVE RESIN TRANSFER MATERIAL THEREWITH, AND COLOR FILTER AND LIQUID CRYSTAL DISPLAY DEVICE USING THE SAME

(75) Inventors: Takeshi Ando, Fujinomiya (JP); Tomohiro Kodama, Fujinomiya (JP)

(73) Assignee: Fujifilm Corporation, Tokyo (JP)

( * ) Notice: Subject to any disclaimer, the term of this patent is extended or adjusted under 35 U.S.C. 154(b) by 276 days.

(21) Appl. No.: 12/161,990

(22) PCT Filed: Dec. 21, 2006

(86) PCT No.: PCT/JP2006/325514

§ 371 (c)(1),
(2), (4) Date: Jul. 24, 2008

(87) PCT Pub. No.: WO2007/086217

PCT Pub. Date: Aug. 2, 2007

(65) Prior Publication Data

US 2009/0033844 A1      Feb. 5, 2009

(30) Foreign Application Priority Data

Jan. 26, 2006   (JP) .............................. 2006-017854

(51) Int. Cl.
*G02F 1/1335*  (2006.01)
*C08K 5/01*    (2006.01)
*C08L 79/00*   (2006.01)
*C08L 33/02*   (2006.01)
*G03F 7/004*   (2006.01)
*G03F 1/00*    (2006.01)

(52) U.S. Cl. ........................ 349/106; 349/187; 106/493; 524/612; 524/560; 430/270.1; 430/7

(58) Field of Classification Search ................ 349/187, 349/189, 190, 104, 106; 524/612, 560; 106/493; 430/270.1, 7

See application file for complete search history.

(56) References Cited

U.S. PATENT DOCUMENTS 5,362,417 A * 11/1994 Ziolo .......................... 516/77

(Continued)

FOREIGN PATENT DOCUMENTS

JP        11-237754 A      8/1999

(Continued)

Primary Examiner—Brian M Healy
(74) Attorney, Agent, or Firm—Birch, Stewart, Kolasch & Birch, LLP

(57) ABSTRACT

A method of producing fine particles of an anthraquinone structure-containing pigment, including mixing a solution of an anthraquinone structure-containing pigment dissolved in a good solvent with a solvent that is compatible with the good solvent but is a poor solvent for the pigment, to form fine particles of nanometer-sized anthraquinone structure-containing pigments; fine particles of an anthraquinone structure-containing pigment produced by the same; a colored pigment dispersion composition, colored photosensitive resin composition and photosensitive resin transfer material each having the same; and a color filter and a liquid crystal display device using the same.

16 Claims, 5 Drawing Sheets

U.S. PATENT DOCUMENTS

| | | | |
|---|---|---|---|
| 7,503,972 B2 * | 3/2009 | Nagasawa et al. | 106/493 |
| 2009/0033844 A1 * | 2/2009 | Ando et al. | 349/106 |
| 2009/0069473 A1 * | 3/2009 | Kusano et al. | 524/155 |

FOREIGN PATENT DOCUMENTS

| | | |
|---|---|---|
| JP | 11-269401 A | 10/1999 |
| JP | 11-302553 A | 11/1999 |
| JP | 2000-239554 A | 9/2000 |
| JP | 2001-31885 A | 2/2001 |
| JP | 2002-194244 A | 7/2002 |
| JP | 2003-336001 A | 11/2003 |
| JP | 2004-123853 A | 4/2004 |
| JP | 2005-270867 A | 10/2005 |
| WO | WO-2006/121016 A1 | 11/2006 |
| WO | WO-2006/121017 A1 | 11/2006 |

* cited by examiner 75    74    75

METHOD OF PRODUCING FINE PARTICLES OF ANTHRAQUINONE STRUCTURE-CONTAINING PIGMENT, FINE PARTICLES OF ANTHRAQUINONE STRUCTURE-CONTAINING PIGMENT PRODUCED THEREBY, COLORED PIGMENT DISPERSION COMPOSITION THEREWITH, COLORED PHOTOSENSITIVE RESIN COMPOSITION THEREWITH AND PHOTOSENSITIVE RESIN TRANSFER MATERIAL THEREWITH, AND COLOR FILTER AND LIQUID CRYSTAL DISPLAY DEVICE USING THE SAME

TECHNICAL FIELD

The present invention relates to fine particles of anthraquinone structure-containing pigments for use in color filters and so on, and to a method of producing the same. The present invention also relates to a colored pigment dispersion composition, a colored photosensitive resin composition and a photosensitive resin transfer material, each including the fine particles. Further, the present invention also relates to a color filter and a liquid crystal display device using the same.

BACKGROUND ART

Pigments have been used in a variety of fields because each of them has a bright color tone, and high in coloring power and light resistance. Examples of a practically important material among them, in general, include a fine particle form of pigments. The pigments are formed into fine-particles preventing them from aggregation so that bright their color tone and high coloring power can be obtained. In this regard, in many cases, when the fine pigment particles are reduced in size by a physical method such as salt milling, the dispersion of fine pigment particles results in a high viscosity liquid. Consequently, when the pigment dispersion liquid is prepared on an industrial scale, there arise the following problems: the pigment-dispersion liquid prepared can not be taken out of a dispersion machine, the dispersion liquid can not be transported through a pipeline, and further the dispersion liquid is sometimes solidified into a gel form during its storage.

Therefore, conventionally, to solve these problems and to obtain a pigment-dispersion liquid or colored photosensitive composition improved in fluidity and dispersibility, it has been attempted to modify the surface of an organic pigment (see, for example, JP-A-11-269401 ("JP-A" means unexamined published Japanese patent application) and JP-A-11-302553) and to use various dispersing agents (see, for example, JP-A-8-48890 and JP-A-2000-239554). Further, reprecipitation of forming particles is disclosed in which a sample dissolved in a good solvent is injected into a poor solvent in, for example, JP-A-2004-123853 and JP-A-2003-336001.

For example, when colored images are formed using a colored photosensitive composition including such pigments, a layer made of the colored photosensitive composition is generally required to be very thin and to show a high color density even when the layer is thin. Therefore, for example, it is necessary to disperse highly and uniformly fine organic pigments in an organic solvent. However, there has been provided no pigment dispersion or no pigment dispersion composition satisfying such requirements and having good dispersibility, fluidity or the like.

DISCLOSURE OF INVENTION

Pyrrolopyrrole-series pigments such as C.I.P.R. 254 have an absorption band suitable for increasing the color purity of red pixels and therefore have been used for color filters. However, light sources widely used for liquid crystal displays, such as cold cathode tubes, emit a certain level of light on the shorter wavelength side than the red emission peak, so that the chromaticity of the pyrrolopyrrole-series pigments is lower than the NTSC chromaticity. Against this problem, it can be considered that the addition of an anthraquinone-series pigment such as C.I.P.R. 177 (for example, in an amount of about 20%) may improve the chromaticity. If the contrast can be improved with such a high-chromaticity color filter, it can be expected that display characteristics can be dramatically improved. However, as far as the inventors have made investigations, no product satisfying the requirements has been obtained even with the pigment species, when the inkjet ink described in JP-A-2003-336001, bead dispersion methods or salt milling methods are used for the production.

Therefore, an object of the present invention is to provide nanometer-sized fine particles of an anthraquinone structure-containing pigment having a sharp particle size distribution peak and to provide a method for producing such fine particles. Another object of the present invention is to provide fine particles of an anthraquinone structure-containing pigment that can exhibit excellent properties when used in color filters, and to provide a method for producing such fine particles. A further object of the present invention is to provide a color filter including the fine particles of an anthraquinone structure-containing pigment that can produce the desired chromaticity, high contrast and excellent display properties, and to provide a display including such a color filter. A further object of the present invention is to provide a colored pigment dispersion composition, a colored photosensitive resin composition and a photosensitive resin transfer material each for use in such a color filter or display.

According to the present invention, there is provided the following means:

(1) A method of producing fine particles of an anthraquinone structure-containing pigment, comprising: mixing a solution of an anthraquinone structure-containing pigment dissolved in a good solvent with a solvent that is compatible with the good solvent but is a poor solvent for the pigment, to form fine particles of nanometer-sized pigments;

(2) The method of producing fine particles of an anthraquinone structure-containing pigment as described in the above item (1), wherein the good solvent is a sulfoxide-series solvent, an amide-series solvent, or a mixed solvent thereof;

(3) The method of producing fine particles of an anthraquinone structure-containing pigment as described in the above item (1) or (2), when the good solvent contains a pigment dispersing agent;

(4) The method of producing fine particles of an anthraquinone structure-containing pigment as described in any one of the above items (1) to (3), wherein the pigment dispersing agent is a pigment dispersing agent including a graft copolymer having a nitrogen atom and an ether group;

(5) Fine particles of an anthraquinone structure-containing pigment produced by the method as described in any one of the above items (1) to (4), wherein the fine particles are nanometer-sized particles;

(6) The fine particles of an anthraquinone structure-containing pigment as described in the above item (5), wherein the anthraquinone structure-containing pigment is C.I.P.R. 177;

(7) A method of producing a colored pigment dispersion composition, comprising the step of (i) extracting the fine particles of a pigment as described in the above item (5) or (6) into an organic solvent and adding a binder to the thus-obtained extract or (ii) extracting the fine particles of a pigment as described in the above item (5) or (6) into an organic solvent containing a binder;

(8) A colored pigment dispersion composition produced by the producing method as described in the above item (7);

(9) A colored photosensitive resin composition, comprising at least (a) the colored pigment dispersion composition as described in the above item (8), (b) a binder, (c) a monomer or an oligomer, and (d) a photopolymerization initiator or a photopolymerization initiator system;

(10) A photosensitive resin transfer material, having at least a photosensitive resin layer containing the colored photosensitive resin composition as described in the above item (9) formed on a temporary support;

(11) A color filter, prepared by using the colored photosensitive resin composition as described in the above item (9); and

(12) A liquid crystal display device installed with the color filter as described in the above item (11).

Other and further features and advantages of the invention will appear more fully from the following description, taking the accompanying drawings into consideration.

BRIEF DESCRIPTION OF DRAWINGS

FIG. 2-1 is a sectional view schematically showing a preferred embodiment of the production apparatus that can be used in the method of producing fine particles of an anthraquinone structure-containing pigment of the present invention.

FIG. 2-2 is a partially enlarged sectional view schematically showing a mixing chamber as an embodiment of the production apparatus shown in FIG. 2-1.

FIG. 2-3 is a partially enlarged sectional view schematically showing a mixing chamber as another embodiment of the production apparatus shown in FIG. 2-1.

FIG. 3 is a sectional view schematically showing another preferred embodiment of the production apparatus that can be used in the method of producing fine particles of an anthraquinone structure-containing pigment of the present invention.

FIG. 5-1 is a front view schematically showing an example of a dissolver stirring blade that can be used in the method of producing fine particles of an anthraquinone structure-containing pigment of the present invention.

FIG. 5-2 is a photograph substituted for drawing, showing the dissolver stirring blade shown in FIG. 5-1.

Figure 1:
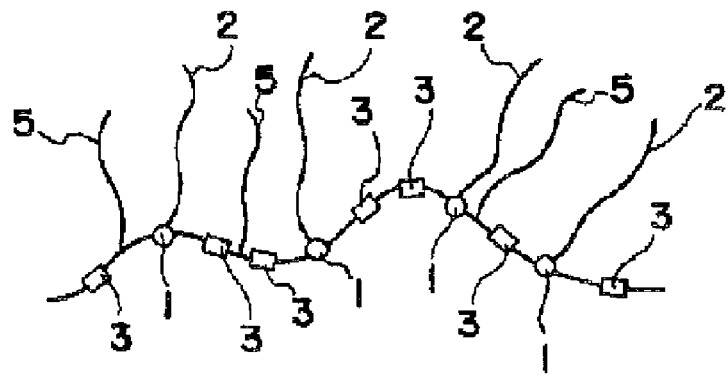
FIG. 1 is a schematic diagram schematically showing a part of the molecular structure of a preferred pigment dispersing agent that may be used in the method of producing fine particles of an anthraquinone structure-containing pigment of the present invention.

Symbols for principal elements in the figures are described below.

1 Binding site between the main chain and the side chain
2 Side chain
3 Nitrogen atom
5 Ether group-containing side chain
11 Container
11a Liquid phase (Solvent)
11b Liquid level
12 Stirring blade
13 Mixing chamber
14 Feed pipe
14a Opening of supply pipe
15 Shaft
16 Motor
17 Casing (Wall of mixing chamber)
18 Hole (Circular hole)
19a, 19b Stirring blade
21 Container (External wall of mixing vessel)
21a Stirring vessel
22 Stirring blade
23 Discharge pipe
24a, 24b Feed pipe
25 Shaft
50 Stirring device
32, 33 Feed port
36 Discharge port
40 Sealing plate
41, 42 Stirring blade
46 External magnet
48, 49 Motor
61 Disk part
62 Blade
63 Shaft
74 Revolving turbine unit
75 Fixed stator unit
81 Tank for storing dispersion
82 Circulation pump
83 Ultrafiltration module
84 Flow meter for measuring replenishment pure water
85 Flow meter for measuring permeated water
86 Reverse direction washing pump

BEST MODE FOR CARRYING OUT INVENTION

The present invention resides in a method for producing fine particles of an anthraquinone structure-containing pigment that includes mixing a solution of an anthraquinone structure-containing pigment dissolved in a good solvent with a solvent that is compatible with the good solvent but is a poor solvent for the pigment, to form fine particles of nanometer-sized pigments. The present invention is described in detail below.

[Organic Materials]

For the organic pigment to be used in the method of producing fine particles of an anthraquinone structure-containing pigment of the present invention, there is no particular limitation as long as the organic pigment have an anthraquinone structure. It may be used alone or in combination with any other pigment such as a perylene, perynone, quinacridone, quinacridonequinone, anthanthrone, benzimidazolone, disazo condensed, disazo, azo, indanthrone, phthalocyanine, triarylcarbonium, dioxazine, diketopyrrolopyrrole, thioindigo, isoindolin, isoindolinone, pyranthrone or isoviolanthrene-series pigment. Examples of the anthraquinone structure-containing pigment (hereinafter also referred to as the anthraquinone-series pigment) include the pigments described in pages 315 to 320 of "Ganryo no Jiten (Encyclopedia of Pigments), published by Asakura Publishing Co., Ltd., Sep. 25, 2000, and specific examples include anthraquinone-series pigments such as C.I.P.Y. 147 (C.I. No. 60645) and aminoanthraquinone-series pigments such as C.I.P.R. 177 (C.I. No. 65300). C.I.P.R. 177 is particularly preferred in view of chromaticity.

Examples of a pigment that can be used in combination with the anthraquinone-series pigment include perylene-series pigments, such as C.I. Pigment Red 190 (C.I. No. 71140), C.I. Pigment Red 224 (C.I. No. 71127), C.I. Pigment Violet 29 (C.I. No. 71129), or the like; perynone-series pigments, such as C.I. Pigment Orange 43 (C.I. No. 71105), C.I. Pigment Red 194 (C.I. No. 71100) or the like; quinacridone-series pigments, such as C.I. Pigment Violet 19 (C.I. No. 73900), C.I. Pigment Violet 42, C.I. Pigment Red 122 (C.I. No. 73915), C.I. Pigment Red 192, C.I. Pigment Red 202 (C.I. No. 73907), C.I. Pigment Red 207 (C.I. Nos. 73900, 73906), C.I. Pigment Red 209 (C.I. No. 73905) or the like; quinacridonequinone-series pigments, such as C.I. Pigment Red 206 (C.I. No. 73900/73920), C.I. Pigment Orange 48 (C.I. No. 73900/73920), C.I. Pigment Orange 49 (C.I. No. 73900/73920), or the like; anthanthrone-series pigments, such as C.I. Pigment Red 168 (C.I. No. 59300) or the like; benzimidazolone-series pigments, such as C.I. Pigment Brown 25 (C.I. No. 12510), C.I. Pigment Violet 32 (C.I. No. 12517), C.I. Pigment Yellow 180 (C.I. No. 21290), C.I. Pigment Yellow 181 (C.I. No. 1777), C.I. Pigment Orange 62 (C.I. No. 11775), C.I. Pigment Red 185 (C.I. No. 12516), or the like; condensed disazo-series pigments, such as C.I. Pigment Yellow 93 (C.I. No. 20710), C.I. Pigment Yellow 94 (C.I. No. 20038), C.I. Pigment Yellow 95 (C.I. No. 20034), C.I. Pigment Yellow 128 (C.I. No. 20037), C.I. Pigment Yellow 166 (C.I. No. 20035), C.I. Pigment Orange 34 (C.I. No. 21115), C.I. Pigment Orange 13 (C.I. No. 21110), C.I. Pigment Orange 31 (C.I. No. 20050), C.I. Pigment Red 144 (C.I. No. 20735), C.I. Pigment Red 166 (C.I. No. 20730), C.I. Pigment Red 220 (C.I. No. 20055), C.I. Pigment Red 221 (C.I. No. 20065), C.I. Pigment Red 242 (C.I. No. 20067), C.I. Pigment Red 248, C.I. Pigment Red 262, C.I. Pigment Brown 23 (C.I. No. 20060), or the like; disazo-series pigments, such as C.I. Pigment Yellow 13 (C.I. No. 21100), C.I. Pigment Yellow 83 (C.I. No. 21108), C.I. Pigment Yellow 188 (C.I. No. 21094), or the like; azo-series pigments, such as C.I. Pigment Red 187 (C.I. No. 12486), C.I. Pigment Red 170 (C.I. No. 12475), C.I. Pigment Yellow 74 (C.I. No. 11714), C.I. Pigment Yellow 150 (C.I. No. 48545), C.I. Pigment Red 48 (C.I. No. 15865), C.I. Pigment Red 53 (C.I. No. 15585), C.I. Pigment Orange 64 (C.I. No. 12760), C.I. Pigment Red 247 (C.I. No. 15915), or the like; indanthrone-series pigments, such as C.I. Pigment Blue 60 (C.I. No. 69800), or the like; phthalocyanine-series pigments, such as C.I. Pigment Green 7 (C.I. No. 74260), C.I. Pigment Green 36 (C.I. No. 74265), C.I. Pigment Green 37 (C.I. No. 74255), C.I. Pigment Blue 16 (C.I. No. 74100), C.I. Pigment Blue 75 (C.I. No. 74160:2), C.I. Pigment Blue 15:6 (C.I. No. 74160), C.I. Pigment Blue 15:3 (C.I. No. 74160), or the like; triaryl carbonium-series pigments, such as C.I. Pigment Blue 56 (C.I. No. 42800), C.I. Pigment Blue 61 (C.I. No. 42765:1), or the like; dioxazine-series pigments, such as C.I. Pigment Violet 23 (C.I. No. 51319), C.I. Pigment Violet 37 (C.I. No. 51345), or the like; diketopyrrolopyrrole-series pigments, such as C.I. Pigment Red 254 (C.I. No. 56110), C.I. Pigment Red 255 (C.I. No. 561050), C.I. Pigment Red 264, C.I. Pigment Red 272 (C.I. No. 561150), C.I. Pigment Orange 71, C.I. Pigment Orange 73, or the like; thioindigo-series pigments, such as C.I. Pigment Red 88 (C.I. No. 73312), or the like; isoindoline-series pigments, such as C.I. Pigment Yellow 139 (C.I. No. 56298), C.I. Pigment Orange 66 (C.I. No. 48210), or the like; isoindolinone-series pigments, such as C.I. Pigment Yellow 109 (C.I. No. 56284), C.I. Pigment Yellow 185 (C.I. No. 56290), C.I. Pigment Orange 61 (C.I. No. 11295), or the like; pyranthrone-series pigments, such as C.I. Pigment Red 216 (C.I. No. 59710), or the like; quinophthalone-based pigments, such as C.I. Pigment Yellow 138, or the like; or isoviolanthrone-series pigments, such as C.I. Pigment Violet 31 (C.I. No. 60010), or the like.

In the method of producing fine particles of an anthraquinone structure-containing pigment according to the present invention, two or more organic pigments or solid solutions of organic pigment may be used in combination, or alternatively, a pigment may be used in combination with a common dye.

The dye that can be used in combination in the present invention is not particularly limited, and dye commonly used for color filters may be used. Examples thereof include dyes disclosed in, for example, JP-A-64-90403, JP-A-64-91102, JP-A-1-94301, JP-A-6-11614, Japanese Patent No. 2592207, U.S. Pat. Nos. 4,808,501, 5,667,920, 5,059,500, JP-A-5-333207, JP-A-6-35183, JP-A-6-51115, JP-A-6-194828, JP-A-8-211599, JP-A-4-249549, JP-A-10-123316, JP-A-11-302283, JP-A-7-286107, JP-A-2001-4823, JP-A-8-15522, JP-A-8-29771, JP-A-8-146215, JP-A-11-343437, JP-A-8-62416, JP-A-2002-14220, JP-A-2002-14221, JP-A-2002-14222, JP-A-2002-14223, JP-A-8-302224, JP-A-8-73758, JP-A-8-179120 and JP-A-8-151531.

Various dyes different in chemical structure, such as pyrazole azo dyes, anilino azo dyes, triphenylmethane dyes, anthraquinone dyes, anthrapyridone dyes, benzylidene dyes, oxonol dyes, pyrazolotriazole azo dyes, pyridone azo dyes, cyanine dyes, phenothiazine dyes, pyrrolopyrazole azomethine dyes, xanthene dyes, phthalocyanine dyes, benzopyran dyes, and indigo dyes, may be used.

Further, in a case of a resist system in which development is performed in water or an alkaline solution, an acid dye and/or a derivative thereof may favorably be used from the viewpoint of completely removing the binder and/or the dye in a light-unirradiated portion by the development. Further, for example, a direct dye, a basic dye, a mordant dye, an acid mordant dye, an azoic dye, a disperse dye, an oil-soluble dye, a dye for food and/or derivatives thereof may also be usefully used.

The acid dye is not particularly limited, so long as it is a dye having an acidic group such as, for example, a sulfonic acid and a carboxylic acid. However, it is necessary to select the acid dye by taking into consideration all of required properties, such as solubility against an organic solvent or a developer, formability of a salt with a basic compound, light absorbance, an interaction with any one of other components in the composition, light resistance and heat resistance.

Specific examples of the above-described acid dye are described below, but the present invention is not restricted to these examples. Examples thereof include Acid Alizarin Violet N; Acid Black 1, 2, 24, 48; Acid Blue 1, 7, 9, 15, 18, 23, 25, 27, 29, 40, 45, 62, 70, 74, 80, 83, 86, 87, 90, 92, 103, 112, 113, 120, 129, 138, 147, 158, 171, 182, 192, 243 and 324:1; Acid Chrome Violet K; Acid Fuchsin; Acid Green 1, 3, 5, 9, 16, 25, 27 and 50; Acid Orange 6, 7, 8, 10, 12, 50, 51, 52, 56, 63, 74 and 95; Acid Red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 183, 198, 211, 215, 216, 217, 249, 252, 257, 260, 266 and 274; Acid Violet 6B, 7, 9, 17 and 19; Acid Yellow 1, 3, 7, 9, 11, 17, 23, 25, 29, 34, 36, 42, 54, 72, 73, 76, 79, 98, 99, 111, 112, 114, 116, 184, and 243; Food Yellow 3; and derivatives of theses dyes.

In addition to the above dyes, acid dyes such as azo type, xanthene type and phthalocyanine type dyes are preferable, and acid dyes such as C.I. solvent Blue 44 and 38; C.I. Solvent Orange 45; Rhodamine B; Rhodamine 110; and derivatives thereof are preferably used.

Examples of the organic dye that can be used in combination with in the present invention include an azo dye, a cyanine dye, a merocyanine dye, and a coumarin dye. Examples of the polymer compound that can be used in combination with in the present invention include polydiacetylene and polyimide.

[Good Solvent]

Net, the good solvent for producing the anthraquinone-series pigment as pigment fine particles nanometer size (hereinafter, also referred to as "organic nanoparticles") will be described.

For the good solvent, there is no particular limitation as long as the good solvent can dissolve the anthraquinone structure-containing pigment (hereinafter, also referred to as "organic pigment" simply) to be used, and is compatible, or uniformly mixed, with the poor solvent to be used at the time of the production of the organic pigment fine particles. With respect to the solubility of the organic pigment in the good solvent, the solubility of the organic material is preferably 0.2 mass % or more, and more preferably 0.5 mass % or more. The solubility of the organic pigment in the good solvent has no particular upper limit, but it is practical that the solubility is 50 mass % or less in consideration of an organic pigment to be ordinarily used. The solubility may be solubility in the case where the organic pigment is dissolved in the presence of an acid or an alkali. Further, compatibility or uniform mixing property between the good solvent and the poor solvent is such that the solubility of the good solvent in the poor solvent is preferably 30 mass % or more, more preferably 50 mass % or more. The solubility of the good solvent in the poor solvent has no particular upper limit, but it is practical that the solvents can mix with each other at an arbitrary ratio.

Examples of the good solvents include aqueous solvents (e.g., water, hydrochloric acid, and aqueous sodium hydroxide solution), alcohol-series solvents, amide-series solvents, ketone-series solvents, ether-series solvents, aromatic solvents, carbon disulfide, aliphatic solvents, nitrile-series solvents, sulfoxide-series solvents, halogen-containing solvents, ester-series solvents, ionic liquids, mixed solvents thereof, and the like. Among these, aqueous solvents, alcohol-series solvents, ester-series solvents, sulfoxide-series solvents, and amide-series solvents are preferable; aqueous solvents, sulfoxide-series solvents, and amide-series solvents are more preferable; and sulfoxide-series solvents, and amide-series solvents are particularly preferable.

Examples of the alcohol-series solvents include methanol, ethanol, isopropyl alcohol, n-propyl alcohol and 1-methoxy-2-propanol. Examples of the amide-series solvents include N,N-dimethylformamide, 1-methyl-2-pyrrolidone, 2-pyrrolidinone, 1,3-dimethyl-2-imidazolidinone, 2-pyrroridinone, ε-caprolactam, formamide, N-methylformamide, acetamide, N-methylacetamide, N,N-dimethylacetamide, N-methylpropaneamide, and hexamethylphosphoric triamide. Examples of the ketone-series solvents include acetone, methyl ethyl ketone, methyl isobutyl ketone and cyclohexanone. Examples of ether-series solvents include dimethylether, diethylether and tetrahydrofuran. Examples of the aromatic solvents include benzene and toluene. Examples of the aliphatic solvents include hexane, and the like. Examples of the nitrile-series solvents include acetonitrile, and the like. Examples of the sulfoxide-series solvents include dimethyl sulfoxide, diethyl sulfoxide, hexamethylene sulfoxide, and sulfolane. Examples of the halogen-containing solvents include dichloromethane and trichloroethylene. Examples of the ester-series solvents include ethyl acetate, ethyl lactate and 2-(1-methoxy)propyl acetate. Examples of the ionic liquids include a salt of 1-butyl-3-methylimidazolium and $PF_6^-$, and the like.

Further, the concentration of the organic pigment solution prepared by dissolving the organic pigment in the good solvent is preferably in the range of from the saturation concentration of the organic pigment with respect to the good solvent under a condition at the time of the dissolution to about one hundredth of the saturation concentration.

The condition under which the organic pigment solution is prepared is not particularly restricted, and can be selected from a range from a normal pressure condition to a subcritical or supercritical condition. The temperature in the case where the solution is prepared under normal pressure is preferably −10 to 150° C., more preferably −5 to 130° C., and particularly preferably 0 to 100° C.

In the present invention, it is necessary that the organic pigment contained in the organic pigment solution used in the method of producing fine particles of an anthraquinone structure-containing pigment be uniformly dissolved in the good solvent, and further it is preferred that the organic pigment be dissolved when the solvent is acidic or alkaline. In general, in the case of a pigment having in the molecule thereof a group dissociative under alkaline conditions, an alkaline solvent is used, and in the case of a pigment having no group dissociative under alkaline conditions but having in the molecule thereof many nitrogen atoms, to which protons easily adhere, an acidic solvent is used. For example, quinacridone-, diketopyrrolopyrrole-, and condensed disazo-series pigments are dissolved in alkaline conditions, while phthalocyanine-series pigments are dissolved in acidic conditions.

Examples of a base that can be used in the case that the pigment is dissolved in the alkaline condition, include inorganic bases, such as lithium hydroxide, sodium hydroxide, potassium hydroxide, calcium hydroxide, and barium hydroxide; and organic bases, such as trialkylamine, diazabicycloundecene (DBU), and metal alkoxides. An inorganic base is preferred.

The amount of the base to be used is not particularly limited, as long as the base in the amount can homogeneously dissolve the pigment. In the case of the inorganic base, the amount thereof is preferably from 1.0 to 30 mole equivalents, more preferably from 1.0 to 25 mole equivalents, and further preferably from 1.0 to 20 mole equivalents, to the organic pigment. In the case of the organic base, the amount thereof is preferably from 1.0 to 100 mole equivalents, more preferably from 5.0 to 100 mole equivalents, and further preferably from 20 to 100 mole equivalents, to the organic pigment.

Examples of an acid to be used in the case that the pigment is dissolved in the acidic condition, include inorganic acids, such as sulfuric acid, hydrochloric acid, and phosphoric acid; and organic acids, such as acetic acid, trifluoroacetic acid, oxalic acid, methanesulfonic acid, and trifluoromethanesulfonic acid. Among these, the inorganic acids are preferable, and sulfuric acid is especially preferable.

The amount of the acid to be used is not particularly limited, as long as the acid in the amount can homogenously dissolve the organic pigment. In many cases, the acid is used in a larger or more excessive amount than the base. Regardless the kind of the acid being an inorganic acid or an organic acid, the amount of the acid to be used is preferably from 3 to 500 mole equivalents, more preferably from 10 to 500 mole equivalents, and further preferably from 30 to 200 mole equivalents, to the organic pigment.

[Poor Solvent]

Next, the poor solvent that can be preferably used to form the anthraquinone-series pigment as organic nanoparticles, is described below.

For the poor solvent, there is no particular limitation as long as the poor solvent does not dissolve an organic material to be used, and the poor solvent is compatible or uniformly mixed with the good solvent to be used at the time of the production of the organic pigment fine particles. With respect to the poor solvent for the organic pigment, the solubility of the organic pigment in the poor solvent is preferably 0.02 mass % or less, more preferably 0.01 mass % or less. A preferable range for compatibility or uniform mixing property between the poor solvent and the good solvent is as described above.

Examples of the poor solvents include aqueous solvents (e.g., water, hydrochloric acid, and aqueous sodium hydroxide solution), alcohol-series solvents, ketone-series solvents, ether-series solvents, aromatic solvents, carbon disulfide, aliphatic solvents, nitrile-series solvents, halogen-containing solvents, ester-series solvents, ionic liquids, and mixed solvents thereof. Preferable poor solvents include aqueous solvents, alcohol-series solvents and ester-series solvents.

Examples of the alcohol-series solvents include methanol, ethanol, isopropyl alcohol, n-propyl alcohol, and 1-methoxy-2-propanol. Examples of the ketone-series solvents include acetone, methyl ethyl ketone, methyl isobutyl ketone and cyclohexanone. Examples of the ether-series solvents include dimethylether, diethylether and tetrahydrofuran. Examples of the aromatic solvents include benzene and toluene. Examples of the aliphatic solvents include hexane, and the like. Examples of the nitrile-series solvents include acetonitrile, and the like. Examples of the halogen-containing solvents include dichloromethane and trichloroethylene. Examples of the ester-series solvents include ethyl acetate, ethyl lactate and 2-(1-methoxy)propyl acetate. Examples of the ionic liquids include a salt of 1-butyl-3-methylimidazolium and $PF_6^-$, and the like.

The above-described examples of the good solvent and those of the poor solvents overlap, but the identical solvent is not selected for both the good solvent and the poor solvent. Any solvents may be used in combination of them as long as an organic material to be used shows solubility in the good solvent sufficiently higher than that in the poor solvent. Specifically, the difference in solubility between them is preferably 0.2 mass % or more, and more preferably 0.5 mass % or more. There is no particular upper limit to the difference in solubility between the good solvent and the poor solvent. However, if ordinarily used organic materials are taken into consideration, it is practical that the upper limit is 50 mass % or less.

[Binder]

In the method of producing fine particles of an anthraquinone structure-containing pigment of the present invention, a binder may be added at the time of preparation of organic nanoparticles. As the binder, preferred are alkali-soluble binders having an acidic group. An acid group-containing, alkali-soluble binder may be added to one or both of the organic pigment solution and the poor solvent to which the organic pigment solution is to be added to form organic nanoparticles. Alternatively, it is also preferable to add a solution of the acid group-containing, alkali-soluble binder, which is independently prepared, at the time of the formation of the organic nanoparticles. The alkali-soluble binder having an acid group that can be used in the method of producing fine particles of an anthraquinone structure-containing pigment of the present invention is preferably a polymer having a polar group such as a carboxylic acid group or a carboxylate group at its side chain. Examples thereof include a methacrylic acid copolymer, an acrylic acid copolymer, an itaconic acid copolymer, a crotonic acid copolymer, a maleic acid copolymer, and a partially-esterified maleic acid copolymer, as described in JP-A-59-44615, JP-B-54-34327 ("JP-B" means examined Japanese patent publication), JP-B-58-12577, JP-B-54-25957, JP-A-59-53836, and JP-A-59-71048. The examples further include a cellulose derivative having a carboxylic acid group at its side chain. In addition to the foregoing, a product obtained by adding a cyclic acid anhydride to a polymer having a hydroxyl group can also be preferably used. In addition, particularly preferable examples of the binder include a copolymer of benzyl (meth)acrylate and (meth)acrylic acid and a multi-component copolymer of benzyl (meth)acrylate, (meth)acrylic acid, and any other monomer described in U.S. Pat. No. 4,139,391.

Further, for the purpose of improving crosslinking efficiency, a polymerizable group may be included in the side chain, and ultraviolet curing resins and thermosetting resins are also useful. Examples of the polymers containing polymerizable groups are given below, but not limited to these, provided that an alkali soluble group, such as —COOH group, —OH group, and an ammonium group, and a carbon-carbon unsaturated bond, are included therein. For example, a compound which is obtained by reacting a compound having an epoxy ring, which has a reactivity with —OH group, and a carbon-carbon unsaturated bond group, such as glycidyl acrylate, with a copolymer which is composed of a monomer having —OH group, such as 2-hydroxyethylacrylate, a monomer having —COOH group, such as methacrylic acid, and a monomer which is copolymerizable with the forgoing two types of monomers, such as an acrylic compound, a vinyl-series compound or the like, can be used. As the compound having a reactivity with —OH group, a compound having an acryloyl group, and an acid anhydride, and an isocyanate group, in place of the epoxy ring, can be used. Further, a reaction product which is obtained by reacting a saturated- or unsaturated-polybasic acid anhydride with a compound obtained by reacting a compound having an epoxy ring with an unsaturated carboxylic acid, such as acrylic acid, as disclosed in JP-A-6-102669 and JP-A-6-1938 can also be used. Examples of the compound which has both an alkali-soluble group, such as a —COOH group, and a carbon-carbon unsaturated group include DIANAL NR series (manufactured by Mitsubishi Rayon Co., Ltd.), PHOTOMER 6173 (—COOH group-containing polyurethane acrylic oligomer, manufactured by Diamond Shamrock Co., Ltd.), VISCOAT R-264 and KS RESIST 106 (manufactured by Osaka Organic Chemical Industry Ltd.), CYCLOMER P series and PRAXEL CF200 series (manufactured by Daicel Chemical Industries, Ltd.), EBECRYL 3800 (manufactured by Daicel-UCB Company Ltd.), and the like.

Further as the binder resin, organic macromolecule polymers having a water-soluble atomic group at a part of side chains of the polymer can be used. It is preferable that the binder resin is a linear organic macromolecule polymer miscible with a monomer and is soluble in an organic solvent and an alkaline solution (preferably one developable with a weak alkaline aqueous solution). Examples of such an alkali-soluble resin include polymers which have a carboxylic acid in a side chain, such as the methacrylic acid copolymer, the acrylic acid copolymer, the itaconic acid copolymer, the crotonic acid copolymer, the maleic acid copolymer, the partially esterified maleic acid copolymer, and the like as disclosed in, for example, JP-A-59-44615, JP-B-54-34327, JP-B-58-12577, JP-B-54-25957, JP-A-59-53836, and JP-A-59-71048. Similarly, acidic cellulose derivatives which have a carboxylic acid in a side chain are useful. In addition to these, a polymer having a hydroxyl group to which an acid anhydride is added, and the like are also useful as the aforementioned alkali-soluble resin. Specifically, benzyl(meth)acrylate/(meth)acrylic acid copolymers and multi-component copolymers of benzyl(meth)acrylate/(meth)acrylic acid/other monomer are particularly preferred among these polymers. As the above-described alkali-soluble resin, use can be made of a copolymer (hereinafter sometimes referred to as "copolymer A") composed of at least (i) at least one kind of acid component monomer selected from maleic acid anhydride (MAA), acrylic acid (AA), methacrylic acid (MA), and fumaric acid (FA), and (ii) alkylpolyoxyethylene (meth)acrylate, and (iii) benzyl (meth)acrylate.

As the combination of the components in the above-described copolymer A, a composition ratio by mass of (i) an acid component monomer, (ii) alkylpolyoxyethylene (meth)acrylate $(Acr(EO)_n: CH_3(OC_2H_4)_nOCOC(CH_3)=CHR)$, and (iii) benzyl(meth)acrylate (BzMA) is preferably 10-25/5-25/50-85, and more preferably 15-20/5-20/60-80. Besides, a weight average molecular weight (Mw) of the above-described copolymer in terms of polystyrene, according to GPC is preferably in the range of from 3,000 to 50,000, and more preferably from 5,000 to 30,000.

If the composition ratio by mass of (i) an acid component monomer is in the above-described range, alkali solubility and dissolution properties to solvents hardly decrease. Besides, if the composition ratio by mass of (ii) alkylpolyoxyethylene (meth)acrylate $(Acr(EO)_n: CH_3(OC_2H_4)_nOCOC(CH_3)=CHR)$ is in the above-described range, a solution of the composition is easily spread onto a substrate, and also dispersibility of the coloring agent hardly decrease. Therefore, effects of the present invention can be effectively attained. If the composition ratio by mass of (iii) benzyl (meth)acrylate (BzMA) is in the above-described range, dispersion stability of the coloring agent, solubility of the coloring agent in a composition, and alkaline development suitability of the coating film hardly decrease.

The repeating number n of polyoxyethylene (EO)n in (ii) alkylpolyoxyethylene (meth)acrylate $(Acr(EO)_n: CH_3(OC_2H_4)_nOCOC(CH_3)=CHR)$ is preferably in the range of from 2 to 15, more preferably from 2 to 10, and especially preferably from 4 to 10. If the repeating number n is in the above-described range, a development residue hardly generates after development with an alkaline developer. In addition, such range can prevent generation of coating unevenness that is caused by reduction in fluidity of the composition as a coating solution. Consequently, said range can prevent deterioration in both uniformity of the coating film thickness and saving of liquid.

These binder polymers having a polar group may be used singly or in the form of a composition containing the binder polymer together with an ordinary film-forming polymer. The addition amount of the binder polymer is generally from 10 to 200 mass parts, preferably from 25 to 100 mass parts, based on 100 mass parts of the organic pigment.

In the case where the alkali-soluble binder having an acid group is a polymer compound, the number of acid groups in the polymer compound is not particularly limited; but the number of repeating units each having an acid group(s) is preferably 5 to 100, and more preferably 10 to 100, when the number of repeating units in one molecule is set to 100. In addition, the polymerization ratio between (1) a repeating unit derived from a compound having a carboxyl group and (2) a repeating unit derived from a compound having a carboxylate group is preferably as follows: a ratio of the repeating unit (1) is 5 to 40 mol %, a ratio of the repeating unit (2) is 40 to 90 mol %, and a ratio of a repeating unit(s) except the repeating units (1) and (2) is 25 mol % or less. In addition, the molecular weight of the alkali-soluble binder polymer compound having an acid group is preferably 5,000 to 30,000, more preferably 7,000 to 15,000, and particularly preferably 5,000 to 80,000.

[Dispersing Agent]

In the method of producing fine particles of an anthraquinone structure-containing pigment of the present invention, a dispersing agent may be added to one or both of the organic pigment solution and the poor solvent to which the organic pigment solution is to be added to form organic nanoparticles. Alternatively, it is also preferred to add a dispersing agent solution in a route separate from the above-described two solutions at the time when the organic nanoparticles are prepared. The dispersing agent has a function (1) that the dispersing agent is rapidly adsorbed on the surface of the formed pigment, to form fine pigment particles, and (2) that these particles are prevented from aggregating again.

As the dispersing agent, use can be made of an anionic, cationic, amphoteric, nonionic or pigment-derivative-type, and low-molecular-weight or polymer dispersing agent. The molecular weight of the polymer dispersing agent for use may be any value, as long as the dispersing agent can be uniformly dissolved in a solution, but the polymer dispersing agent preferably has a molecular weight of 1,000 to 2,000,000, more preferably of 5,000 to 1,000,000, still more preferably of 10,000 to 500,000, and particularly preferably of 10,000 to 100,000. (Concerning the present specification, the term "molecular weight" means a weight-average molecular weight, unless otherwise stated. Specifically, the term means a weight-average molecular weight calculated in terms of polystyrene, measured by GPC. Polymer compounds are polydispersion-series compounds and do not always have a single molecular weight or a single particle mass. Thus, their measured molecular weights should be represented by a certain type of average molecular weight. The three main types of the average molecular weight are: (1) number average molecular weight Mn, (2) weight-average molecular weight Mw and (3) Z average molecular weight Mz; and the relationship Mn<Mw<Mz can be established.) Examples of the polymer dispersing agent include polyvinyl pyrrolidone, polyvinyl alcohol, polyvinyl methyl ether, polyethylene oxide, polyethylene glycol, polypropylene glycol, polyacrylamide, vinyl alcohol/vinyl acetate copolymer, partial-formal products of polyvinyl alcohol, partial-butyral products of polyvinyl alcohol, vinylpyrrolidone/vinyl acetate copolymer, polyethylene oxide/propylene oxide block copolymer, polyacrylic acid salts, polyvinyl sulfuric acid salts, poly(4-vinylpyridine) salts, polyamides, polyallylamine salts, condensed naphthalenesulfonic acid salts, cellulose derivatives, and starch derivatives. Besides, natural polymers can be used, examples of which include alginic acid salts, gelatin, albumin, casein, gum arabic, tragacanth gum, and ligninsulfonic acid salts. Above all, it is preferred to use polyvinyl pyrrolidone. These polymers may be used singly or in combination of two or more. These dispersing agents may be used singly or in combination of two or more thereof. The dispersing agents to be used when dispersing a pigment are described in detail in "Dispersion Stabilization of Pigment and Surface Treatment Technique/Evaluation" (published by Japan Association for International Chemical Information, on December 2001), pp. 29-46.

Examples of the anionic dispersing agent (anionic surfactant) include N-acyl-N-alkyltaurine salts, fatty acid salts, alkylsulfates, alkylbenzenesulfonates, alkylnaphthalenesulfonates, dialkylsulfosuccinates, alkylphosphates, naphthalenesulfonic acid/formalin condensates, and polyoxyethylenealkylsulfates. Among these, N-acyl-N-alkyltaurine salts are particularly preferable. As the N-acyl-N-alkyltaurine salts, those described in JP-A-3-273067 are preferable. These anionic dispersing agents may be used singly or in combination of two or more thereof.

Examples of the cationic dispersing agent (cationic surfactant) include quaternary ammonium salts, alkoxylated polyamines, aliphatic amine polyglycol ethers, aliphatic amines, diamines and polyamines derived from aliphatic amine and aliphatic alcohol; imidazolines derived from aliphatic acid, and salts of these cationic substances. These cationic dispersing agents may be used singly or in combination of two or more thereof.

The amphoteric dispersing agent is a dispersing agent having, in the molecule thereof, an anionic group moiety which the anionic dispersing agent has in the molecule and a cationic group moiety which the cationic dispersing agent has in the molecule.

Examples of the nonionic dispersing agents (nonionic surfactant) include polyoxyethylenealkyl ethers, polyoxyethylenealkylaryl ethers, polyoxyethylene fatty acid esters, sorbitan fatty acid esters, polyoxyethylenesorbitan fatty acid esters, polyoxyethylenealkylamines, and glycerin fatty acid esters. Among these, polyoxyethylenealkylaryl ethers are preferable. These nonionic dispersing agents may be used singly or in combination of two or more thereof.

The "pigment-dispersing agent" is defined as a pigment-dispersing agent derived from an organic pigment as a parent material, and prepared by chemically modifying a structure of the parent material. Examples of the pigment-dispersing agent include sugar-containing pigment-dispersing agents, piperidyl-containing pigment-dispersing agents, naphthalene- or perylene-derivative pigment-dispersing agents, pigment-dispersing agents having a functional group linked through a methylene group to a pigment parent structure, pigment-dispersing agents (parent structure) chemically modified with a polymer, pigment-dispersing agents having a sulfonic acid group, pigment-dispersing agents having a sulfonamido group, pigment-dispersing agents having an ether group, and pigment-dispersing agents having a carboxylic acid group, carboxylate group, or carboxamido group.

In the method of producing fine particles of an anthraquinone structure-containing pigment of the present invention, a pigment dispersing agent containing a graft copolymer having a nitrogen atom and an ether group and also, if necessary, containing properly selected other component(s) is preferably added to the good solvent to be used. A pigment dispersing agent containing at least one kind of compound selected from the group consisting of the compounds represented by Formulae (I) and (III) below is also preferably used.

<1. Pigment Dispersing Agent Containing Graft Copolymer>

The above-described graft copolymer at least has a nitrogen atom and an ether group, and also may contain other monomers as a copolymer unit. Herein, the nitrogen atom may be present in either the main chain or side chains of the graft copolymer.

The weight-average molecular weight (Mw) of the graft copolymer is preferably in a range of from 3,000 to 100,000, and more preferably in a range of from 5,000 to 50,000. If the weight-average molecular weight (Mw) is too small, it is difficult to prevent the pigment from aggregating, which sometimes results in elevation of viscosity. If the weight-average molecular weight (Mw) is too large, solubility to an organic solvent becomes insufficient, which sometimes results in elevation of viscosity. The term "weight-average molecular weight" as used herein refers to the weight-average molecular weight measured by gel permeation chromatography (carrier: tetrahydrofuran) and calculated in terms of polystyrene.

It is preferred that the above-described graft copolymer contain as copolymer units, at least (i) a polymerizable oligomer having an ethylenically unsaturated double bond at a terminal, (ii) a nitrogen atom-containing monomer having a nitrogen atom and an ethylenically unsaturated double bond, and (iii) a polymerizable monomer having an ether group, and also, if necessary, contain (iv) other monomer(s).

As shown in FIG. 1, the graft copolymer comprises the main chain having at least an ether group-containing side chain 5 and nitrogen atoms 3 and also comprises another side chain 2 that is derived from a polymerizable oligomer and bonded to the main chain by graft copolymerization. The binding site 1 between the main chain and each side chain is formed by the polymerization reaction of the ethylenically unsaturated double bond at the terminal of the polymerizable oligomer. If necessary, the main chain and/or the side chain may contain any other copolymerized monomer unit.

The graft copolymer can be formed by polymerization reaction between the ethylenically-unsaturated double bond at the terminal of the polymerizable oligomer, the ethylenically-unsaturated double bond of the nitrogen-containing monomer, and the polymerizable monomer having an ether group.

The content of each of the copolymer units in the graft copolymer is as follows: the content of (i) the polymerizable oligomer is preferably in the range of from 15 to 98 mass %, more preferably from 25 to 90 mass %, the content of (ii) the nitrogen atom-containing monomer is preferably in the range of from 1 to 40 mass %, more preferably from 5 to 30 mass %, and the content of (iii) the polymerizable monomer having an ether group is preferably in the range of from 1 to 70 mass %, more preferably from 5 to 60 mass %.

If the content of the polymerizable oligomer is too small, a stereo-repulsion effect that should be attained by a pigment dispersing agent is hardly obtained, and it sometimes becomes difficult to prevent the pigment from aggregating. If the content of the polymerizable oligomer is too large, the ratio of the nitrogen-atom-containing monomer relatively decreases so that adsorption capacity to the pigment is lowered, and dispersibility sometimes becomes insufficient. If the content of the nitrogen-atom-containing monomer is too small, dispersibility sometimes becomes insufficient owing to reduction of the adsorption capacity to the pigment. If the content of the nitrogen-atom-containing monomer is too large, the ratio of the polymerizable oligomer relatively decreases so that a stereo-repulsion effect that should be attained by a pigment dispersing agent is hardly obtained, and it sometimes becomes difficult to sufficiently prevent the pigment from aggregating. If the content of the polymerizable monomer having an ether group is too small, development suitability at the time of production of color filters and the like sometimes become insufficient. If the content of the polymerizable monomer having an ether group is too large, a capacity as a pigment dispersing agent sometimes reduces.

(i) Polymerizable Oligomer

The polymerizable oligomer (hereinafter, sometimes also referred to as "macro monomer") has a group having an ethylenically unsaturated double bond at one or both ends (terminals) thereof. Among the aforementioned polymerizable oligomers, it is preferred in the present invention that the oligomer has a group having an ethylenically unsaturated double bond at only one of the ends of the oligomer.

As the aforementioned oligomer, homopolymers or copolymers formed from at least one monomer selected from such monomers as alkyl (meth)acrylates, hydroxyalkyl (meth)acrylates, styrene, acrylonitrile, vinyl acetate, and butadiene can be mentioned. Among these oligomers, preferred are homopolymers or copolymers of alkyl (meth)acrylates and polystyrene. In the present invention, these oligomers may be further substituted. There is no particular limitation to the substituent; a halogen atom can be mentioned as an example of the substituent.

Preferred examples of the group having an ethylenically unsaturated double bond include a (meth)acryloyl group and a vinyl group. Among these groups, (meth)acryloyl group is especially preferred.

In the present invention, among these polymerizable oligomers, preferred are oligomers represented by formula (6) set forth below.

Formula (6)

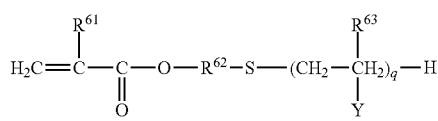

In the above-described formula (6), $R^{61}$ and $R^{63}$ each independently represent a hydrogen atom or a methyl group. $R^{62}$ represents an alkylene group which has 1 to 8 carbon atoms and which may be substituted by an alcoholic hydroxyl group, and $R^{62}$ preferably represents an alkylene group having 2 to 4 carbon atoms. Y represents a phenyl group, a phenyl group having an alkyl group having 1 to 4 carbon atoms, or —$COOR^{64}$ ($R^{64}$ represents an alkyl group which has 1 to 6 carbon atoms and which may be substituted by an alcoholic hydroxyl group or halogen atom; a phenyl group, or an aralkyl group having 7 to 10 carbon atoms); and Y preferably represents a phenyl group or —$COOR^{164}$ ($R^{164}$ represents an alkyl group which has 1 to 4 carbon atoms and which may be substituted with an alcoholic hydroxyl group). q represents a number of from 20 to 200.

Specific examples of the polymerizable oligomer include poly-2-hydroxyethyl (meth)acrylate, polystyrene, poly-methyl (meth)acrylate, poly-n-butyl (meth)acrylate, poly-1-butyl (meth)acrylate, and copolymers of these. Among these polymers, preferred are polymers having a (meth)acryloyl group bonded to one terminal of the molecule.

The polymerizable oligomer may be a commercially available product, or may be appropriately synthesized. Examples of the commercially available product include: a single-terminal-methacryloylated polystyrene oligomer (Mn=6,000, trade name: AS-6, manufactured by TOAGOSEI CO., LTD.); a single-terminal-methacryloylated polymethyl methacrylate oligomer (Mn=6,000, trade name: AA-6, manufactured by TOAGOSEI CO., LTD.); a single-terminal-methacryloylated poly-n-butyl acrylate oligomer (Mn=6,000, trade name: AB-6, manufactured by TOAGOSEI CO., LTD.); a single-terminal-methacryloylated polymethyl methacrylate/2-hydroxyethyl methacrylate oligomer (Mn=7,000, trade name: AA-714, manufactured by TOAGOSEI CO., LTD.); a single-terminal-methacryloylated polybutyl methacrylate/2-hydroxyethyl methacrylate oligomer (Mn=7,000, trade name: 707 S, manufactured by TOAGOSEI CO., LTD.); and a single-terminal-methacryloylated poly-2-ethylhexyl methacrylate/2-hydroxyethyl methacrylate oligomer (Mn=7,000, trade name: AY-707 S or AY-714 S, manufactured by TOAGOSEI CO., LTD.).

A preferable specific example of the polymerizable oligomer in the present invention is at least one kind of an oligomer selected from a polymer of an alkyl (meth)acrylate and a copolymer of an alkyl (meth)acrylate and polystyrene, with the oligomer having a number average molecular weight of 1,000 to 20,000, and with the oligomer having a (meth)acryloyl group at a terminal.

(ii) Nitrogen-Atom-Containing Monomer

As the nitrogen-atom-containing monomer, a preferable example is any one of the compounds represented by formula (2) set forth below.

Formula (2)

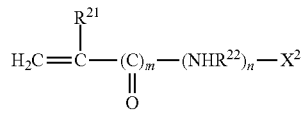

In the above-described formula (2), $R^{21}$ represents a hydrogen atom or a methyl group. $R^{22}$ represents an alkylene group having 1 to 8 carbon atoms, preferably 1 to 6 carbon atoms, and especially preferably 2 to 3 carbon atoms.

$X^2$ represents —$N(R^{23})(R^{24})$, —$R^{25}N(R^{26})(R^{27})$, a pyrrolidino group, a pyrrolidyl group, a pyridyl group, a piperidino group, an imidazolyl group, a carbazoyl group, a triazolyl group, a tetrazolyl group or a morpholino group, wherein $R^{23}$ and $R^{24}$ each independently represent a hydrogen atom, an alkyl group having 1 to 6 carbon atoms, or a phenyl group. $R^{25}$ represents an alkylene group having 1 to 6 carbon atoms, and $R^{26}$ and $R^{27}$ each independently represent a hydrogen atom, an alkyl group having 1 to 6 carbon atoms, or a phenyl group.

Among these, —$N(R^{23})(R^{24})$ and —$R^{25}N(R^{21})(R^{27})$ are preferable. $R^{23}$ and $R^{24}$ of the —$N(R^{23})(R^{24})$ are preferably a hydrogen atom, an alkyl group having 1 to 4 carbon atoms, or a phenyl group, and $R^{25}$ of the —$R^{25}N(R^{26})(R^{27})$ is preferably an alkylene group having 2 to 6 carbon atoms, and $R^{26}$ and $R^{27}$ are preferably an alkyl group having 1 to 4 carbon atoms. Among the pyridyl group, a 4-pyridyl group, a 2-pyridyl group and the like are preferable. Among the piperidino group, a 1-piperidino group and the like are preferable. Among the pyrrolidyl group, a 2-pyrrolidyl group and the like are preferable. Among the morpholino group, a 4-morpholino group and the like are preferable. m and n each represent 1 or 0. The cases where m=1 and n=1 and where m=1 and n=0 are preferred. (The resultant monomers correspond to the monomers represented by formulae (3) and (4) set forth below.)

In the present invention, among the compounds represented by formula (2), preferred are at least one compound selected from the compounds represented by any one of formulas (3) to (5) set forth below.

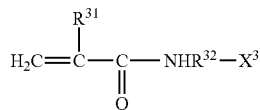

Formula (3)

In the above-described formula (3), $R^{31}$ has the same meaning as $R^{21}$. $R^{32}$ has the same meaning as $R^{22}$. $X^3$ has the same meaning as $X^2$.

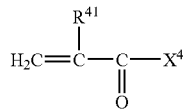

Formula (4)

In the above-described formula (4), $R^{41}$ has the same meaning as $R^{21}$. $X^4$ has the same meaning as $X^2$, and $X^4$ is preferably —$N(R^{43})(R^{44})$ (wherein $R^{43}$ and $R^{44}$ have the same meanings as $R^{23}$ and $R^{24}$), or —$R^{45}N(R^{46})(R^{47})$ (wherein $R^{45}$, $R^{46}$, and $R^{47}$ have the same meaning as $R^{25}$, $R^{26}$, and $R^{27}$).

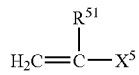

Formula (5)

In the above-described formula (5), $R^{51}$ has the same meaning as $R^{21}$. $X^5$ represents a pyrrolidino group, a pyrrolidyl group, a pyridyl group, a piperidino group, an imidazolyl group, a carbazoyl group, a triazolyl group, a tetrazolyl group or a morpholino group.

Preferable examples of the compound represented by the above-described formula (2) include (meth)acrylamides such as dimethyl (meth)acrylamide, diethyl(meth)acrylamide, diisopropyl(meth)acrylamide, di-n-butyl(meth)acrylamide, di-i-butyl(meth)acrylamide, morpholino(meth)acrylamide, piperidino(meth)acrylamide, N-methyl-2-pyrrolidyl(meth)acrylamide, and N,N-methylphenyl(meth)acrylamide; aminoalkyl(meth)acrylamides such as 2-(N,N-dimethylamino) ethyl (meth)acrylamide, 2-(N,N-diethylamino)ethyl (meth) acrylamide, 3-(N,N-diethylamino) propyl(meth)acrylamide, 3-(N,N-dimethylamino)propyl (meth)acrylamide, 1-(N,N-dimethylamino)-1,1-dimethylmethyl (meth)acrylamide, and 6-(N,N-diethylamino)hexyl (meth)acrylamide; and vinylpyridine, N-vinylimidazole, N-vinylcarbazole, N-vinyltriazole and vinyl tetrazole.

(iii) Polymerizable Monomer Having Ether Group

As the polymerizable monomer having an ether group, preferred are at least one compound selected from the compounds represented by formula (1) set forth below.

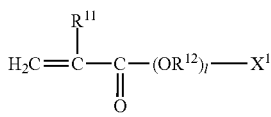

Formula (1)

In the above formula (1), $R^{11}$ represents a hydrogen atom or a methyl group. $R^{12}$ represents an alkylene group having 1 to 8 carbon atoms, preferably an alkylene group having 1 to 6 carbon atoms, and more preferably an alkylene group having 2 to 3 carbon atoms. $X^1$ represents —$OR^{13}$ or —$OCOR^{14}$. Herein, $R^{13}$ represents a hydrogen atom, an alkyl group having 1 to 18 carbon atoms, a phenyl group, or a phenyl group substituted with an alkyl group having 1 to 18 carbon atoms. $R^{14}$ represents an alkyl group having 1 to 18 carbon atoms. Also, l denotes a number of 2 to 200, preferably 5 to 100, and particularly preferably 10 to 100.

No particular restriction is imposed on the polymerizable monomer having an ether group as long as the monomer is polymerizable and has an ether group, and the monomer can be appropriately selected from ordinary monomers. Examples thereof include polyethylene glycol mono(meth) acrylate, polypropylene glycol mono(meth)acrylate, polyethylene glycol polypropylene glycol mono(meth)acrylate, and polytetramethylene glycol monomethacrylate. These materials may be commercially available products or may be those synthesized properly. Examples of these commercially available products include methoxypolyethylene glycol methacrylate (trade name: NK ESTER M-40G, M-90G, and M-230G (manufactured by Toagosei Co., Ltd.); trade name: BLENMER-PME-100, PME-200, PME-400, PME-1000, PME-2000, and PME-4000 (manufactured by Nippon Oil & Fats Co., Ltd.)), polyethylene glycol monomethacrylate (trade name: BLENMER-PE-90, PE-200, and PE-350 manufactured by Nippon Oil & Fats Co., Ltd.); polypropylene glycol monomethacrylate (trade name: BLENMER-PP-500, PP-800, and PP-1000 manufactured by Nippon Oil & Fats Co., Ltd.), polyethylene glycol polypropylene glycol monomethacrylate (trade name: BLENMER-70PEP-370B manufactured by Nippon Oil & Fats Co., Ltd.), polyethylene glycol polytetramethylene glycol monomethacrylate (trade name: BLENMER-55PET-800 manufactured by Nippon Oil & Fats Co., Ltd.), and polypropylene glycol polytetramethylene glycol monomethacrylate (trade name: BLENMER-NHK-5050 manufactured by Nippon Oil & Fats Co., Ltd.).

(iv) Other Monomers

The above-described graft copolymers may contain, additionally, the above-described other monomer(s) as a copolymer unit. The other monomers are not particularly limited, and they can be properly selected in accordance with purposes. Examples of the other monomers include aromatic vinyl compounds (e.g., styrene, α-methyl styrene, vinyl toluene), alkyl (meth)acrylates (e.g., methyl (meth)acrylate, ethyl (meth)acrylate, n-butyl (meth)acrylate, i-butyl (meth)acrylate), alkylaryl (meth)acrylates (e.g., benzyl (meth)acrylate), glycidyl (meth)acrylate, vinyl carboxylates (e.g., vinyl acetate, vinyl propionate), vinyl cyanides (e.g., (meth)acrylonitrile, α-chloro acrylonitrile), aliphatic conjugate dienes (e.g., 1,3-butadiene, isoprene), and (meth)acrylic acid. Among these monomers, preferred are unsaturated carboxylic acids, alkyl (meth)acrylates, alkylaryl (meth)acrylates, and vinyl carboxylates.

The content of the other monomers in the above-described graft copolymers is, for example, preferably in the range of from 5 to 70 mass %. If the content is too small, it sometimes becomes difficult to control physical properties of the coating film. If the content is too large, it sometimes becomes difficult for the graft copolymer to fully exhibit its capacity as a pigment dispersing agent.

Preferable specific examples of the graft copolymers include: (1) A copolymer of N-vinylimidazole/polyethylene glycol mono(meth)acrylate/terminal-methacryloylated polymethyl (meth)acrylate, (2) A copolymer of N-vinylcarbazole/polyethylene glycol mono(meth)acrylate/terminal-methacryloylated polymethyl (meth)acrylate, (3) A copolymer of N-vinyltriazole/polyethylene glycol mono(meth)acrylate/terminal-methacryloylated polymethyl (meth)acrylate, (4) A copolymer of N-vinylimidazole/polyethylene glycol mono (meth)acrylate/terminal-methacryloylated polymethyl (meth)acrylate, (18) A copolymer of 3-(N,N-dimethylamino)propylacrylamide/polyethyleneglycol polypropyleneglycol mono (meth) acrylate/terminal-methacryloylated polymethyl (meth) acrylate, (19) A copolymer of 3-(N,N-dimethylamino) propylacrylamide/polyethyleneglycol polytetramethyleneglycol mono (meth)acrylate/terminal-methacryloylated polymethyl (meth)acrylate, and (20) A copolymer of 3-(N,N-dimethylamino)propylacrylamide/polypropyleneglycol polytetramethyleneglycol mono (meth)acrylate/terminal-methacryloylated polymethyl (meth)acrylate.

Among these copolymers, preferred are (11) to (20), more preferred are (11), (13) to (16) and (18). Particularly preferred is a compound represented by formula (IV) set forth below.

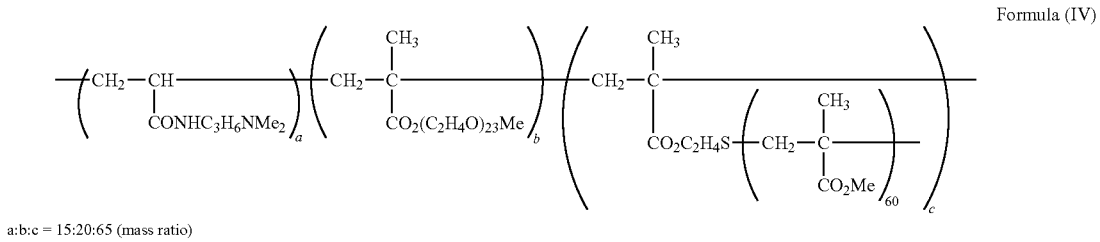

Formula (IV)

a:b:c = 15:20:65 (mass ratio)

(meth)acrylate/terminal-methacryloylated polystyrene, (5) A copolymer of N-vinylcarbazole/polyethylene glycol mono (meth)acrylate/terminal-methacryloylated polystyrene, (6) A copolymer of N-vinylimidazole/polyethylene glycol mono (meth)acrylate/methyl (meth)acrylate/terminal-methacryloylated polystyrene, (7) A copolymer of N-vinylimidazole/polyethylene glycol mono(meth)acrylate/benzyl (meth) acrylate/terminal-methacryloylated polystyrene, (8) A copolymer of vinylpyridine/polyethylene glycol mono (meth)acrylate/terminal-methacryloylated polymethyl (meth)acrylate, (9) A copolymer of N,N-dimethyl-2-piperidylethyl acrylate/polyethylene glycol mono(meth)acrylate/terminal-methacryloylated polymethyl (meth)acrylate, (10) A copolymer of 4-morpholinoethyl acrylate/polyethylene glycol mono(meth)acrylate/terminal-methacryloylated polymethyl (meth)acrylate, (11) A copolymer of 3-(N,N-dimethylamino)propylacrylamide/polyethyleneglycol mono(meth)acrylate/terminal-methacryloylated polymethyl (meth)acrylate, (12) A copolymer of 3-(N,N-dimethylamino)propylacrylamide/polyethyleneglycol mono(meth)acrylate/terminal-methacryloylated polystyrene,

(13) A copolymer of 3-(N,N-dimethylamino)propylacrylamide/polyethyleneglycol mono(meth)acrylate/methyl (meth)acrylate/terminal-methacryloylated polystyrene, (14) A copolymer of 3-(N,N-dimethylamino)propylacrylamide/polyethyleneglycol mono(meth)acrylate/a copolymer of terminal-methacryloylated methyl (meth)acrylate and 2-hydroxyethylmethacrylate, (15) A copolymer of 3-(N,N-dimethylamino)propylacrylamide/polyethylene glycol mono(meth)acrylate/a copolymer of terminal-methacryloylated methyl methacrylate and 2-hydroxyethyl methacrylate, (16) A copolymer of 3-(N,N-dimethylamino)propylacrylamide/polyethylene glycol mono (meth)acrylate/a copolymer of terminal-methacryloylated methyl methacrylate and 2-hydroxyethyl methacrylate,

(17) A copolymer of 3-(N,N-dimethylamino)propylacrylamide/polypropyleneglycol mono(meth)acrylate/terminal- The above-described graft copolymers can be obtained by subjecting components that constitute units of the above-described copolymers to, for example, radical polymerization in a solvent. At the time of the radical polymerization, a radical polymerization initiator may be used. Further, there can be used a chain transfer agent (e.g., 2-mercapto ethanol and dodecyl mercaptan). A pigment dispersing agent can be also prepared with reference to descriptions of JP-B-5-72943.

<2. Compound Represented by Formula (1)>

A-N=N-X-Y　　　　　　　　　　　　　　Formula (I)

In formula (I), A represents a component capable of forming an azo dye together with X—Y. The component A can be arbitrary selected as long as the component is capable of forming an azo dye upon coupling with a diazonium compound. Specific examples of the component A are shown below, but the present invention is not limited to these compounds.

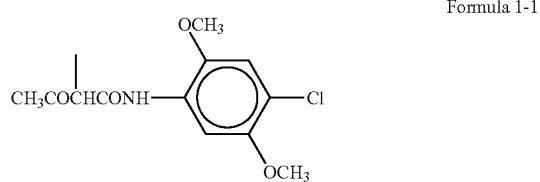

Formula 1-1

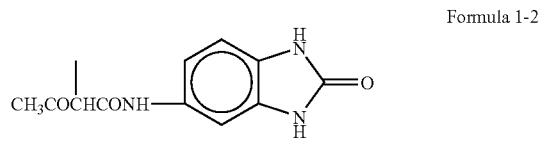

Formula 1-2

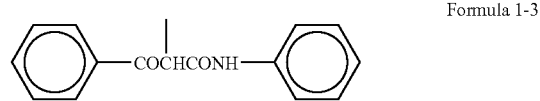

Formula 1-3

-continued

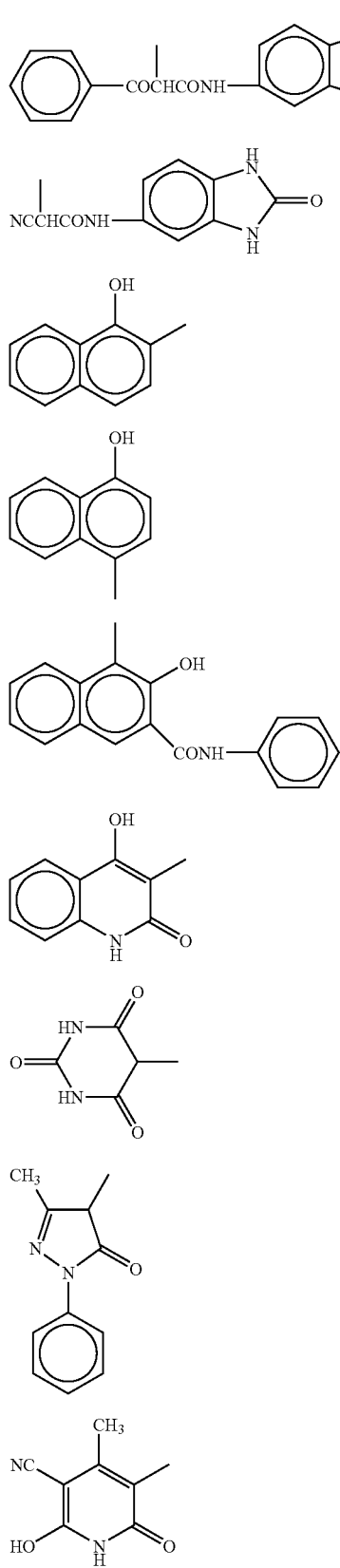

Formula 1-4

Formula 1-5

Formula 1-6

Formula 1-7

Formula 1-8

Formula 1-9

Formula 1-10

Formula 1-11

Formula 1-12

In formula (I), X represents a single bond, or a group selected from divalent connecting groups represented by structural formulae of formulae (i) to (v) set forth below.

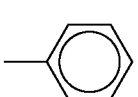

Formula (i)

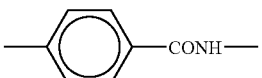

Formula (ii)

Formula (iii)

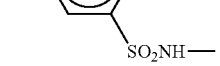

Formula (iv)

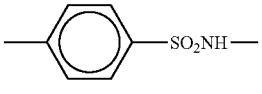

Formula (v)

In formula (I), Y represents a group represented by the following formula (II).

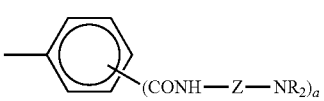

Formula (II)

In formula (II), Z represents a lower alkylene group. In other words, Z can be expressed as $-(CH_2)_b-$ wherein b represents an integer of from 1 to 5, and preferably 2 or 3. In formula (II), $-NR_2$ represents a lower alkylamino group, or a nitrogen-containing, 5- or 6-membered, saturated heterocyclic group. In the case where said $-NR_2$ represents a lower alkylamino group, the lower alkylamino group can be expressed as $-N(C_nH_{2n+1})_2$ wherein n represents an integer of from 1 to 4, and preferably 1 or 2. In the case where said $-NR_2$ represents a nitrogen-containing, 5- or 6-membered, saturated heterocyclic group, the heterocyclic group is preferably any one of the heterocyclic groups shown by the following structural formulae.

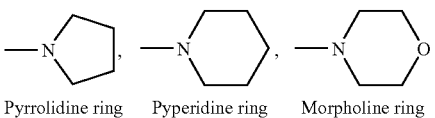

Pyrrolidine ring    Pyperidine ring    Morpholine ring

Each of Z and $-NR_2$ in the above-described formula (II) may optionally have a lower alkyl group or an alkoxy group, as a substituent. In the above-described formula (II), a represents 1 or 2, and preferably 2.

Specific examples of the compound represented by formula (I) are shown below, but the present invention is not limited to these examples.

1
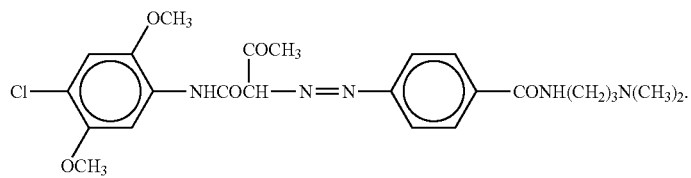
2
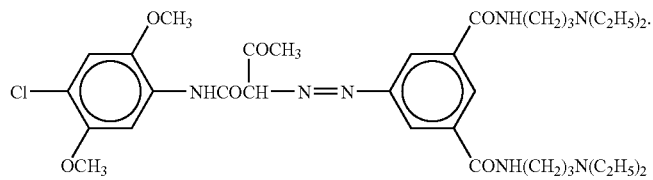
3
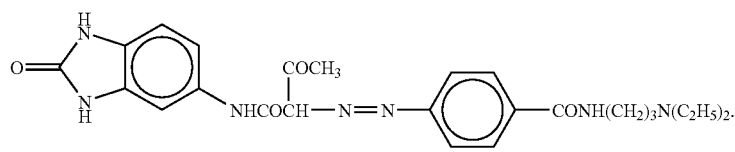
4
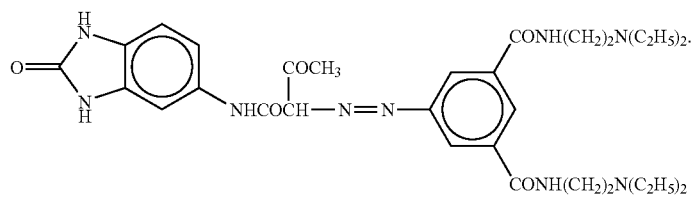
5
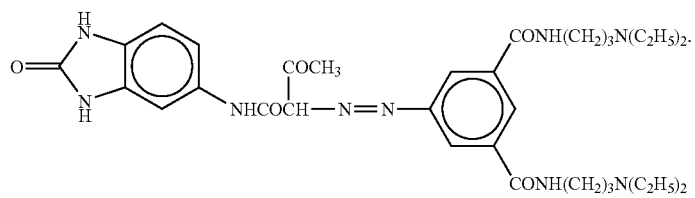
6
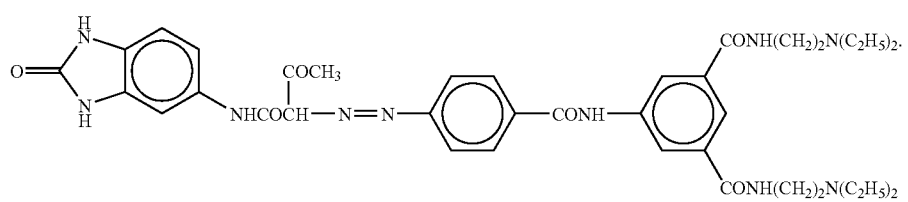
7
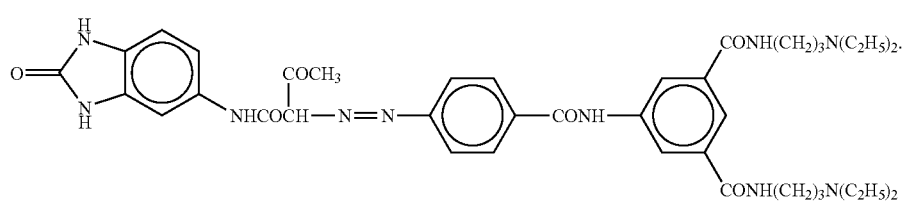
8
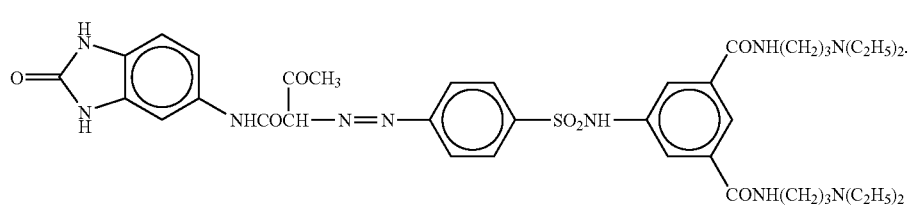

-continued
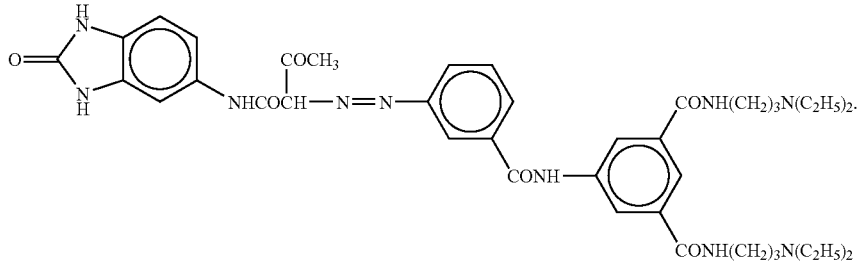
9
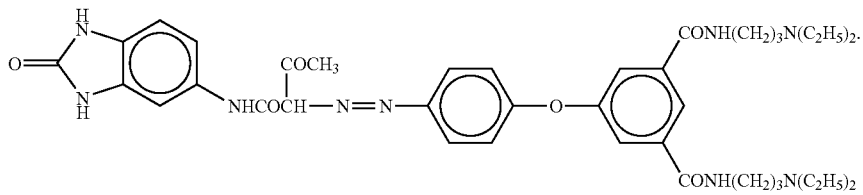
10
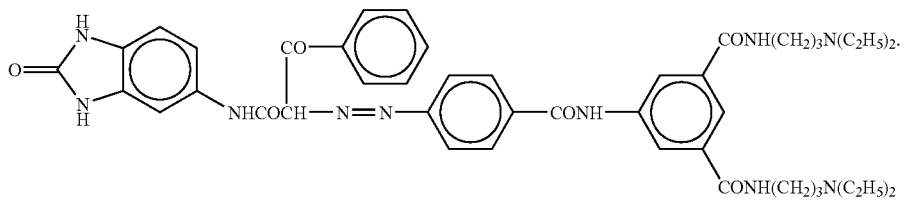
11
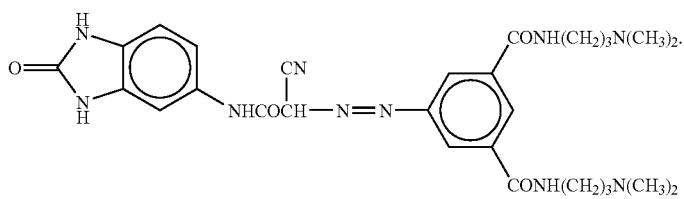
12
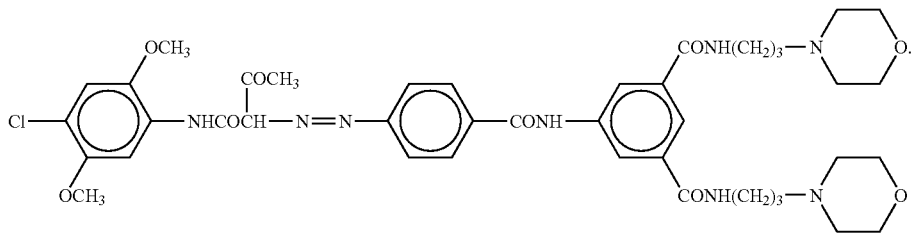
13
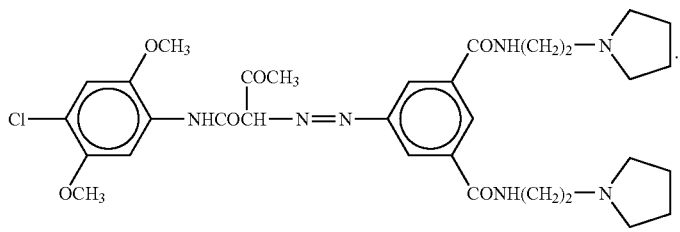
14
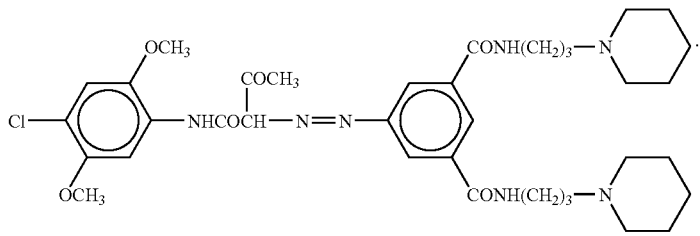
15

-continued
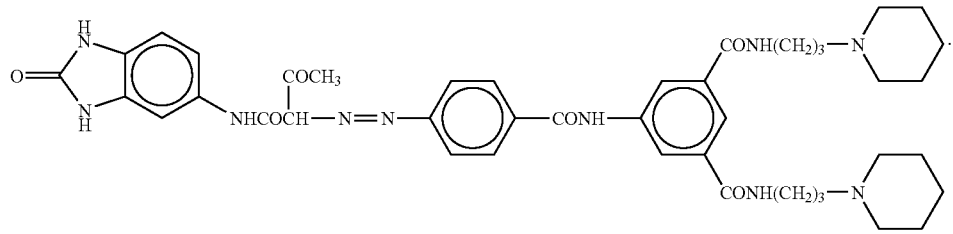
16
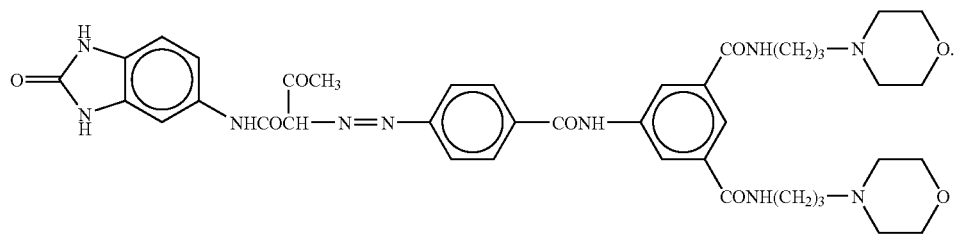
17
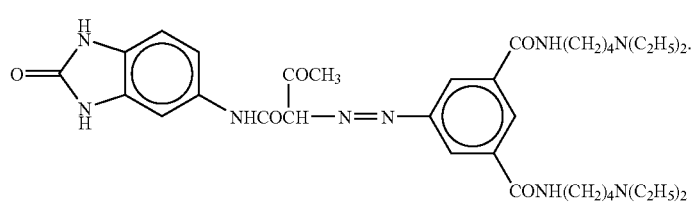
18
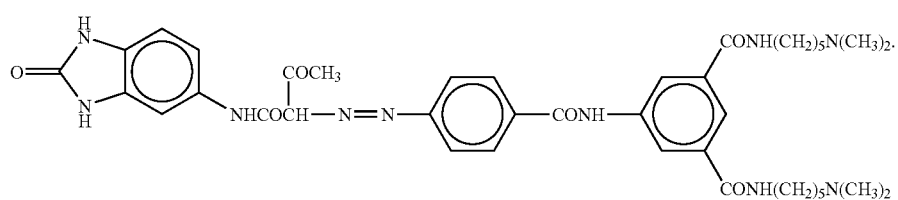
19
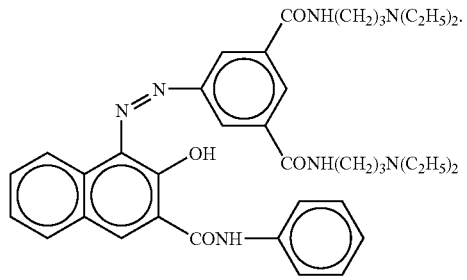
20
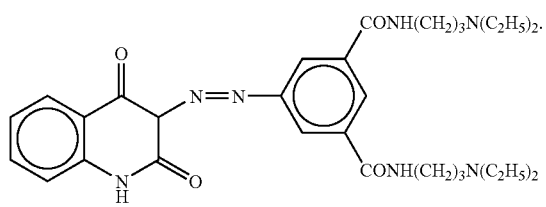
21
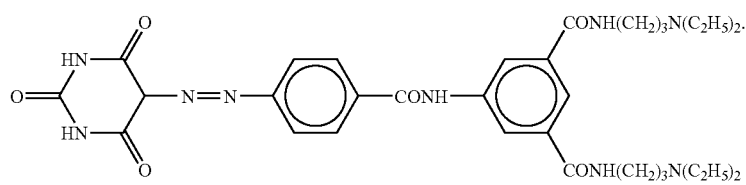
22

The compound represented by formula (I) can be synthesized referring to the method described in, for example, JP-A-2000-239554.

<2 Compound Represented by Formula (III)>

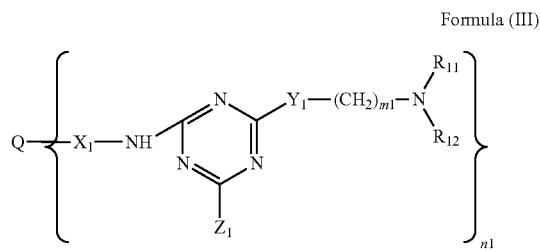

Formula (III)

In formula (III), Q represents a residue of an organic dye selected from anthraquinone-series dyes, azo-series dyes, phthalocyanine-series dyes, quinacridone-series dyes, dioxazine-series dyes, anthrapyrimidine-series dyes, anthanthrone-series dyes, indanthione-series dyes, flavanthrone-series dyes, pyranthrone-series dyes, perynone-series dyes, perylene-series dyes, and thioindigo-series dyes. Among these organic dyes, preferred are anthraquinone-series dyes and azo-series dyes. The anthraquinone-series dyes are more preferred.

$X_1$ represents —CONH—$Y_2$—, —SO$_2$NH—$Y_2$—, or —CH$_2$NHCOCH$_2$NH—$Y_2$—. $X_1$ is preferably —CONH—$Y_2$—.

$Y_2$ represents an alkylene group or an arylene group, each of which may be substituted. Among these groups, preferred are an ethylene group, a propylene group, and a butylene group. The propylene group is more preferred.

$R_{11}$ and $R_{12}$ each independently represent a substituted or unsubstituted alkyl group, alternatively, $R_{11}$ and $R_{12}$ represent groups that bond together to form a heterocyclic group which at least contains a nitrogen atom.

$Y_1$ represents —NH— or —O—. $Z_1$ represents a hydroxyl group or a group represented by formula (IIIa) with the proviso that in the case where n1 is 1, $Z_1$ may be —NH—$X_1$—Q. m1 represents an integer of 1 to 6, and preferably 1 to 3. n1 represents an integer of 1 to 4, and preferably 1 to 3.

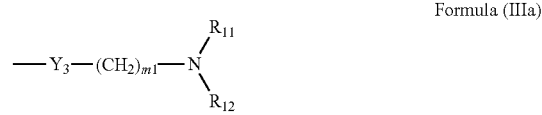

Formula (IIIa)

In formula (IIIa), $Y_3$ represents —NH— or —O—, and m1, $R_{11}$, and $R_{12}$ have the same meanings as those in formula (III).

The compounds represented by formula (III) are specifically represented, for example, by the following formulae.

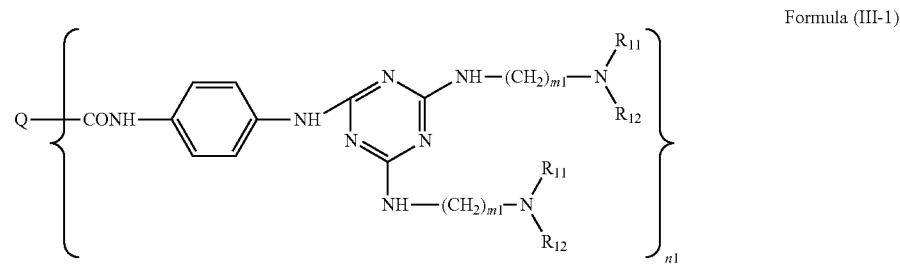

Formula (III-1)

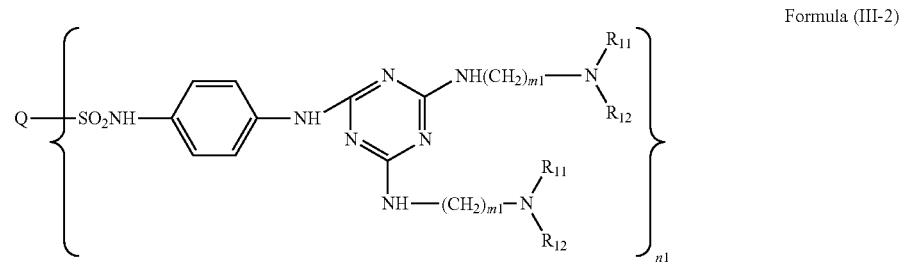

Formula (III-2)

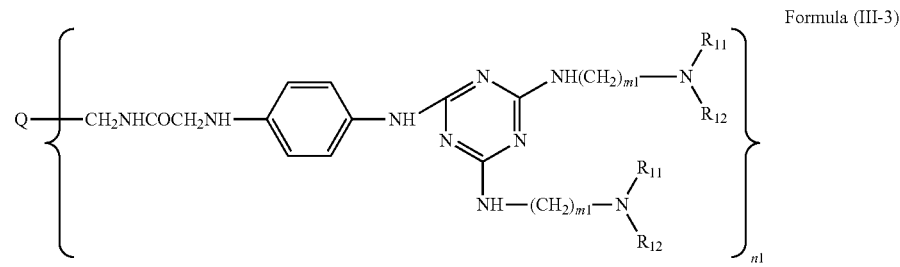

Formula (III-3)

Formula (III-4)
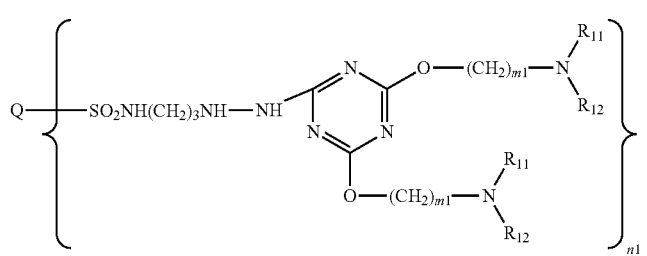
Formula (III-5)
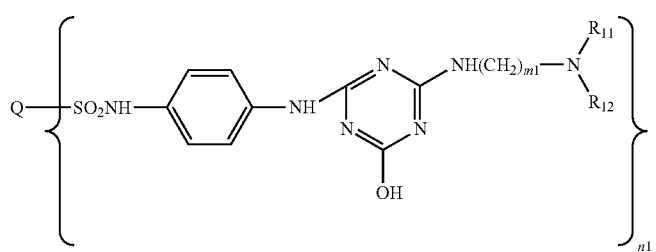
Formula (III-6)
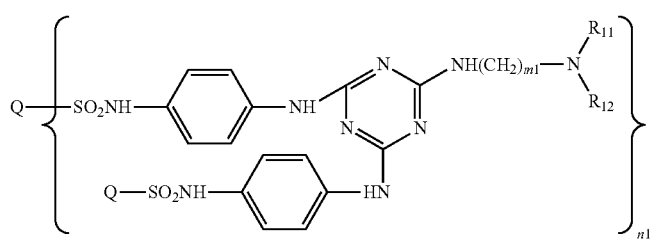
In formulas (III-1) to (III-6), Q, m1, n1, $R_{11}$, and $R_{12}$ have the same meanings as those in formula (III). Specific examples of the compound represented by formula (III) are shown below, but the present invention is not meant to be limited to these. In the following, Cu—Pc represents copper phthalocyanine.
(a)
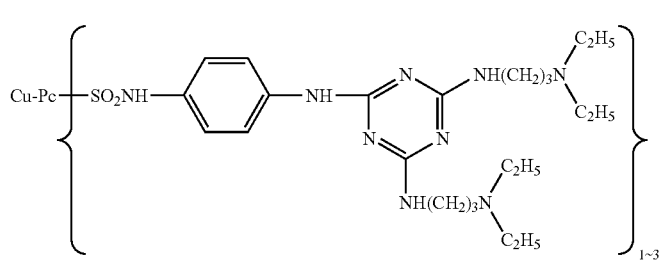
(b)
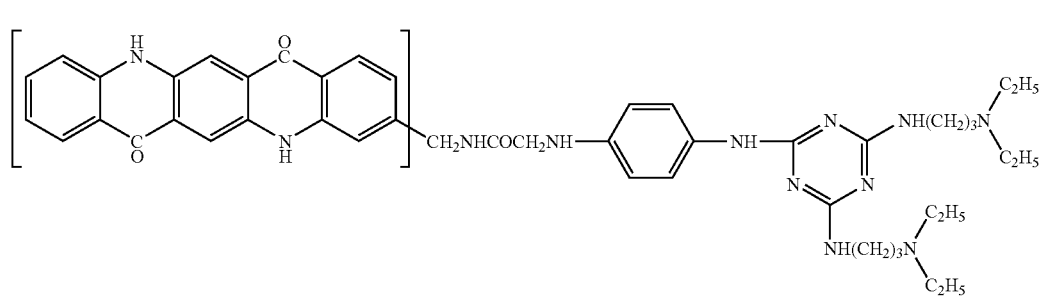

-continued
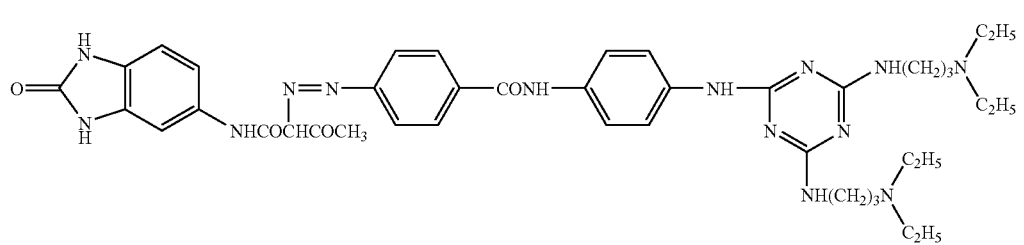
(c)
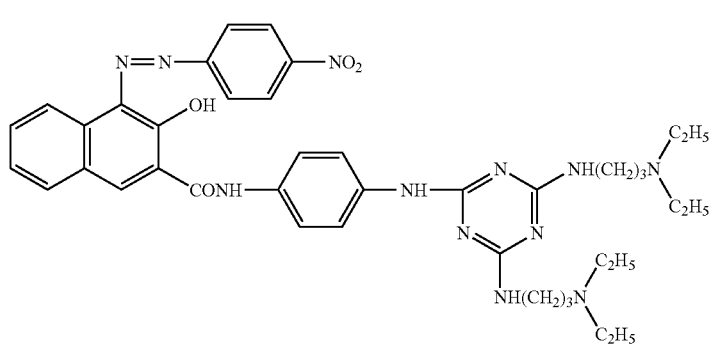
(d)
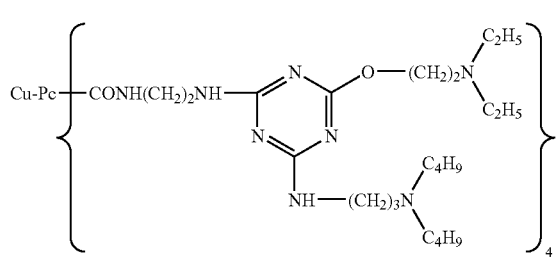
(e)
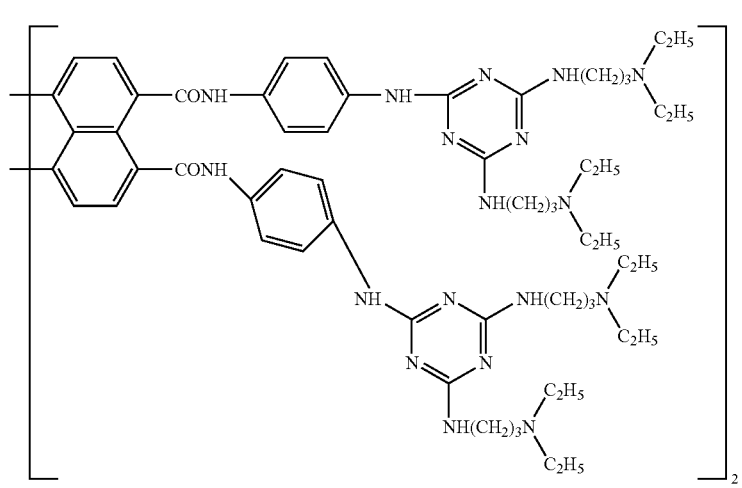
(f)

-continued

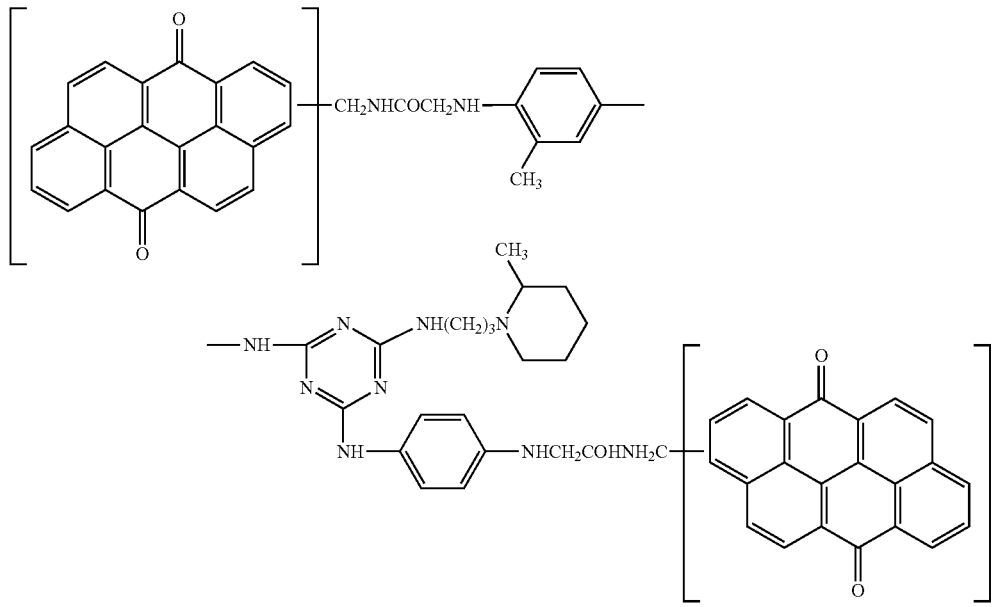

(g)

The compounds represented by formula (III) can be obtained, for example, by reaction of a dye compound with an intermediate which is obtained by a reaction of a halogenated triazine compound with an amine compound having $R_{11}$ and $R_{12}$ and an alcohol compound having $R_{11}$ and $R_{12}$. The disclosure of the specification of JP-B-5-72943 can be also referred for the synthesis of the compound.

In order to further improve uniform dispersibility and preservability of the pigment, the content of the dispersing agent is preferably in the range of from 0.1 to 1,000 mass parts, more preferably from 1 to 500 mass parts, and furthermore preferably from 5 to 20 mass parts, based on 100 mass parts of the pigment. A too-small content sometimes results in no improvement in dispersion stability of the organic pigment fine particles.

[Condition at the Time of Forming Organic Nanoparticles]

The condition under which the organic pigment is prepared as organic nanoparticles is not particularly restricted, and can be selected from a range from a normal pressure condition to a subcritical or supercritical condition. The temperature under normal atmospheric pressure is preferably from −30° C. to 100° C., more preferably from −10° C. to 60° C., and particularly preferably from 0° C. to 30° C.

The method of mixing an organic pigment solution and a poor solvent is not particularly limited. At the time of mixing the organic pigment solution and the poor solvent, it is preferable that either of them is added to the other in a state of being stirred. It is particularly preferred that mixing is conducted by adding the organic pigment solution to the poor solvent in a state of being stirred. A pump or the like may be or may not be used for adding. As the adding method, a method of adding a liquid inside the other liquid or a method of adding a liquid outside the other liquid may be used; a method of adding a liquid inside the other liquid is preferable. In the method of adding a liquid inside the other liquid, the addition may be carried out via one inlet, or two or more inlets may be used for the addition. The diameter of the inlet for the addition is preferably 20 mm or less, and more preferably 10 mm or less.

The stirring rate for stirring one of the above-described two liquids is preferably 100 to 10,000 rpm, more preferably 150 to 8,000 rpm, and particularly preferably 200 to 6,000 rpm.

The mixing ratio of the organic pigment solution and the poor solvent (a ratio of good solvent/poor solvent) is preferably in a range of from 1/50 to 2/3, more preferably from 1/40 to 1/2, and especially preferably from 1/20 to 3/8, in terms of volume ratio.

The organic nanoparticle concentration in the dispersion liquid containing produced organic nanoparticles is not particularly limited, as long as organic nanoparticles can be dispersed, but the amount of the organic nanoparticles is preferably 10 to 40,000 mg, more preferably 20 to 30,000 mg, and particularly preferably 50 to 25,000 mg, per 1,000 ml of the dispersion solvent.

[Particle Diameter and Monodispersity of Organic Nanoparticles]

As to the particle diameter of organic nanoparticles, an average scale of a group can be digitalized by several measurement methods. There are frequently-used parameters such as mode diameter indicating the maximum value of distribution, median diameter corresponding to the median value in the integral frequency distribution curve, and various average diameters (e.g. number-averaged diameter, length-averaged diameter, area-averaged diameter, weight-averaged diameter, volume-averaged diameter), and the like. In the present specification, the particle diameter means a number-averaged diameter, unless otherwise particularly specified. The particle diameter of the pigment fine particles (primary particles) produced by the method of producing fine particles of an anthraquinone structure-containing pigment of the present invention is preferably 1 μm or less (in a state of, e.g., crystal or aggregate of such a size), more preferably 1 to 200 nm, further preferably 2 to 100 nm, and particularly preferably 5 to 80 nm.

Further, in the present invention, a ratio (Mv/Mn) of volume-averaged diameter (Mv) to number-averaged diameter (Mn) is used as the indicator of the monodispersity of particles, unless otherwise particularly specified. The monodispersity, the ratio Mv/Mn, of the pigment fine particles (primary particles) produced by the method of producing fine particles of an anthraquinone structure-containing pigment of the present invention is preferably 1.0 to 2.0, more preferably 1.0 to 1.8, further preferably 1.0 to 1.6, and particularly preferably 1.0 to 1.4.

[Method of Producing Organic Pigment Fine Particles (Production Apparatus)]

In the method of producing fine particles of an anthraquinone structure-containing pigment according to the present invention, favorable embodiments of the production apparatus for use in production of the nanoparticles will be explained below, but it should not be construed that these embodiments restrict the technological scope of the present invention.

(Exemplary Apparatus 1 for Producing Organic Pigment Fine Particles)

Figures 1, 2:
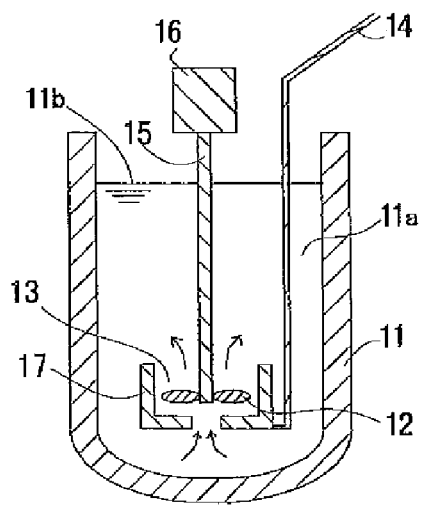
Figure 2:
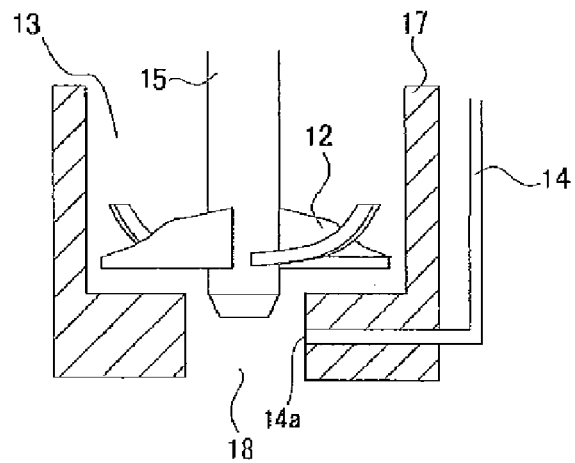

FIG. 2-1 is a schematic view of a production apparatus for use in an embodiment of the present invention. In FIG. 2-1, the organic pigment solution is continuously supplied through a supply tube 14 to a mixing chamber 13 provided in a container 11. Herein, a poor solvent 11a is contained in the container 11, and the mixing chamber 13 is provided below a liquid surface of the poor solvent. The inside of the mixing chamber is also filled with the poor solvent. Further, a bulk poor solvent in the reaction container 11 is made to flow in a convective manner upward (in the direction indicated by an arrow of the Figure) in the mixing chamber 13 at all times by the effect of stirring in the mixing chamber 13.

FIG. 2-2 is a partially enlarged sectional view schematically showing the mixing chamber 13 in an embodiment of the production apparatus of FIG. 2-1. The solution of the organic pigment is fed through the feed pipe 14 into the mixing chamber 13. In this embodiment, the mixing chamber 13 is formed of a casing 17 composed of a right-angled square tube having a constant sectional area. The upper end of the casing 17 is an open end, and the lower end of the casing is provided with a circular hole 18 so that the poor solvent in the mixing chamber 13 is in communication with the bulk poor solvent. In this embodiment, the organic pigment solution feed pipe 14 is provided in a wall of which the lower end of the casing 17 is constituted, and is opened toward the above-described circular hole. Further, the inside of the mixing chamber 13 is provided with the stirring blade 12 which is attached to the shaft 15 and which is rotated by a motor (not shown). The rotation of the stirring blade 12 causes the poor solvent to circulate upward in the mixing chamber 13 through the circular hole 18 at all times.

The stirring blade 12 provided in the above mixing chamber 13 must generate desired mixing strength in the mixing chamber. The mixing strength is presumed to be an important operation factor to the size of a droplet upon mixing of the solution of the organic pigment.

Further it is preferable to properly select the stirring blade 12 having an ability to draw out the organic pigment fine particles to be formed in a mixing space quickly/immediately to discharge the organic pigment fine particles to the outside of the mixing chamber 13 quickly/immediately, in order that giant particles may be prevented from being formed, specifically, the formed organic pigment fine particles may be prevented from remaining in the mixing chamber 13 to: be bonded to other organic pigment fine particles to become larger particles; or be exposed to the solution of the organic pigment fed into the mixing chamber 13 to become larger particles.

The stirring blade 12 may be of any type, as long as it can attain the aforementioned effects, and, for example, any of a turbine type and a fan turbine type can be used.

Further, as described above, the casing 17 is preferably constituted of a square tube. Thus, a flow produced by the stirring blade 12 is disturbed by a corner of the casing 17, whereby a mixing effect can be further enhanced, without the need for an additional member such as a baffle plate.

Figures 2, 3:
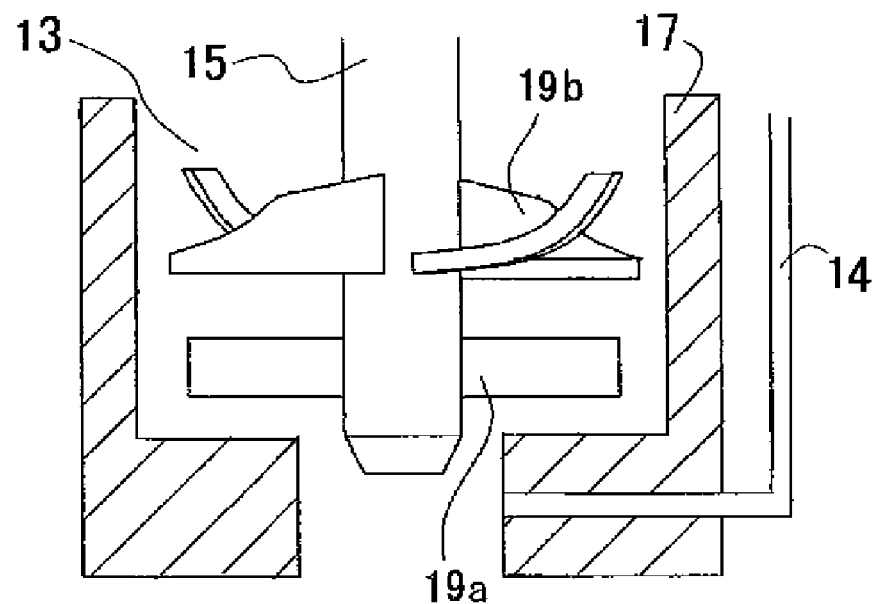
Figure 3:
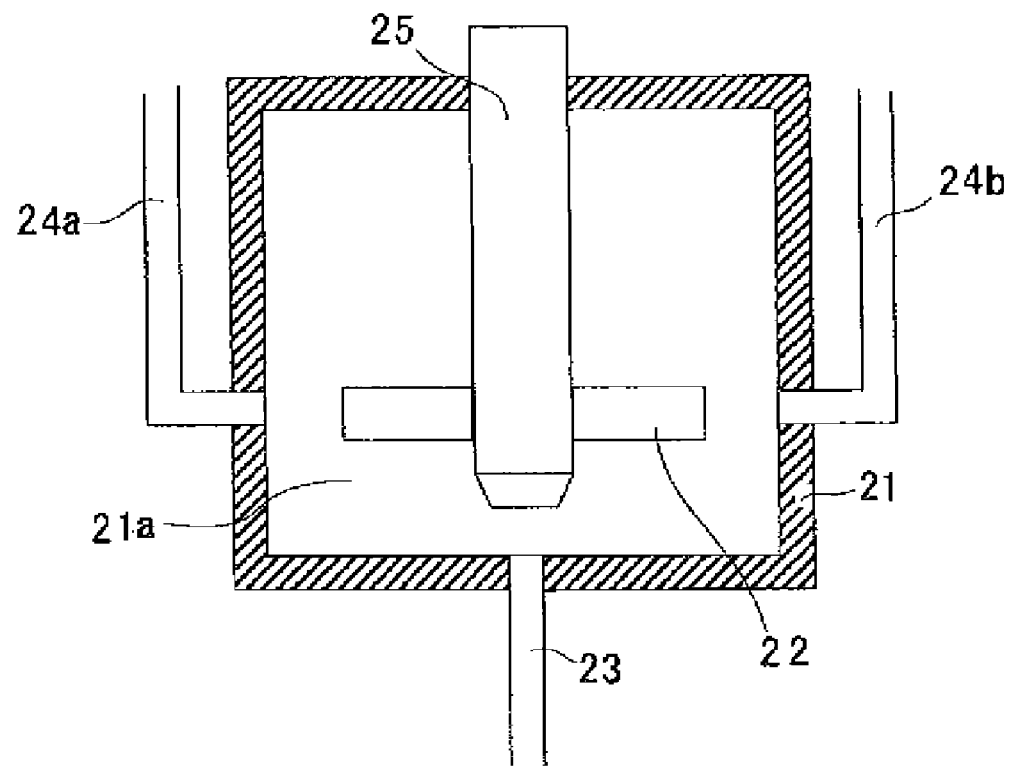

FIG. 2-3 is a partially enlarged sectional view illustrating a mixer provided with two sets of stirring blades (a stirring blade for mixing 19a and a stirring blade for discharging 19b) in the mixing chamber, in another embodiment of the production apparatus of FIG. 2-1. By providing two stirring blades as described above, it is possible to independently select an ability to control mixing strength and an ability to discharge the thus-formed organic pigment fine particles to the outside of the mixing chamber, thereby such an operation can be performed that the mixing strength and the amount of a circulating solvent each are independently set to a desired value.

(Exemplary Apparatus 2 for Producing Organic Pigment Fine Particles)

FIG. 3 is a schematic sectional view illustrating another embodiment of the production apparatus for use in the method of producing fine particles of an anthraquinone structure-containing pigment according to the present invention. In FIG. 3, the organic pigment solution and the poor solvent are supplied respectively through supply pipes 24a and 24b into a stirring chamber 21a continuously. A produced organic pigment fine particle dispersion is preferably immediately drawn out through the discharge pipe 23, in order that giant particles can be prevented from being formed, specifically, organic pigment fine particles formed in the stirring vessel 21a may be prevented from remaining in the stirring vessel 21a to: be bonded to other organic pigment fine particles to become larger particles; or be exposed to the solution of the organic pigment fed from the feed pipe 24a or 24b to become larger particles.

Figure 4:
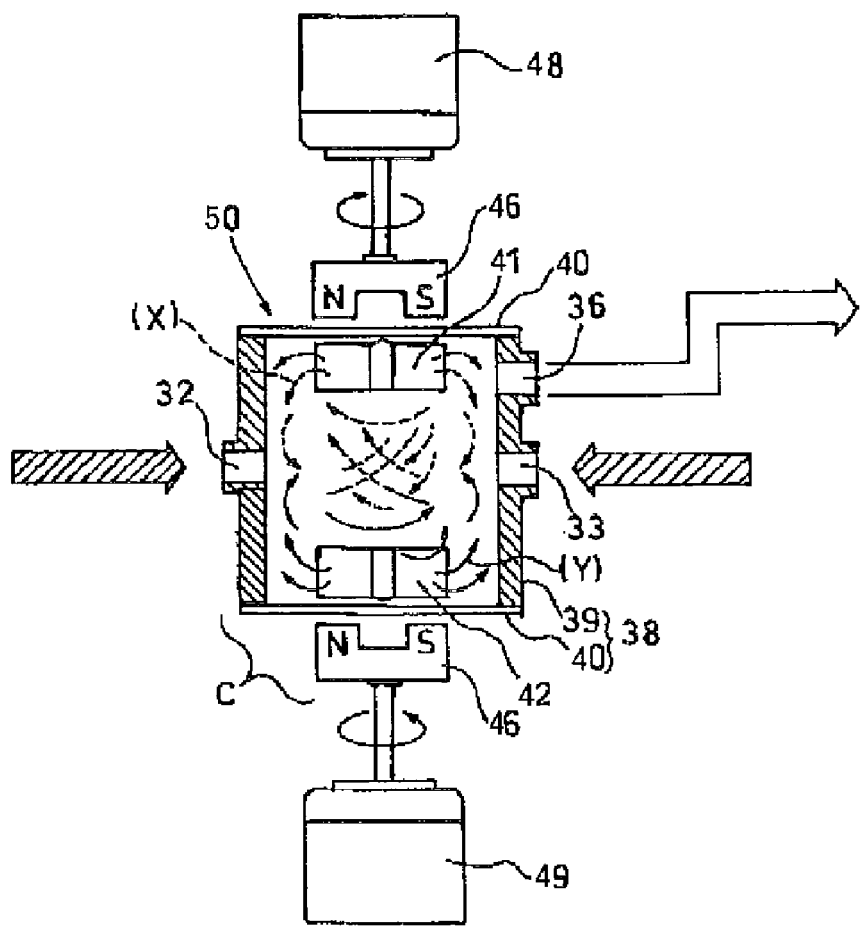
FIG. 4 is a sectional view schematically showing still another embodiment of the production apparatus that can be used in the method of producing fine particles of an anthraquinone structure-containing pigment of the present invention.

FIG. 4 is a schematic sectional view illustrating still another embodiment of the apparatus for use in the method of producing fine particles of an anthraquinone structure-containing pigment according to the present invention. In the production apparatus as shown in FIG. 4, a stirring device 50 have: a cylindrical stirring vessel 38 provided with two liquid feed ports 32 and 33 into which the solution of the organic pigment and the poor solvent are made to flow, respectively, and a liquid discharge port 36 for discharging a mixed liquid that has been subjected to stirring; and a pair of stirring blades 41 and 42 as stirring means for controlling a state where a liquid is stirred in the stirring vessel 38 by being rotated in the stirring vessel 38.

The stirring vessel 38 is constituted of: a cylindrical vessel main body 39 with its central axis directed in a vertical direction; and sealing plates 40 as vessel walls for capping the upper and lower opening ends of the vessel main body 39. Further, each of the stirring vessel 38 and the vessel main body 39 is formed of a non-magnetic material excellent in magnetic permeability. The two liquid feed ports 32 and 33 are provided at positions close to the lower end of the vessel main body 39, and the liquid discharge port 36 is provided at a position close to the upper end of the vessel main body 39.

Further, the pair of stirring blades 41 and 42 is placed at upper and lower opposing ends in the stirring vessel 38 to be distant from each other, and are rotated in directions opposite to each other. The respective stirring blade 41 and 42 constitutes a magnetic coupling C together with an external magnet 46 placed on the outside of the vessel wall (sealing plate 40)

close to the respective stirring blade 41 and 42. That is, the respective stirring blade 41 and 42 is coupled with the corresponding external magnet 46 by a magnetic force, and the blades are rotated in directions opposite to each other, by rotating the respective external magnets 46 with independent motors 48 and 49.

As indicated by a broken line arrow (X) and a solid line arrow (Y) in FIG. 4, the pair of stirring blades 41 and 42 placed in the vessel 38 to be opposed to each other forms stirring flows different from each other in direction in the vessel 38. Since the stirring flows formed by the respective stirring blades 41 and 42 are different from each other in flow direction, the flows collide with each other, to produce, in the vessel 38, high-speed turbulence that accelerates stirring in the vessel 38. The turbulence can: prevent a flow in the vessel 38 from being brought into a steady state; and inhibit the formation of cavities around the rotation axes of the stirring blades 41 and 42 even when the rotational speed of each of the stirring blades 41 and 42 is increased. At the same time, the turbulence can inhibit the occurrence of an inconvenience, in other words, the formation of a steady flow flowing in the stirring vessel 38 along the inner peripheral surface of the stirring vessel 38 without receiving a sufficient stirring action. Therefore, an increase in rotational speed of each of the stirring blades 41 and 42 can easily increase the processing speed. Further, at that time, the increase in rotational speed can inhibit the discharge of a liquid that has been insufficiently stirred and mixed owing to the fact that a liquid flow in the vessel 38 is brought into a steady state, thereby a deterioration in processing quality can be prevented.

Further, the respective stirring blades 41 and 42 in the stirring vessel 38 are coupled with the motors 48 and 49 placed outside the stirring vessel 38 by the magnetic couplings C. As a result, there is no need for inserting a rotation axis into each vessel wall of the stirring vessel 38, so the stirring vessel 38 can take a closed container structure free of a portion (a cavity) through which a rotation axis is inserted. Thus, it is possible to prevent leakage of a stirred and mixed liquid to the outside of the vessel from being occurred, and, at the same time, it is possible to prevent deterioration in processing quality due to contamination, for example, of a lubricating liquid for a rotation axis (a sealing liquid) as an impurity contaminated into the liquid in the vessel 38 from being occurred.

When a pigment dispersion composition is produced, it is possible to produce organic pigment fine particles according to not only a batch mode but also a continuous flow mode, and also in an industrial scale, by using one of the production apparatuses of such configurations. It is also possible to make the ratio of the organic material solution to the poor solvent solution, supplied to the stirring chamber, consistently constant, by rapidly discharging the organic pigment fine particle dispersion generated. Thus, the solubility of the organic material in the dispersion liquid can be kept constant during a time commencing on the initiation of the production of the organic pigment fine particles and ending on the completion of the production, so monodisperse organic pigment fine particles can be stably produced.

It is further possible to produce monodisperse organic pigment fine particles more reliably, by preventing discharge of the organic pigment fine particle dispersion insufficiently stirred and mixed because the liquid flow in the chamber changed to a steady state, and by preventing contamination of the lubricant fluid (sealing fluid) for the rotating shaft as an impurity to the liquid in the chamber.

(Exemplary Apparatus 3 for Producing Organic Pigment Fine Particles)

A production method by using a blade having shearing force will be described as still another embodiment of the apparatus for use in the method of producing fine particles of an anthraquinone structure-containing pigment according to the present invention.

Herein, the "shearing force" as used in the present specification refers to a shear force (shear stress) to be exerted by a stirring blade on a droplet produced after the mixing of the solution of the organic pigment into the poor solvent.

The shape of the stirring unit that can be used in the present invention is not particularly limited, as long as it is a shape capable of applying high shearing force. General examples of the stirring unit include a paddle blade, a turbine blade, a screw blade, and a Pfaudler blade, and preferable examples of the stirring unit include a dissolver blade and a stirring, emulsifying, and dispersing apparatus having a stirring zone constituted of a revolving turbine unit and a fixed stator unit placed around the turbine unit with a small clearance.

Figures 1, 5:
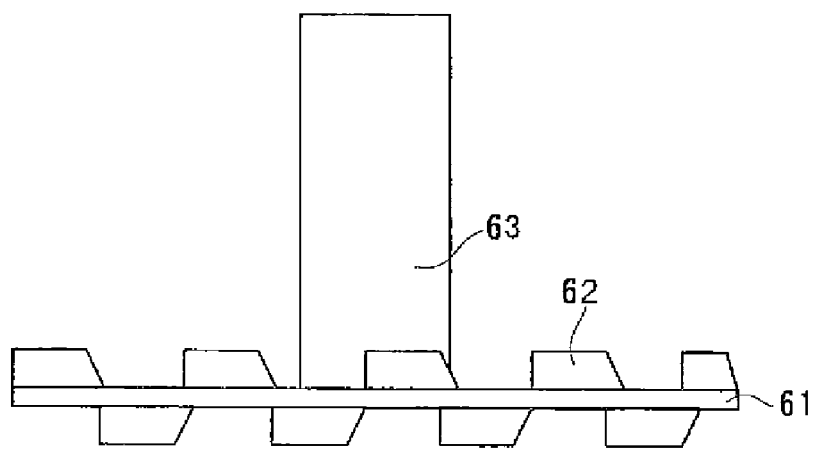
Figures 2, 5:
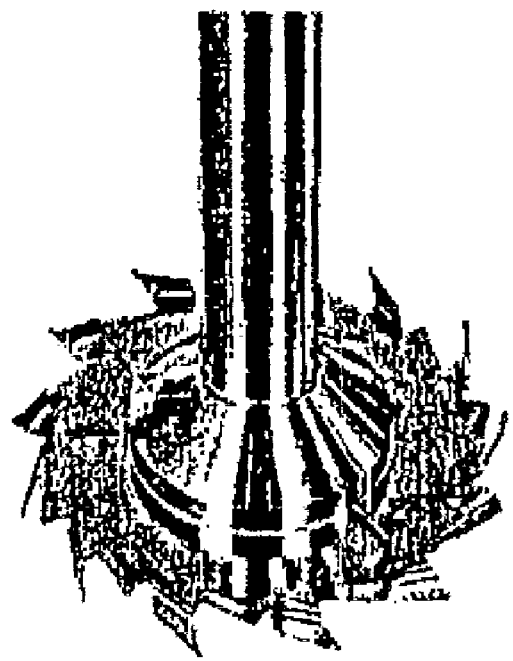

The dissolver blade is a special stirring blade giving high shearing force. FIG. 5-1 is a schematic front view of an example of the dissolver blade, and FIG. 5-2 is a photograph substituted for drawing thereof.

Figure 6:
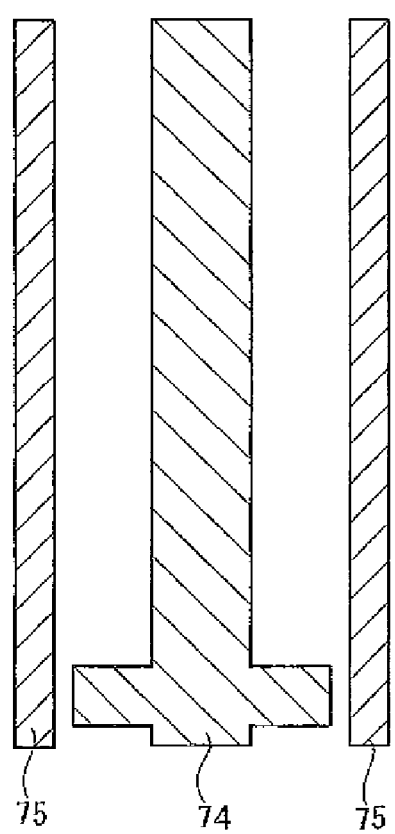
FIG. 6 is a sectional view schematically showing an example of the stirring zone consisting of a revolving turbine unit and a fixed stator unit placed surrounding the turbine unit with a small clearance, for use in the method of producing fine particles of an anthraquinone structure-containing pigment of the present invention.

An apparatus as shown in FIG. 6, which has a stirring unit consisting of a revolving turbine unit and a fixed stator unit placed around it with a small clearance, is also preferably used, and examples of such a stirring, emulsifying, and dispersing apparatus include Physcotron manufactured by Microtech Co., Ltd., T.K Homomixer manufactured by Tokushu Kika Kogyo Co., Ltd., and ULTRA-TURRAX manufactured by IKA.

The stirring speed at which the effects of the present invention can be obtained may vary according to the viscosity and temperature of the poor solvent and the kind and amount of the surfactant to be used, but is preferably from 100 to 10,000 rpm, more preferably from 150 to 8,000 rpm, and particularly preferably from 200 to 6,000 rpm. At a rotational speed below the range, the effects of the present invention could be insufficiently produced. At a rotational speed above the range, air bubbles could be undesirably incorporated into the poor solvent.

[Concentration of the Organic Nanoparticle Dispersion]

In the method of producing fine particles of an anthraquinone structure-containing pigment of the present invention, the organic nanoparticle dispersion may be subjected to desalting and condensation, whereby an organic nanoparticle dispersion suitable for a color filter coating liquid or for inkjet ink can be produced on an industrial scale.

Hereinafter, the method for concentration of the dispersion is explained below.

The condensation method is not particularly restricted as long as the organic nanoparticle liquid can be concentrated by the method. Examples of a preferable condensation method include: a method involving adding and mixing an extraction solvent to and with an organic nanoparticle dispersion, condensing and extracting the organic nanoparticles to the extraction solvent phase, and filtering the concentrated extract liquid through a filter or the like, to provide a concentrated nanoparticles liquid (extraction method); a method involving sedimenting the organic nanoparticles by centrifugal separation for condensation (centrifugal separation method); a method involving performing desalting and condensation by ultrafiltration (ultrafiltration method); a method involving sublimating a solvent by vacuum freeze-drying for condensation (vacuum freezing method); and a method involving drying a solvent under heat or reduced pressure for condensation (dying method). Alternatively, a combination of two or more of these methods is extremely preferably employed.

The concentration of the organic nanoparticles after concentration is preferably 1 to 100 mass %, more preferably 5 to 100 mass %, and particularly preferably 10 to 100 mass %.

(Extraction Method)

Hereinafter, the method for concentration and extraction is explained below. The extraction solvent that can be used in the concentration extraction is not particularly limited; and a preferable extraction solvent is one which is substantially incompatible (immiscible) with the dispersion solvent (e.g. an aqueous solvent) of the organic nanoparticle dispersion liquid, and which forms an interface when the solvent is left standing after the mixing. (The "substantially incompatible (immiscible) with" as used in the present specification refers to a state where compatibility between the solvents is low, and the amount of the extraction solvent to be dissolved in the dispersion solvent is preferably 50 mass % or less, and more preferably 30 mass % or less.) Further, the extraction solvent is preferably a solvent that causes weak aggregation to such a degree that the organic nanoparticles can be redispersed in the extraction solvent. Herein, "weak, redispersible aggregation" means that aggregates can be redispersed without applying high shearing force such as by milling or high-speed agitation. Such a state is preferable, because it is possible to prevent strong aggregation that may change the particle size and to swell the desired organic nanoparticles with the extraction solvent, besides the dispersion solvent such as water can be easily removed by filter filtration. As the extraction solvents, any of ester-series solvents, alcohol-series solvents, aromatic solvents, and aliphatic solvents are preferable; ester-series solvents, aromatic solvents, and aliphatic solvents are more preferable; ester-series solvents are particularly preferable.

Examples of the ester-series solvents include 2-(1-methoxy)propyl acetate, ethyl acetate, and ethyl lactate. Examples of the alcohol-series solvents include n-butanol and isobutanol. Examples of the aromatic solvents include benzene, toluene and xylene. Examples of the aliphatic solvents include n-hexane and cyclohexane. Furthermore, the extraction solvent may be a pure solvent of one of the preferable solvents above, or alternatively it may be a mixed solvent composed of plurality of the solvents.

An amount of the extraction solvent is not particularly limited, as long as the solvent can extract the organic nanoparticles, but the amount of the extraction solvent is preferably smaller than an amount of the organic nanoparticle dispersion liquid, taking extraction for concentration into consideration. When expressed by volume ratio, the amount of the extraction solvent to be added is preferably in the range of 1 to 100, more preferably in the range of 10 to 90, and particularly preferably in the range of 20 to 80, with respect to 100 of the organic nanoparticle dispersion liquid. A too-large amount may results in prolongation of the time for concentration, while a too-small amount may cause insufficient extraction and residual nanoparticles in the dispersion solvent.

After addition of the extraction solvent, the resultant mixture is preferably stirred and mixed well for sufficient mutual contact with the dispersion liquid. Any usual method may be used for stirring and mixing. The temperature at the time of addition and mixing of the extraction solvent is not particularly limited, but it is preferably 1 to 100° C. and more preferably 5 to 60° C. Any apparatus may be used for addition and mixing of the extraction solvent as long as it can favorably carry out each step. For example, a separatory funnel-like apparatus may be used.

(Ultrafiltration Method)

As the method for ultrafiltration, for example, methods used for desalting and concentrating silver halide emulsion can be used. Examples are those methods described in Research Disclosure, No. 10208 (1972), No. 13 122 (1975), No. 16 351 (1977) etc. While pressure difference and flow rate, which are important as the operational conditions, can be selected by referring to the characteristic curves mentioned in Haruhiko Oya, "Maku Riyo Gijttsti Handbook (Membrane Utilization Technique Handbook)", published by Saiwai Shobo (1978), p. 275, it is necessary to find out optimum conditions for treating a organic nanoparticle dispersion composition of interest in order to suppress aggregation of particles. As a method for supplementing the solvent lost due to passage through the membrane, there are the constant volume method where the solvent is continuously supplemented and the batch method where the solvent is intermittently added. The constant volume method is preferred in the present invention because of its relatively shorter desalting treatment time. As the solvent to be supplemented as described above, pure water obtained by ion exchange or distillation is generally used. A dispersing agent or a poor solvent for dispersing agent may be mixed in the pure water. Alternatively, the dispersing agent or the poor solvent for dispersing agent can also be directly added to the organic nanoparticle dispersion.

Figure 7:
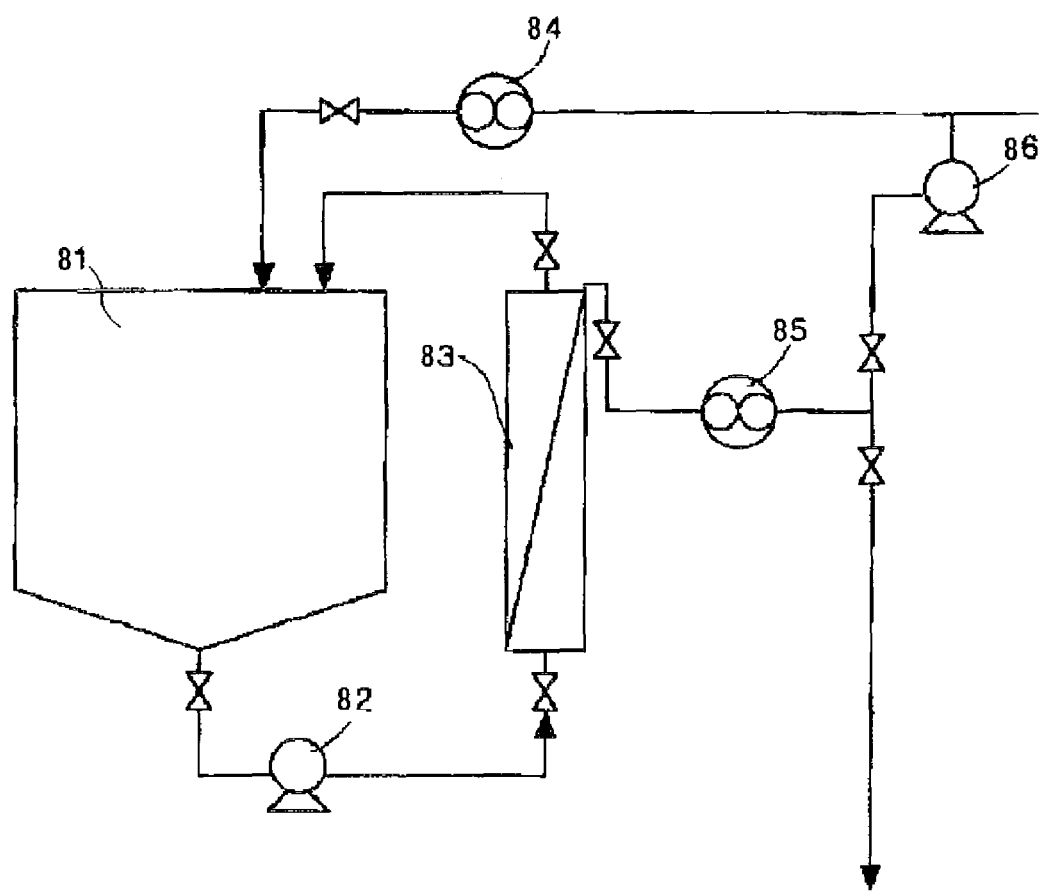
FIG. 7 is an explanatory drawing showing an embodiment of an ultrafiltration device that can be used in the method of producing fine particles of an anthraquinone structure-containing pigment of the present invention.

FIG. 7 shows an example of the constitution of a device for performing ultrafiltration. As shown in FIG. 7, the device includes: a tank 81 for storing dispersion of organic nanoparticles; a circulation pump 82 for circulating the dispersed product in the tank 81; and an ultrafiltration module 83 for removing a by-product inorganic salts in the dispersed product introduced by the circulation pump 82 as permeated water. The dispersed product from which the permeated water has been separated is returned to the inside of the tank 81 again, and a similar operation is repeatedly performed until a predetermined object of the removal of the by-product inorganic salts is achieved. Further, the device is equipped with: a flow meter 84 for measuring replenishment pure water which is used for replenishing the solvent lost by the permeated water by adding a constant amount of pure water; and a flow meter 85 for measuring permeated water which is used for determining the replenishment amount of pure water. In addition, the device is equipped with a reverse direction washing pump 86 for introducing water for diluting the permeated water.

As an ultrafiltration membrane, modules of plate type, spiral type, cylinder type, hollow yarn type, hollow fiber type and so forth, in which a membrane is already incorporated, are commercially available from Asahi Chemical Industry Co., Ltd., Daicel Chemical Industries, Ltd., Toray Industries, Inc., NITTO DENKO CORP. and so forth. In view of the total membrane area and washability, those of hollow yarn type and spiral type are preferred. The fractional molecular weight, which is an index of a threshold for substances that can permeate a membrane, must be determined based on the molecular weight of the used dispersing agent. In the present invention, those having a fractional molecular weight of 5,000 to 50,000, more preferably 5,000 to 15,000, are preferably used.

To separate a concentrated extract liquid from a dispersion solvent of the organic nanoparticle dispersion, filtration by using a filter is preferably carried out. As an apparatus for filter filtration, use can be made, for example, of a high-pressure filtration apparatus. Preferable examples of the filter to be used include nanofilter, ultrafilter, and the like. It is preferable to remove a residual dispersion solvent by filter filtration, to further concentrate organic nanoparticles in the thus-concentrated extract liquid and to obtain a concentrated nanoparticle liquid.

(Freeze-Drying Method)

A method for freeze-drying is not particularly limited, and any method may be adopted as long as a person skilled in the art can utilize the method. Examples of the freeze-drying method include a coolant direct expansion method, a multiple freezing method, a heating medium circulation method, a triple heat exchange method, and an indirect heating freezing method. Of these, the coolant direct-expansion method or the indirect heating freezing method is preferably employed, and the indirect heating freezing method is more preferably employed. In each method, preliminary freezing is preferably performed before freeze-drying is performed. Conditions for the preliminary freezing are not particularly limited, but a sample to be subjected to freeze-drying must be uniformly frozen.

Examples of a device for the indirect heating freezing method include a small freeze-drying machine, an FTS freeze-drying machine, an LYOVAC freeze-drying machine, an experimental freeze-drying machine, a research freeze-drying machine, a triple heat exchange vacuum freeze-drying machine, a monocooling-type freeze-drying machine, and an HULL freeze-drying machine. Of these, the small freeze-drying machine, the experimental freeze-drying machine, the research freeze-drying machine, or the monocooling-type freeze-drying machine is preferably used, and the small freeze-drying machine or the monocooling-type freeze-drying machine is more preferably used.

The temperature for freeze-drying, which is not particularly limited, is, for example, about −190 to −4° C., preferably about −120 to −20° C., and more preferably about −80 to −60° C. The pressure for freeze-drying is not particularly limited either, and can be appropriately selected by a person skilled in the art. It is recommended that freeze-drying be performed under a pressure of, for example, about 0.1 to 35 Pa, preferably about 1 to 15 Pa, and more preferably about 5 to 10 Pa. The time for freeze-drying is, for example, about 2 to 48 hours, preferably about 6 to 36 hours, or more preferably about 16 to 26 hours. It should be noted, however, that these conditions can be appropriately selected by a person skilled in the art. With regard to a method for freeze-drying, reference can be made to, for example, Pharmaceutical machinery and engineering handbook by JAPAN SOCIETY OF PHARMACEUTICAL MACHINERY AND ENGINEERING, Chijinshokan Co., Ltd., p. 120-129 (September, 2000), Vacuum handbook by ULVAC, Inc., Ohmsha, Ltd., p. 328-331 (1992), or Freezing and drying workshop paper by Koji Ito et al., No. 15, p. 82 (1965).

(Centrifugal Separation Method)

The centrifugal separation method will be explained. A centrifugal separator to be used in the concentration of the organic nanoparticles by centrifugal separation may be any device as long as the device can sediment organic nanoparticles in an organic nanoparticle dispersion liquid (or in an organic nanoparticle concentrated extract liquid). Examples of the centrifugal separator include a widely used device, a system having a skimming function (function with which a supernatant layer is sucked during the rotation of the system, to discharge to the outside of the system), and a continuous centrifugal separator for continuously discharging solid matter.

As the conditions for centrifugal separation, the centrifugal force (a value representing a ratio of an applied centrifugal acceleration to the gravitational acceleration) is preferably 50 to 10,000, more preferably 100 to 8,000, and particularly preferably 150 to 6,000. The temperature at the time of centrifugal separation is preferably −10 to 80° C., more preferably −5 to 70° C., and particularly preferably 0 to 60° C., though a preferable temperature varies depending on the kind of the solvent of the dispersion liquid.

(Drying Method)

The drying method will be described. For a device for use in the concentration of the organic nanoparticles by drying under reduced pressure, there is no particular limitation as long as the solvent of the organic nanoparticle dispersion liquid (or the organic nanoparticle concentrated extract) can be evaporated. Examples of the device include a widely used vacuum drier and rotary pump, a device capable of drying a liquid under heat and reduced pressure while stirring the liquid, and a device capable of continuously drying a liquid by passing the liquid through a tube the inside of which is heated and reduced in pressure.

The temperature for drying under heat and reduced pressure is preferably 30 to 230° C., more preferably 35 to 200° C., and particularly preferably 40 to 180° C. The pressure for the above-mentioned reduced pressure is preferably 100 to 100,000 Pa, more preferably 300 to 90,000 Pa, and particularly preferably 500 to 80,000 Pa.

According to the concentration method as described above, it is possible to efficiently concentrate the organic nanoparticles from organic nanoparticle dispersion liquid. With regard to the concentration ratio, for example, when the density of nanoparticles in the organic nanoparticle dispersion liquid as a raw material is defined as 1, the density in the concentrated organic nanoparticle paste can be concentrated to a magnification of preferably about 100 to 3,000, or more preferably about 500 to 2,000.

[Colored Pigment Dispersion Composition]

The colored pigment dispersion composition of the present invention includes the fine particles of an anthraquinone structure-containing pigment produced by the production method of the present invention and a binder, and it may be produced by (i) a method including extracting the pigment fine particles into an organic solvent according to the extraction method described above and adding the binder to the extract or by (ii) a method including extracting the pigment fine particles into an extraction solvent to which the binder has been added. The binder is as described above in the [Binder] section, and the preferred range thereof is also as described above in the [Binder] section. The extraction may be performed using the extraction method described above in the [Concentration of organic nanoparticle dispersion] section, and the kind of the extraction solvent and the preferred range of the concentration rate may also be the same as described above. A preferred mode of the method (i) including extracting the pigment fine particles and adding the binder is described in the next section [Re-dispersion of organic nanoparticle dispersion].

[Re-Dispersion of Organic Nanoparticle Dispersion]

In the method of producing fine particles of an anthraquinone structure-containing pigment of the present invention, it is preferable that the organic nanoparticles obtained are concentrated, and then undergo fining and dispersing treatment again in an organic solvent containing a binder. (In the present specification, this process is also referred to as "re-dispersion", and the term "fining and dispersing" means a process to release particles in a dispersion from the aggregation state, thereby to enhance degree of dispersion.)

In the case of using for color filter, for example, the particles can be added to a vehicle, to be dispersed. If paint is taken as an example, the vehicle means a portion of a medium in which a pigment is dispersed when the paint is in a liquid state. The vehicle is a liquid state and contains a portion (binder) that is to be bonded to the pigment to solidify a coating film and a component (organic solvent) for dissolving and diluting the portion. In the present invention, a binder to be used at the time of the formation of the nanoparticles and a binder to be used in redispersing may be identical to or different from each other, and they are sometimes separately referred to as a nanoparticle formation binder and a redispersion binder, respectively.

The concentration of pigment in a dispersion composition of the pigment after re-dispersion can be properly determined in accordance with a purpose of their use. However, the concentration of the pigment is preferably in the range of from 2 to 30 mass %, more preferably in the range of from 4 to 20 mass %, and especially preferably in the range of from 5 to 15 mass %, based on the total amount of the dispersion composition. In the case where the pigment is dispersed with such vehicles as described above, amounts of the binder and the dissolution and dilution component can be properly determined depending on, for example, the kind of the pigment. However, the amount of the binder is preferably from 1 to 30 mass %, more preferably from 3 to 20 mass %, and especially preferably from 5 to 15 mass %, based on the total amount of the pigment dispersion composition. The amount of the dissolution and dilution component is preferably from 5 to 80 mass %, and more preferably from 10 to 70 mass %, based on the total amount of the pigment dispersion composition.

In the liquid of the concentrated extract nanoparticles described above, in the case of state in which quick filtration through a filter is allowed, organic nanoparticles ordinary aggregate by concentration. In addition, organic nanoparticles concentrated by centrifugal separation or drying also aggregate by concentration.

Examples of a method that can be employed for dispersing such aggregated nanoparticles, include a dispersing method with using a supersonic wave and a method involving applying physical energy. (In the present specification, the term "aggregated nanoparticles" means an assembly of nanoparticles gathered together by a secondary force, such as aggregates.)

Apparatus for ultrasonic wave irradiation to be used is preferably an apparatus that is capable of applying an ultrasonic wave at 10 kHz or more, and examples thereof include an ultrasonic wave homogenizer, an ultrasonic wave cleaning machine, and the like. The liquid temperature during ultrasonic wave irradiation is preferably kept at 1 to 100° C., more preferably 5 to 60° C., since increase in the liquid temperature leads to thermal aggregation of nanoparticles (see Pigment dispersion technique-surface treatment and how to use dispersing agent, and evaluation for dispersibility-, TECHNICAL INFORMATION INSTITUTE CO., LTD, 1999). The temperature can be controlled, for example, by adjusting the temperature of dispersion, by adjusting the temperature of a temperature-controlling layer for controlling of dispersion temperature, or the like.

A dispersion machine to be used at the time of dispersing the concentrated organic nanoparticles by the application of physical energy is not particularly limited, and examples of the dispersion machine include a kneader, a roll mill, an attritor, a super mill, a dissolver, a homomixer, and a sand mill. Further, a high pressure dispersion method and a dispersion method of using fine particle beads are also exemplified as a preferable method.

<1> Dispersion Method

In the present invention, a preferable method of producing a composition is a method in which a coloring agent undergoes kneading-and-dispersing treatment with a resin ingredient so that the resulting kneaded-and-dispersed matter would have a relatively high viscosity of 10,000 mPa·s or more, preferably 100,000 mPa·s or more, at 25° C., and then the kneaded-and-dispersed matter is subjected to finely dispersing treatment after a solvent is added thereto, so that the resultant fine dispersion liquid would have a relatively low viscosity of 1,000 mPa·s or less, preferably 100 mPa·s or less, at 25° C.

Examples of a machine used in the kneading-and-dispersing treatment include a two-rod roll, a three-rod roll, a ball mill, a trom mill, a disper, a kneader, a cokneader, a homogenizer, a blender, a single screw extruder and a double screw extruder. These machines each carry out dispersion while giving a strong shearing force to ingredients to be dispersed. Then, a solvent is added, and the finely dispersing treatment is performed by mainly using a vertical or horizontal sand grinder, a pin mill, a slit mill, an ultrasonic dispersing machine or a high-pressure dispersing machine, together with beads which range in size from 0.1 mm to 1 mm and are made of glass, zirconia or the like. Further, precision dispersing treatment can also be performed by use of minute-particle beads smaller than 0.1 mm in size. Alternatively, it is possible to omit the kneading-and-dispersing treatment. In this case, beads dispersion is carried out using a pigment, a dispersing agent or a surface treating agent, and the acrylic copolymer and the solvent as recited in the present invention.

Alternatively, it is possible to carry out dispersion treatment of a main pigment and that of an auxiliary pigment separately, then mix the resulting dispersions, and further subject the resulting mixture to dispersion treatment, and it is also possible to subject a main pigment, together with an auxiliary pigment, to dispersing treatment.

Incidentally, details of kneading and dispersing operations are also described in T. C. Patton, *Paint Flow and Pigment Dispersion*, John Wiley & Sons (1964), and the methods published therein may be adopted.

<2> Examples of the Dispersing Agent (Dispersant)

In the present invention, any of commonly-used pigment dispersing agents and surfactants may be added for the purpose of enhancing the dispersibility of pigments. As these dispersing agents, various kinds of compounds can be used. Examples of such compounds include phthalocyanine derivatives (EFKA-6745, a commercial product (trade name, manufactured by EFKA ADDITIVES)), SOLSPERSE 5000 (trade name, manufactured by ZENECA); organosiloxane polymer KP341 (trade name, manufactured by Shin-Etsu Chemical Co., Ltd.), (meth)acrylic acid (co)polymers POLYFLOW No. 75, No. 90 and No. 95 (trade name, manufactured by Kyoeisha Yushi Kagaku Kogyo Co., Ltd.), a cationic surfactant such as W001 (trade name, manufactured by Yusho Co., Ltd.); nonionic surfactants, such as polyoxyethylene lauryl ether, polyoxyethylene stearyl ether, polyoxyethylene oleyl ether, polyoxyethylene octyl phenyl ether, polyoxyethylene nonyl phenyl ether, polyoxyethylene glycol dilaurate, polyethylene glycol distearate and sorbitan fatty acid ester; anionic surfactants such as W004, W005 and W017 (trade name, manufactured by Yusho Co., Ltd.); polymeric dispersants such as EFKA-46, EFKA-47, EFKA-47EA, EFKA POLYMER 100, EFKA POLYMER 400, EFKA POLYMER 401 EFKA POLYMER 450 (trade name, all of which are manufactured by Morishita & Co., Ltd.), and Disperse Aid 6, Disperse Aid 8, Disperse Aid 15 and Disperse Aid 9100 (trade name, all of which are manufactured by San Nopco Limited); various Solsperse dispersants including Solsperse 3000, 5000, 9000, 12000, 13240, 13940, 17000, 24000, 26000 and 28000 (trade name, manufactured by ZENECA); Adeka Pluronic L31, F38, L42, L44, L61, L64, F68, L72, P95, F77, P84, F87, P94, L101, P103, F108, L121 and P-123 (trade name, manufactured by ADEKA CORPORATION), and Isonet S-20 (trade name, manufactured by Sanyo Chemical Industries, Ltd.). In addition, the pigment dispersants disclosed in JP-A-2000-239554, the compound (C) disclosed in JP-B-5-72943, the compound of Synthesis Example 1 described in JP-A-2001-31885, and so on can be preferably used, too.

The compounds shown as the dispersants used in formation of the organic nanoparticles in the section of [Dispersing agent] can also be used favorably for redispersion.

In the colored pigment dispersion composition of the present invention, it is possible to make the organic nanoparticles after re-dispersion (primary particles) into finely-dispersed particles and adjust their sizes to a range of preferably 1 to 200 nm, more preferably 2 to 100 nm, particularly preferably 5 to 50 nm. The Mv/Mn of particles after re-dispersion is preferably from 1.0 to 2.0, more preferably from 1.0 to 1.8, and particularly preferably from 1.0 to 1.5.

It is possible, for example, to condense and redisperse the organic nanoparticles contained in the colored pigment dispersion composition and the colored photosensitive resin composition of the present invention, even though they have a very small particle diameter in the nanometer size range (e.g., 10 to 100 nm). Therefore, the color filter in which the present colored pigment dispersion composition or colored photosensitive resin composition is used can have high optical density, excellent uniformity at the surface, and high contrast, and allows noise reduction of images.

Further, the method according to the present invention can disperse organic pigment particles into a state of being uniformly fined to a high degree, therefore the colored pigment dispersion composition or colored photosensitive composition containing the particles can deliver high coloring density even when the film thickness is thin and can ensure, for example, reduction in color filter thickness.

By incorporating pigment having a clear tone and a high coloring power as the pigment in the colored pigment dispersion composition or colored photosensitive resin composition, the resulting compositions can be used to advantage as an image forming material for production of color proof, color filter or the like.

Furthermore, since an alkali developer is used in an exposure-development process for formation of colored images, a binder soluble in an alkaline aqueous solution can be used in the colored pigment dispersion composition or colored photosensitive resin composition, and thereby an environmental requirement can also be satisfied.

In the present invention, it is also possible to use an organic solvent having a moderate drying property as the solvent (a dispersing medium for the pigment) to be used in the colored pigment dispersion composition or the colored photosensitive resin composition, so the requirement for the drying capability after coating can be satisfied too.

[Colored Photosensitive Resin Composition]

The colored photosensitive resin composition of the present invention includes at least (a) the colored pigment dispersion composition, (b) a binder, (c) a monomer or an oligomer, and (d) a photopolymerization initiator or a photopolymerization initiator system. It is preferable to mix (1) organic nanoparticles produced by a process including mixing an organic pigment solution and a poor solvent in the presence of a binder (A) to form organic pigment particles; (2) a binder (B); (3) a monomer or an oligomer; and (4) a photopolymerization initiator or a photopolymerization initiator system. The binders (A) and (B) may be the same or different. The components (1) to (4) of the colored photosensitive resin composition of the present invention are described below.

(1) Organic Nanoparticles

The method of producing the organic nanoparticles has been described in detail. The content of the organic nanoparticles is preferably from 3 to 90% by mass, more preferably from 20 to 80% by mass, and further preferably from 25 to 60% by mass, based on the total solids of the colored photosensitive resin composition (as used herein, the term "total solids" refers to the total amount of all the components of the composition, exclusive of the organic solvent(s)). When the content is too high, there sometimes occurs an increase in viscosity of the resultant dispersion liquid and leading to a problem in production suitability. When the content is too low, on the other hand, sufficient coloring power cannot be obtained. In order to perform a function as a coloring agent, it is preferred that the organic nanoparticles (pigment fine particles) have a particle diameter of preferably 0.1 µm or less, especially preferably 0.08 µm or less. For the purpose of toning, the pigment fine particles may be used in combination with pigments in common use. As the pigments, those described above can be used.

(2) Binder

The redispersing binder used for redispersion is preferably an acidic group-containing binder, and those described above in the [Binder] section are preferably used as redispersing binders. The redispersing binder is preferably a compound having a similar structure to that of the nanoparticle-forming alkali-soluble binder that is added when the organic pigment is formed into fine particles. Most preferably, both binders are the same. The content of the re-dispersion alkali-soluble binder (which may be the sum total of the content of the re-dispersion alkali-soluble binder and the residual content of the pigment nanoparticle formation alkali-soluble binder when the latter binder remains) is generally from 15 to 50 mass %, preferably from 20 to 45 mass %, based on the total solids in the colored photosensitive resin composition. If the amount of the binder is too large, viscosity of the composition becomes too high, which causes problem in production suitability. On the other hand, if the amount of the binder is too small, problems in coating film formation arise.

(3) Monomer or Oligomer

The monomer or oligomer contained in the colored photosensitive resin composition is preferably a monomer or oligomer which has two or more ethylenically unsaturated double bonds and which undergoes addition-polymerization by irradiation with light. The monomer or oligomer may be a compound having at least one addition-polymerizable ethylenically unsaturated group therein and having a boiling point of 100° C. or higher at normal pressure. Examples thereof include: a monofunctional acrylate and a monofunctional methacrylate such as dipentaerythritol hexa(meth)acrylate, polyethylene glycol mono(meth)acrylate, polypropylene glycol mono(meth)acrylate, and phenoxyethyl(meth)acrylate; polyethylene glycol di(meth)acrylate, polypropylene glycol di(meth)acrylate, trimethylolethane triacrylate, trimethylolpropane tri(meth)acrylate, trimethylolpropane diacrylate, neopentyl glycol di(meth)acrylate, pentaerythritol tetra(meth)acrylate, pentaerythritol tri(meth)acrylate, dipentaerythritol hexa(meth)acrylate, dipentaerythritol penta(meth)acrylate, hexanediol di(meth)acrylate, trimethylolpropane tri(acryloyloxypropyl)ether, tri(acryloyloxyethyl)isocyanurate, tri(acryloyloxyethyl)cyanurate, glycerin tri(meth)acrylate; a polyfunctional acrylate or polyfunctional methacrylate which may be obtained by adding ethylene oxide or propylene oxide to a polyfunctional alcohol such as trimethylolpropane or glycerin and converting the adduct into a (meth)acrylate. Further, another preferred examples include those compounds that are obtained by addition reaction of ethylene oxide or propylene oxide to polyfunctional alcohol, followed by (meth)acrylation, as described in formulae (1) and (2) of JP-A-10-62986.

Examples of the monomer and oligomer further include urethane acrylates as described in JP-B-48-41708, JP-B-50-6034, and JP-A-51-37193; and polyester acrylates as described in JP-A 48-64183, JP-B-49-43191, and JP-B-52-30490; polyfunctional acrylates or polyfunctional methacrylates such as epoxy acrylates which are reaction products of an epoxy resin and (meth)acrylic acid.

Among these, trimethylolpropane tri(meth)acrylate, pentaerythritol tetra(meth)acrylate, dipentaerythritol hexa(meth)acrylate, and dipentaerythritol penta(meth)acrylate are preferable.

Further, other than the above, "polymerizable compound B" described in JP-A-11-133600 can be mentioned as a preferable example.

These monomers or oligomers have a molecular weight of 200 to 1000, and they may be used singly or as a mixture of two or more kinds thereof. The content of the monomer or oligomer is generally in a range of from 5 mass % to 50 mass %, preferably from 10 mass % to 40 mass %, based on the total solid content of the colored photosensitive resin composition. If this content is too large, control of development properties becomes difficult, raising problems of production suitability. If the content is too small, a curing force at the time of exposure becomes insufficient.

(4) Photopolymerization Initiator or Photopolymerization Initiator Series

Examples of the photopolymerization initiator or the photopolymerization initiator series (in the present specification, the term "photo-polymerization initiator series" means a polymerization initiating mixture that exhibits a function of photo-polymerization initiation with a plurality of compounds combined with each other or a polymerization initiating composition of compounds having the ability to initiate photopolymerization) that can be contained in the colored photosensitive resin composition of the present invention include vicinal polyketaldonyl compounds disclosed in U.S. Pat. No. 2,367,660, acyloin ether compounds described in U.S. Pat. No. 2,448,828, aromatic acyloin compounds substituted by an α-hydrocarbon described in U.S. Pat. No. 2,722,512, polynuclear quinone compounds described in U.S. Pat. No. 3,046,127 and U.S. Pat. No. 2,951,758, combinations of triarylimidazole dimer and p-aminoketone described in U.S. Pat. No. 3,549,367, benzothiazole compounds and trihalomethyl-s-triazine compounds described in JP-B-51-48516, trihalomethyl-triazine compounds described in U.S. Pat. No. 4,239,850, and trihalomethyloxadiazole compounds described in U.S. Pat. No. 4,212,976. In particular, trihalomethyl-s-triazine, trihalomethyloxadiazole, and triarylimidazole dimer are preferable.

In addition, "polymerization initiator C" described in JP-A-11-133600, and oximes such as 1-phenyl-1,2-propanedion-2-(o-ethoxycarbonyl)oxime, O-benzoyl-4'-(benzmercapto)benzoyl-hexyl-ketoxime, 2,4,6-trimethylphenylcarbonyl-diphenylphosphonyloxide, and hexafluorophosphoro-trialkylphenyl phosphonium salts can also be mentioned as preferable examples.

These photopolymerization initiators and photopolymerization initiator series each may be used singly. Alternatively, a mixture of two or more selected from these photopolymerizable initiators and photopolymerization initiator series may be used. In particular, it is preferable to use two or more kinds of photopolymerizable initiators and photopolymerization initiator series. When two or more kinds of photopolymerizable initiators and photopolymerization initiator series are used, the display property, particularly evenness of display, can be improved.

As to the content of the photo-polymerization initiator and the photo-polymerization initiator series, the content thereof is generally from 0.5 to 20 mass %, preferably from 1 to 15 mass %, based on the total solid content of the colored photosensitive resin composition. If the amount of the initiator or the initiator series is too large, exposure sensitivity becomes too high, which causes difficulty in control. If the amount of the initiator or the initiator series is too small, exposure sensitivity becomes too low.

(Other Additives)

[Solvent]

In addition to the above-described components, an organic solvent may further be used in the colored photosensitive resin composition of the present invention. There is no limitation as to the organic solvent. Examples of the organic solvent include esters, such as ethyl acetate, n-butyl acetate, isobutyl acetate, amyl formate, isoamyl acetate, isobutyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, alkyl 3-oxypropionate compound (e.g. methyl 3-oxypropionate and ethyl 3-oxypropionate), methyl 3-methoxypropionate, ethyl 3-methoxypropionate, methyl 3-ethoxypropionate, ethyl 3-ethoxypropionate; methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutanoate, and ethyl 2-oxobutanoate; ethers, such as diethylene glycol dimethyl ether, tetrahydrofuran, ethylene glycol monomethyl ether, ethylene glycol monoethyl ether, methylcellosolve acetate, ethylcellosolve acetate, diethylene glycol monomethyl ether, and propylene glycol methyl ether acetate; ketones, such as methyl ethyl ketone, methyl isobutyl ketone, cyclohexanone, cyclohexanol, 2-heptanone, and 3-heptanone; and aromatic hydrocarbons, such as toluene and xylene. Among these solvents, as the solvent to be used in the present invention, methyl 3-ethoxypropionate, ethyl 3-ethoxypropionate, ethyl cellosolve acetate, ethyl lactate, butyl acetate, methyl 3-methoxypropionate, 2-heptanone, cyclohexanone, ethyl carbitol acetate, butyl carbitol acetate, propylene glycol methyl ether acetate and the like are preferable. These solvents may be used singly or in combination of two or more thereof.

Further, if necessary, a solvent having a boiling point of from 180° C. to 250° C. may be used. Examples of the high boiling solvent include diethyleneglycol monobutylether, diethyleneglycol monoethyletheracetate, diethyleneglycol monoethylether, 3,5,5-trimethyl-2-cyclohexene-1-on, butyl lactate, dipropyleneglycol monomethyletheracetate, propyleneglycol monomethyletheracetate, propyleneglycol diacetate, propyleneglycol-n-propyletheracetate, diethyleneglycol diethylether, 2-ethylhexylacetate, 3-methoxy-3-methylbutylacetate, γ-butyllactone, tripropyleneglycol methyl ethylacetate, dipropyleneglycol n-butylacetate, propyleneglycol phenyletheracetate, and 1,3-butanediol diacetate.

The content of the solvent is preferably 10 to 95 mass %, to the total content of the resin composition.

[Surfactant]

Conventionally used color filters had a problem that the color of each pixel was deep in order to realize a high color purity, whereby unevenness of the film thickness of pixels was directly recognized as color unevenness. For this reason, it has been desired to suppress the film thickness change, which directly influences the film thickness of pixels, during the process of forming (applying) the photosensitive resin layer.

In the color filter of the present invention or the photosensitive resin transfer material of the present invention, the colored photosensitive resin composition preferably comprises a suitable surfactant from the viewpoint of achieving a uniform film thickness and of prevention of uneven coating (color unevenness caused by change in the film thickness) effectively.

Preferable examples of the surfactant include surfactants disclosed in JP-A-2003-337424 and JP-A-11-133600. The content of the surfactant is preferably 5 mass % or less based on the total content of the resin composition.

[Thermal Polymerization Inhibitor]

It is preferred that the colored photosensitive resin composition of the present invention includes a thermal polymerization inhibitor. Examples of the thermal polymerization inhibitor include hydroquinone, hydroquinone monomethyl ether, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), 2-mercaptobenzimidazole, and phenothiazine. The content of the thermal polymerization inhibitor is preferably 1 mass % or less based on the total amount of the resin composition.

[Dye and Pigment to be Used Supplementarily]

If necessary, in addition to the aforementioned coloring agent (pigment), other coloring agents (dyes or pigments) may be added to the colored photosensitive resin composition of the present invention. When the coloring agent is a pigment, the pigment is preferably dispersed in the colored photosensitive resin composition uniformly; therefore, the particle diameter of such a pigment is preferably 0.1 μm or smaller, more preferably 0.08 μm or smaller.

Examples of the dye and pigment include the colorants disclosed in paragraph Nos. [0038] to [0040] of JP-A-2005-17716, pigments disclosed in paragraph Nos. [0068] to [0072] of JP-A-2005-361447, and coloring agents disclosed in paragraph Nos. [0080] to [0088] of JP-A-2005-17521. The content of dyes or pigments to be used supplementarily is preferably 5 mass % or less based on the total content of the resin composition.

[Ultraviolet Absorber]

If necessary, the colored photosensitive resin composition of the present invention may include an ultraviolet absorber. Examples of the ultraviolet absorber include compounds disclosed in JP-A-5-72724, a salicylate-based ultraviolet absorber, a benzophenone-based ultraviolet absorber, a benzotriazole-based ultraviolet absorber, a cyanoacrylate-based ultraviolet absorber, a nickel-chelate-based ultraviolet absorber, and a hindered-amine-based ultraviolet absorber.

Specific examples thereof include phenyl salicylate, 4-t-butyl phenylsalicylate, 2,4-di-t-butyl phenyl-3',5'-di-t-4'-hydroxybenzoate, 4-t-butyl phenylsalicylate, 2,4-dihydroxybenzophenone, 2-hydroxy-4-methoxybenzophenone, 2-hydroxy-4-n-octoxybenzophenone, 2-(2'-hydroxy-5'-methylphenyl)benzotriazole, 2-(2'-hydroxy-3'-t-butyl-5'-methylphenyl)-5-chlorobenzotriazole, ethyl-2-cyano-3,3-diphenyl acrylate, 2,2'-hydroxy-4-methoxybenzophenone, nickel dibutyl dithiocarbamate, bis(2,2,6,6-tetramethyl-4-pyridine)-sebacate, 4-t-butyl phenylsalicylate, phenyl salicylate, 4-hydroxy-2,2,6,6-tetramethylpiperidine condensate, succinic acid-bis(2,2,6,6-tetramethyl-4-piperidenyl)-ester, 2-[2-hydroxy-3,5-bis(α,α-dimethylbenzyl)phenyl]-2H-benzotriazole, and 7-{[4-chloro-6-(diethylamino)-5-triazine-2-yl]amino}-3-phenylcoumarin. The content of the ultraviolet absorber is preferably 5 mass % or less based on the total amount of the resin composition.

In addition to the aforementioned additives, the colored photosensitive resin composition of the present invention may further include an "adhesion auxiliary" described in JP-A No. 11-133600 and other additives.

<Coating Film of the Colored Photosensitive Resin Composition>

The components of the coating film produced with the colored photosensitive resin composition of the present invention are the same as described above in the "Colored photosensitive resin composition" section. The thickness of the coating film may be properly determined. However, the thickness is preferably in the range of from 0.5 μm to 5.0 μm, and more preferably from 1.0 μm to 3.0 μm. In the coating film formed using the colored photosensitive resin composition of the present invention, a polymerized coating of the colored photosensitive resin composition may be formed by polymerizing the (3) monomer or oligomer incorporated in the composition, thereby to prepare a color filter having the thus-formed polymerized coating. (A preparation of the color filter will be described later.) Polymerization of the polymerizable monomer or polymerizable oligomer may be performed by causing the (4) photo-polymerization initiator or photo-polymerization initiator series to act by irradiation of light.

(Slit Nozzle)

The aforementioned coating film can be formed by coating the colored photosensitive resin composition by a general coating method, followed by drying. In the present invention, it is preferred that the colored photosensitive resin composition be coated by using a slit nozzle having a slit at a portion through which the coating liquid is discharged. Specifically, slit nozzles and slit coaters described in JP-A-2004-89851, JP-A-2004-17043, JP-A-2003-170098, JP-A-2003-164787, JP-A-2003-10767, JP-A-2002-79163, and JP-A-2001-310147 are preferably used.

As a method of coating the colored photosensitive resin composition on a substrate, a spin coating is excellent in such the point that a thin film of 1 μm to 3 μm can be uniformly coated with high precision. Therefore, the spin coating can be widely and generally used for preparation of color filters. In recent yeas, however, it is required to further improve production efficiency and production cost in accordance with inclination to large-sized liquid crystal display devices and mass production thereof. Therefore, the slit coating, which is more suited for coating on a wide and large area substrate than the spin coating, has been adopted in production of color filters. Besides, the slit coating is superior to the spin coating from the viewpoint of saving of liquid to be used; and the slit coating can obtain a uniform coating from a lesser coating amount.

The slit coating is a coating method characterized by the steps of using a coating head having a slit (gap) of a width of several ten microns at a tip and having a length corresponding to the coating width of a rectangular substrate, and moving the substrate and/or the coating head at a definite relative speed, while maintaining a clearance (gap) between the substrate and the coating head at a distance of from several ten microns to several hundred microns, and coating on the substrate a coating liquid fed from the slit in a predetermined discharge amount. The slit coating has such advantages as follows: (1) a liquid loss is less than a spin coating; (2) a workload at the time of conducting a wash processing is reduced because no coating liquid would be spattered; (3) no contamination (re-inclusion) owing to the spattered liquid component to a coating film would be caused; (4) a tact time is shortened because no dwell time to start up spinning is necessary; (5) it easily coats a large-sized substrate; and the like. From these advantages, the slit coating is suitable to production of a color filter for a large-sized-screen liquid crystal display device, and the slit coating has been expected as a coating method that is also useful for reduction in a coating amount of the liquid.

A coating film of much larger area can be formed by the slit coating than the spin coating. Therefore, it is necessary to keep a certain degree of relative speed between a coater and a material to be coated at the time when a coating liquid is discharged from a wide slit exit. For this reason, a good fluidity is required to a coating liquid used for the slit coating method. Further, it is particularly required for the slit coating to maintain various conditions of the coating liquid fed from a slit of the coating head to a substrate constant over the entire coating width. If solution physical properties such as fluidity and viscoelastic properties of the coating liquid are insufficient, a coating unevenness easily occurs, so that it becomes difficult to keep a coating thickness constant toward the direction of a coating width. Consequently, the coating unevenness causes such the problem that it is difficult to obtain a uniform coating.

In view of the above, various studies on improvement of fluidity and viscoelastic properties of the coating liquid have been made in order to obtain a uniform coating film with no unevenness. As mentioned above, many means have been proposed such as reduction in molecular weight of a polymer, selection of a polymer excellent in solubility in a solvent, selection from various solvents in order to control an evaporation rate, and application of a surfactant. However, these means were not satisfactory to improve the above-described problems.

<Photosensitive Resin Transfer Material>

Next, the photosensitive resin transfer material of the present invention is described below.

The photosensitive resin transfer material of the present invention is preferably formed by using the photosensitive resin transfer material as described in JP-A-5-72724, that is a composite film. The structure of the composite film may be, for example, a lamination in which a temporary support, a thermoplastic resin layer, an intermediate layer, a photosensitive resin layer, and a protective film are disposed in this order. The photosensitive resin transfer material according to the present invention is a material having a photosensitive resin layer provided by using the above-described colored photosensitive resin composition of the present invention.

(Temporary Support)

In the photosensitive resin transfer material of the present invention, it is preferable that the temporary support has flexibility and does not remarkably deform, shrink, or elongate even under pressure or under pressure and heat. Examples of such a temporary support include a polyethylene terephthalate film, a cellulose triacetate film, a polystyrene film, and a polycarbonate film. Among them, a biaxially-stretched polyethylene terephthalate film is particularly preferable.

(Thermoplastic Resin Layer)

The component used in the thermoplastic resin layer is preferably an organic polymer substance described in JP-A-5-72724. The substance can be preferably selected from organic polymer substances having a softening point of about 80° C. or lower according to the Vicat method (specifically, the method of measuring a polymer softening point according to American Material Test Method ASTMD 1235). Specifically, the substance may be an organic polymer, and examples thereof include: a polyolefin such as polyethylene or polypropylene; an ethylene copolymer such as a copolymer of ethylene and vinyl acetate or a saponified product thereof; a copolymer of ethylene and acrylic acid ester or a saponified product thereof; polyvinyl chloride; a vinyl chloride copolymer such as a copolymer of vinyl chloride and vinyl acetate or a saponified product thereof; polyvinylidene chloride; a vinylidene chloride copolymer; polystyrene; a styrene copolymer such as a copolymer of styrene and (meth)acrylic acid ester or a saponified product thereof; polyvinyl toluene; a vinyltoluene copolymer such as a copolymer of vinyltoluene and (meth)acrylic acid ester or a saponified product thereof; poly(meth)acrylic acid ester; a (meth)acrylic acid ester copolymer such as a copolymer of butyl (meth)acrylate and vinyl acetate; and a polyamide resin such as a vinyl acetate copolymer nylon, a copolymerized nylon, N-alkoxymethylated nylon, and N-dimethylaminated nylon.

(Intermediate Layer)

In the photosensitive resin transfer material of in the present invention, it is preferable to provide an intermediate layer so as to prevent mixing of components during application of a plurality of coating layers and during storage after the application. The intermediate layer is preferably an oxygen blocking film having oxygen blocking function described as "a separating layer" in JP-A-5-72724. By using such an oxygen blocking film, the exposure sensitivity is heightened, the time load of the exposing machine is decreased, and the productivity is improved.

The oxygen blocking film is preferably a film with a low oxygen permeability and is dispersible or soluble in water or an aqueous alkaline solution. Such a film may be properly selected from ordinary oxygen blocking films. Among them, a combination of polyvinyl alcohol and polyvinylpyrrolidone is particularly preferable.

(Protective Film)

It is preferable to provide a thin protective film on a photosensitive resin layer in order to protect the photosensitive resin layer from pollution or damage at storage. The protective film may comprise a material which is the same as or similar to that of the temporary support, but the protective film should be easily separated from the photosensitive resin layer. The protective film material may be, for example, silicone paper, polyolefin sheet or polytetrafluoroethylene sheet.

(Method of Producing of the Photosensitive Resin Transfer Material)

The photosensitive resin transfer material of the present invention can be prepared by: coating a temporary support with a coating liquid (coating liquid for thermoplastic resin layer) in which additives for a thermoplastic resin layer are dissolved and drying the coating liquid to form a thermoplastic resin layer; and then coating the thermoplastic resin layer with a coating liquid for intermediate layer containing a solvent which does not dissolve the thermoplastic resin layer, and drying the coating liquid for intermediate layer; and then, coating the intermediate layer with a coating liquid for photosensitive resin layer containing a solvent which does not dissolve the intermediate layer, and drying the coating liquid for photosensitive resin layer, to form a photosensitive resin layer composed of the colored photosensitive resin composition of the present invention.

Alternatively, the photosensitive resin transfer material may be prepared by: preparing a sheet in which a thermoplastic resin layer and an intermediate layer are disposed on the aforementioned temporary support, and a sheet in which a photosensitive resin layer is disposed on a protective film, and adhering the sheets to each other such that the intermediate layer and the photosensitive resin layer contact each other. The photosensitive resin transfer material may also be prepared by: preparing a sheet in which a thermoplastic resin layer is disposed on the aforementioned temporary support, and a sheet in which a photosensitive resin layer and an intermediate layer are disposed on a protective film, and adhering the sheets to each other such that the thermoplastic resin layer and the intermediate layer contact each other.

In the photosensitive resin transfer material of the present invention, the thickness of the photosensitive resin layer is preferably 1.0 to 5.0 µm, more preferably 1.0 to 4.0 µm, and particularly preferably 1.0 to 3.0 µm. The thicknesses of respective layers are not limited to the above ranges. In general, the thickness of the temporary support is preferably 15 to 100 µm, the thickness of the thermoplastic resin layer is preferably 2 to 30 µm, the thickness of the intermediate layer is preferably 0.5 to 3.0 µm, and the thickness of the protective film is preferably 4 to 40 µm.

The coating operation in the production method above may be carried out, for example, with a common coating apparatus. However, in the present invention, it is preferably performed with a coating apparatus (slit coater) having a slit nozzle, as explained in the previous section of [Coating film of colored photosensitive resin composition]. Preferable examples of the slit coater are as described above.

<Color Filter and Producing Method of Color Filter>

The color filter of the present invention is excellent in contrast. The term "contrast" used in the present specification means a ratio of the amount of transmitted light when polarization axes are parallel to the amount of transmitted light when polarization axes are perpendicular, with respect to a color filter placed between two polarizing plates (see, for example, The 7th Color Optics Conference 1990; Color Filter for 512-color 10.4"-size TFT-LCD; Ueki, Koseki, Fukunaga, Yamanaka).

The color filter having a high contrast enables enlarging a discrimination of brightness at the time when the color filter is combined with a liquid crystal. Therefore, the high contrast is a very important performance in enhancing replacement of CRTs by liquid crystal display devices. The contrast of the color filter according to the present invention is, if it is a monochromatic type, preferably 3,000 or more, more preferably 5,000 or more, and especially preferably 7,000 or more.

With respect to a color filter having R pixel, G pixel, and B pixel, and, if necessary, further provided with a black matrix, the contrast is preferably 3,000 or more, more preferably 5,000 or more, and especially preferably 6,000 or more. The present invention is characterized in that such a high contrast can be realized thereby.

In the case where the color filter of the present invention is used as a color filter for a television monitor, the difference ($\Delta E$) between the chromaticity of the red (R) photosensitive resin layer measured under a F10 light source and the target chromaticity for red shown in the following table, the difference ($\Delta E$) between the chromaticity of the green (G) photosensitive resin layer measured under a F10 light source and the target chromaticity for green shown in the following table, the difference ($\Delta E$) between the chromaticity of the blue (B) photosensitive resin layer measured under a F10 light source and the target chromaticity for blue shown in the following table, are each preferably 5 or less, more preferably 3 or less, still more preferably 2 or less.

|   | x | y | Y |
|---|---|---|---|
| R | 0.656 | 0.336 | 21.4 |
| G | 0.293 | 0.634 | 52.1 |
| B | 0.146 | 0.088 | 6.90 |

Herein, chromaticity in the present invention is measured by a microscopic spectrophotometer (OSP100 or 200, manufactured by Olympus Optics) and expressed in terms of xyY values of the xyz color system obtained by calculation as a result under an F10-light source at 2-degree viewing angle. In addition, the difference from the target chromaticity is expressed in terms of a color difference of a La*b* color system.

(Photosensitive Resin Layer)

The color filter of the present invention can be produced by, for example, a method of repeating, until the layers of the respective colors are provided, the process comprising: forming a photosensitive resin layer on a substrate; and exposing and developing the photosensitive resin layer. Black matrix may be introduced so as to partition the boundaries of the photosensitive resin layers, in accordance with the necessity.

In the above production method, formation of the photosensitive resin layer on a substrate may be conducted, for example, by (a) applying the respective colored photosensitive resin compositions by an ordinary coating device or by (b) using the aforementioned photosensitive resin transfer material so as to adhere the photosensitive resin layer by a laminator.

(a) Coating by Coating Device

The colored photosensitive resin composition in production of the color filter according to the present invention, may be coated for example with a common coating apparatus, but in the present invention, it is preferably performed with a slit coater as described in the previous section of [Coating film of colored photosensitive resin composition]. Preferable examples of the slit coater are as described above. When the photosensitive resin layer is formed by coating, its film thickness is preferably 1.0 to 3.0 µm, more preferably 1.0 to 2.5 µm, and still more preferably 1.5 to 2.5 µm.

(b) Adhering by a Laminator

Using the above-described photosensitive resin transfer material of the present invention, the photosensitive resin layer formed into a film shape may be adhered to the substrate explained below by a heated and/or pressurized roller or flat plate by pressure adhesion or heat pressure adhesion. Specifically, laminators and laminating methods described in the following documents may be used: JP-A-7-110575, JP-A-11-77942, JP-A-2000-334836, and JP-A-2002-148794. From the viewpoint of suppression of contamination by foreign substances, it is preferable to use the method described in JP-A-7-110575. The preferred thickness of the film, when forming a photosensitive resin layer with the photosensitive resin transfer material according to the present invention, is the same as the thickness described in the section of <photosensitive resin transfer material>.

(Substrate)

In the present invention, the substrate on which a color filter is to be formed may be, for example, a transparent substrate, and examples thereof include known glass plates such as a soda glass plate having a silicon oxide film on its surface, a low-expansion glass, a non-alkali glass, and a quartz glass plate, and a plastic film.

By subjecting the substrate to a coupling treatment in advance, adhesion of the substrate to the colored photosensitive resin composition or the photosensitive resin transfer material can be improved. The method described in JP-A-2000-39033 is preferable as the coupling treatment. The thickness of the substrate is not particularly limited, and is preferably 700 to 1,200 μm in general, and more 500 to 1,100 μm.

(Oxygen Blocking Film)

In the color filter of the present invention, when the photosensitive resin layer is formed by application of the colored photosensitive resin composition, an oxygen blocking film may further be provided on the photosensitive resin layer, whereby the exposure sensitivity can be improved. Examples of the oxygen blocking film include the same ones as already mentioned in the description about the item of (Interlayer) of the [Photosensitive resin transfer material]. The thickness of the oxygen blocking film is not particularly limited, and the thickness is preferably 0.5 to 3.0 μm in general.

(Exposure and Development)

The color filter of the present invention can be obtained by repeating, until the resin layers of the respective colors are provided, the process comprising: arranging a predetermined mask over a photosensitive resin layer formed on a substrate; exposing the photosensitive resin layer to light from above the mask which has passed through the mask, the thermoplastic resin layer, and the intermediate layer, and then developing the photosensitive resin layer with a developer.

The light source for the exposure can be suitably selected from light sources capable of emitting lights within the wavelength region capable of curing the photosensitive resin layer (e.g. 365 mm, 405 nm, etc.). Specific examples thereof include an ultrahigh-pressure mercury lamp, a high-pressure mercury lamp, and a metal halide lamp. The exposure amount is usually about 5 to 200 mJ/cm$^2$, and preferably about 10 to 100 mJ/cm$^2$.

The developer is not particularly limited and may be an ordinary developer such as the developer described in JP-A-5-72724. The developer is preferably a developer of a type which dissolves a photosensitive resin layer; for example, a developer containing a compound with a pKa of 7 to 13 at a concentration of 0.05 to 5 mol/L is preferable. The developer may include a small amount of an organic solvent miscible with water.

Examples of the organic solvent miscible with water include methanol, ethanol, 2-propanol, 1-propanol, butanol, diacetonealcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethylformamide, dimethylacetamide, hexamethylphosphoramide, ethyl lactate, methyl lactate, ε-caprolactam, and N-methylpyrrolidone. The concentration of the organic solvent is preferably 0.1 mass % to 30 mass %.

An ordinary surfactant may be further added to the developer. The concentration of the surfactant is preferably 0.01 mass % to 10 mass %.

The developing method may be an ordinary method such as paddle development, shower development, shower & spin development, or dip development.

Herein, the shower development will be explained. In the shower development, the developer is sprayed onto the exposed photosensitive resin layer with a shower, so that the uncured portion is removed. It is preferable to spray an alkaline solution having poor ability to dissolve the photosensitive resin layer by using a shower or the like before development, so as to remove the thermoplastic resin layer, the intermediate layer and the like. Further, after development, it is preferable to spray a cleaner or the like by using a shower while rubbing the surface with a brush or the like to remove the development residue.

The liquid temperature of the developer is preferably 20° C. to 40° C., and the pH of the developer is preferably 8 to 13.

In an embodiment of the present invention, at the time of the production of the color filter of the present invention, the colored photosensitive resin composition for forming a color filter are stacked to form a base, a transparent electrode is formed thereon, and protrusions for split-orientation is further provided thereon to form a spacer, as described in JP-A-1-248921 and Japanese Patent No. 3255107. This embodiment is preferable from the viewpoint of cost reduction.

When the colored photosensitive resin compositions are stacked by successive coating operations, the film thickness becomes smaller in every overlaying owing to the leveling of the coating liquid. For this reason, it is preferable to stack the four colors of K (black), R, G, and B and to provide protrusions for split-orientation thereon. On the other hand, when the transfer material having a thermoplastic resin layer is used, it is preferable to stack two or three colors since the thicknesses are maintained constant.

In order to prevent deformation of the photosensitive resin layer upon lamination by overlaying the transfer material and to maintain a constant thickness, the size of the base is preferably 25 μm×25 μm or larger, more preferably 30 μm×30 μm or larger.

<Liquid Crystal Display Device>

The liquid crystal display device of the present invention is excellent in definition such as black depth owing to the use of the color filter that is excellent in contrast according to the present invention. The liquid crystal display device of the present invention can be suitably used also as a large screen liquid crystal display device such as a display for a notebook computer and a television monitor.

According to the method of producing fine particles of an anthraquinone structure-containing pigment of the present invention, it is possible to produce nanometer-sized fine particles of an anthraquinone structure-containing pigment that have a sharp particle size distribution. Further, when the fine particles of an anthraquinone structure-containing pigment produced by the producing method of the present invention are used to form a color filter, the resulting color filter having both desired color hue or color purity, and high contrast, can be obtained, and the resulting color filter has a high level of light fastness so that it can maintain high display performance even after long term use.

In addition, the color filter comprising the fine particles of an anthraquinone structure-containing pigment, and the liquid crystal display device equipped with the color filter, have high performance to produce red and sharp black and are highly effective in reducing display unevenness.

The present invention will be described in more detail based on examples given below, but the invention is not meant to be limited by these.

EXAMPLES

Example 1

Preparation of Concentrated Pigment Liquid 3.3 ml of a 28% solution of sodium methoxide in methanol, 6,000 mg of a pigment (Pigment Red 254), 6,000 mg of polyvinyl pyrrolidone, and 600 mg of a pigment dispersing agent A (the above exemplified compound (7.)) were added to 100 ml of dimethyl sulfoxide, to prepare a pigment solution A. The pigment dispersing agent A was synthesized according to the method described in JP-A-2000-239554.

Separately, 1,000 ml of water containing 4.3 ml of 1-mol/l hydrochloric acid was prepared as a poor solvent.

200 ml of the pigment solution A was fed using an NP-KX-500 large-volume nonpulsating pump manufactured by Nihon Seimitsu Kagaku Co., Ltd., at a flow rate of 50 ml/min into 1,000 ml of the poor solvent controlled to a temperature of 1° C. and being stirred at 500 rpm by a GK-0222-10 Ramond stirrer manufactured by Fujisawa Pharmaceutical Co., Ltd., thereby forming nanopigment particles, to give a pigment dispersion A. Analysis of the particle diameter and the monodispersion degree of the pigment dispersion A by using Nanotrack UPA-EX150 manufactured by Nikkiso showed a number-average diameter of 26 nm and a Mv/Mn ratio of 1.28.

The prepared pigment dispersion liquid (having a nanopigment concentration of about 0.5 mass %) was added with 500 ml of 2-(1-methoxy)propylacetate, and the whole was stirred at 25° C. for 10 minutes at 500 rpm. After that, the resultant was left standing for 1 day, and a nanopigment was extracted to a 2-(1-methoxy)propylacetate phase, whereby a concentrated extract liquid was obtained.

The concentrated extract liquid containing the extracted nanopigment was filtered by using an FP-010 filter manufactured by SUMITOMO ELECTRIC FINE POLYMER INC., whereby a paste-like concentrated pigment liquid A (having a nanopigment concentration of 35 mass %) was obtained.

[Preparation of Pigment Dispersion Composition]

A pigment dispersion composition A having the following composition was prepared by using the above paste.

| | |
|---|---|
| Paste-like concentrated pigment liquid A described above | 18.3 g |
| Pigment-dispersing agent A | 0.6 g |
| Methacrylic acid/benzyl methacrylate copolymer* | 15.8 g |
| 1-Methoxy-2-propylacetate | 45.3 g |

*Molar ratio 28/72, weight average molecular weight: 30,000, 40 mass % 1-methoxy-2-propylacetate solution The pigment composition having the above composition was dispersed with using zirconia beads of 0.65 mm in diameter, at a peripheral speed of 9 m/s, for 1 hour, using a motor mill M-50 (manufactured by Eigar Japan).

The pigment dispersion compositions A to G were prepared by using the following reagents.

| Reagent | Manufacturer |
|---|---|
| Pigment Red 177 | Ciba Specialty Chemicals company |
| 1-Methyl-2-pyrrolidone | Wako Pure Chemical Industries, Ltd. |
| Dimethylsulfoxide | Wako Pure Chemical Industries, Ltd. |
| 2-(1-Methoxy) propyl acetate | Wako Pure Chemical Industries, Ltd. |
| 1-mol/l hydrochloric acid | Wako Pure Chemical Industries, Ltd. |
| 28% solution of sodium methoxide in methanol | Wako Pure Chemical Industries, Ltd. |
| 8-mol/l Aqueous solution of potassium hydroxide | Wako Pure Chemical Industries, Ltd. |

[Measurement of Contrast]

The pigment dispersion composition A was applied to a glass substrate to give a layer thickness of 2 μm to thereby produce a sample. As a backlight unit, a three-wavelength cold-cathode-tube light source (FWL18EX-N (manufactured by Toshiba Lighting & Technology Corporation)) provided with a diffuser plate was used. The color filter was placed between two sheets of polarizing plates (G1220DUN manufactured by NITTO DENKO CORP.), and then amounts of transmitted light at the time when polarization axes of two polarizing plates were parallel and the time when the polarization axes were perpendicular were measured. The ratio of these transmitted light amounts was defined as a contrast (see *Color Filter for* 512 *color display* 10.4"-*size TFT-LCD*, co-authored by Ueki, Koseki, Fukunaga, and Yamanaka, The seventh Color Optics Conference (1990), etc.). Chromaticity was measured using a color luminance meter (BM-5 manufactured by Topcon Techno House Corporation). The above-described two sheets of polarizing plates, sample, and color luminance meter were placed at the following positions: A polarizing plate was disposed at the distance of 13 mm from the backlight. A cylinder of 11 mm in diameter and 20 mm in length was disposed at the distance of 40 mm to 60 mm from the backlight. The light transmitted through the cylinder was irradiated to a sample to be measured disposed at the distance of 65 mm from the backlight. The transmitted light was passed through another polarizing plate disposed at the distance of 100 mm from the backlight and measured with a color luminance meter disposed at the distance of 400 mm from the backlight. The measuring angle in the color luminance meter was set to 2°. The light amount of the backlight was set so that its brightness (luminance) would be 1280 cd/m$^2$, when the two sheets of polarizing plates were arranged in a position of parallel nicol and no sample was disposed.

The result of measurement of the contrast of the sample produced using the pigment dispersion composition A is shown in Column (a) of Table 9.

The pigment dispersion composition A was mixed with other components into the composition shown in the following Table 1, to give a colored photosensitive resin composition A.

TABLE 1

| Composition components | Content (Unit: mass part(s)) |
|---|---|
| Pigment dispersion composition A | 44.5 |
| Propylene glycol monomethyl ether acetate | 7.6 |
| Methyl ethyl ketone | 37 |
| Binder 1 | 0.7 |

TABLE 1-continued

| Composition components | Content (Unit: mass part(s)) |
|---|---|
| DPHA solution | 3.8 |
| 2-Trichloromethyl-5-(p-styrylstyryl)-1,3,4-oxadiazole | 0.12 |
| 2,4-Bis(trichloromethyl)-6-[4'-(N,N-diethoxycarbonylmethyl)amino-3'-bromophenyl]-s-triazine | 0.05 |
| Phenothiazine | 0.01 |
| Surfactant 1 | 0.06 |

<Binder 1>

| | |
|---|---|
| Polymer (random copolymer of benzyl methacrylate-methacrylic acid-methyl methacrylate (benzyl methacrylate:methacrylic acid:methyl methacrylate = 38/25/37 by mol), molecular weight: 40,000) | 27 mass parts |
| Propylene glycol monomethyl ether acetate | 73 mass parts |

<DPHA Liquid>

| | |
|---|---|
| Dipentaerythritol hexaacrylate (containing 500 ppm of polymerization inhibitor MEHQ; manufactured by Nippon Kayaku Co., Ltd., trade name: KAYARAD DPHA) | 76 mass parts |
| Propylene glycol monomethyl ether acetate | 24 mass parts |

<Surfactant 1>

| | |
|---|---|
| The following compound 1 | 30 mass parts |
| Methyl ethyl ketone | 70 mass parts |

Compound 1

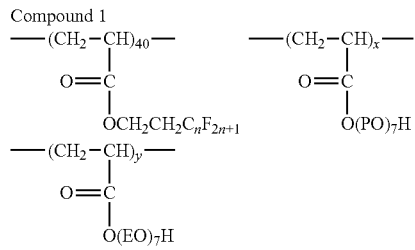

(n = 6, x = 55, y = 5, Mw = 33940, Mw/Mn = 2.55
PO: Propylene oxide, EO: Ethylene oxide)

The colored photosensitive composition for producing a color filter was applied onto a glass substrate by using a spin coater, and the applied composition was dried at 100° C. for 2 minutes, whereby a film having a thickness of about 2 μm was formed. Next, the resultant was exposed to light from an ultra-high pressure mercury lamp in a stream of nitrogen, and was then developed with a 1% aqueous solution of sodium carbonate. The contrast of the R component of the resulting colored photosensitive resin composition film A was measured by the same procedure as described in the [Contrast Measurement] section. The result is shown in Column (b) of Table 9.

[Production of Color Filter (Production by Application Using Slit Nozzle)]

[Formation of Black (K) Image]

A non-alkali glass substrate was washed by a UV washing device, then brush-washed with a cleaner, and then subjected to ultrasonic washing with ultrapure water. The substrate was heat-treated at 120° C. for 3 minutes to stabilize the surface state.

The substrate was cooled and its temperature was adjusted to 23° C. Then, the substrate was coated with a colored photosensitive resin composition K1 having a composition shown in the following Table 2 by a coater for a glass substrate (trade name: MH-1600 manufactured by FAS Asia) having a slit nozzle. Subsequently, a part of the solvent was removed by drying with a VCD (vacuum drying apparatus; manufactured by Tokyo Ohka Kogyo Co., Ltd.) for 30 seconds to eliminate the fluidity of the coating layer, and the glass substrate was pre-baked at 120° C. for 3 minutes to give a photosensitive resin layer K1 having a thickness of 2.4 μm.

TABLE 2

| Composition components K | Content (Unit: mass part(s)) |
|---|---|
| K pigment dispersion 1 (carbon black) | 25 |
| Propylene glycol monomethyl ether acetate | 8.0 |
| Methyl ethyl ketone | 53 |
| Binder 2 | 9.1 |
| Hydroquinone monomethyl ether | 0.002 |
| DPHA liquid | 4.2 |
| 2,4-Bis(trichloromethyl)-6-[4-(N,N-diethoxycarbonylmethyl)amino-3-bromophenyl]-s-triazine | 0.16 |
| Surfactant 1 | 0.044 |

Using a proximity-type exposure machine having a ultrahigh pressure mercury lump (manufactured by Hitachi High-Tech Electronics Engineering Co., Ltd.), the substrate was pattern-exposed at an exposure of 300 mJ/cm$^2$ with a distance of 200 μm between the photosensitive resin layer and the surface of an exposing mask (quartz exposure mask having an image pattern) while allowing the substrate and the mask to stand straight.

Then, pure water was sprayed through a shower nozzle to uniformly moisten the surface of the photosensitive resin layer K1, and shower developing was performed at 23° C. for 80 seconds with a KOH-based developer (obtained by diluting CDK-1 (trade name) containing KOH and a nonionic surfactant, manufactured by Fuji Film Electronic Materials Co., Ltd., by 1/100) at a flat nozzle pressure of 0.04 MPa to obtain a patterning image. Subsequently, ultrapure water was sprayed through an ultrahigh pressure washing nozzle at a pressure of 9.8 MPa to remove the residue, to obtain a black (K) image K. Subsequently, the substrate having the black image thereon was heat-treated at 220° C. for 30 minutes.

[Formation of Red (R) Pixels]

Using a colored photosensitive resin composition R1 having a composition described in Table 3 below, heat-treated R pixels were formed on the substrate having the K image formed thereon, in the same manner as the formation of the black (K) image. The thickness of the photosensitive resin layer R1, and the coating amount of the pigment (C.I.P.R.177) are shown below.

| | |
|---|---|
| Thickness of the photosensitive resin layer (μm) | 1.60 |
| Coating amount of the pigment (g/m$^2$) | 1.00 |
| Coating amount of C.I.P.R.177 (g/m$^2$) | 1.00 |

TABLE 3

| Composition components | Content (Unit: mass part(s)) |
|---|---|
| R-pigment dispersion A | 44.5 |
| Propylene glycol monomethyl ether acetate | 7.6 |
| Methyl ethyl ketone | 37 |
| Binder 1 | 0.7 |
| DPHA solution | 3.8 |
| 2-Trichloromethyl-5-(p-styrylstyryl)-1,3,4-oxadiazole | 0.12 |
| 2,4-Bis(trichloromethyl)-6-[4-(N,N-diethoxycarbonylmethyl)amino-3-bromophenyl]-s-triazine | 0.05 |
| Phenothiazine | 0.01 |
| Surfactant 1 | 0.06 |

[Formation of Green (G) Pixels]

Using a colored photosensitive resin composition G1 having a composition described in Table 4 below, heat treated G pixels were formed on the substrate having the K image and R pixels formed thereon, in the same manner as the formation of the black (K) image. The thickness of the photosensitive resin layer G1, and the coating amounts of the pigments (C.I.P.G.36 and C.I.P.Y.150) are shown below.

| | |
|---|---|
| Thickness of the photosensitive resin layer (μm) | 1.60 |
| Coating amount of the pigments (g/m$^2$) | 1.92 |
| Coating amount of C.I.P.G.36 (g/m$^2$) | 1.34 |
| Coating amount of C.I.P.Y.150 (g/m$^2$) | 0.58 |

TABLE 4

| Composition components | Content (Unit: mass part(s)) |
|---|---|
| G pigment dispersion 1 (C.I.P.G. 36) | 28 |
| Y pigment dispersion 1 (C.I.P.Y. 150) | 15 |
| Propylene glycol monomethyl ether acetate | 29 |
| Methyl ethyl ketone | 26 |
| Cyclohexanone | 1.3 |
| Binder 2 | 2.5 |
| DPHA liquid | 3.5 |
| 2-Trichloromethyl-5-(p-styrylstyryl)1,3,4-oxadiazole | 0.12 |
| 2,4-Bis(trichloromethyl)-6-[4-(N,N-diethoxycarbonylmethyl)amino-3-bromophenyl]-s-triazine | 0.05 |
| Phenothiazine | 0.01 |
| Surfactant 1 | 0.07 |

[Formation of Blue (B) Pixels]

Using a colored photosensitive resin composition B1 having a composition described in Table 5 below, heat-treated B pixels were formed on the substrate having the K image, the R pixels, and the G pixels formed thereon, in the same manner as the formation of the black (K) image, so that a desired color filter A was obtained. The thickness of the photosensitive resin layer B1, and the coating amounts of the pigments (C.I.P.B.15:6 and C.I.P.V.23) are shown below.

| | |
|---|---|
| Thickness of the photosensitive resin layer (μm) | 1.60 |
| Coating amount of the pigments (g/m$^2$) | 0.75 |
| Coating amount of C.I.P.B.15:6 (g/m$^2$) | 0.705 |
| Coating amount of C.I.P.V.23 (g/m$^2$) | 0.045 |

TABLE 5

| Composition components | Content (Unit: mass part(s)) |
|---|---|
| B pigment dispersion 1 (C.I.P.B.15:6) | 8.6 |
| B pigment dispersion 2 (C.I.P.B.15:6 + C.I.P.V.23) | 15 |
| Propylene glycol monomethyl ether acetate | 28 |
| Methyl ethyl ketone | 26 |
| Binder 3 | 17 |
| DPHA liquid | 4.0 |
| 2-Trichloromethyl-5-(p-styrylstyryl)-1,3,4-oxadiazole | 0.17 |
| Phenothiazine | 0.02 |
| Surfactant 1 | 0.06 |

Herein, preparation of the colored photosensitive resin compositions K1, R1, G1 and B1 described in the above Tables 2 to 5 will be explained.

The colored photosensitive resin composition K1 was obtained by: measuring off the K pigment dispersion 1 and propylene glycol monomethyl ether acetate respectively in the amounts shown in Table 2, then mixing them at a temperature of 24° C. (±2° C.) and stirring the mixture at 150 μm for 10 minutes, then measuring off methyl ethyl ketone, the binder 2, hydroquinone monomethyl ether, the DPHA liquid, 2,4-bis(trichloromethyl)-6-[4'-(N,N-bisethoxycarbonylmethyl)amino-3'-bromophenyl]-s-triazine, and the surfactant 1 respectively in the amounts shown in Table 2, then adding them to the above mixture in this order at a temperature of 25° C. (±2° C.), and then stirring the resultant mixture at 150 rpm at a temperature of 40° C. (±2° C.) for 30 minutes.

In the composition shown in Table 2, the K pigment dispersion 1 and the binder 2 each had the following composition.

<K Pigment Dispersion 1>

| | |
|---|---|
| Carbon black (trade name: Nipex 35, manufactured by Degussa, Japan) | 13.1 mass parts |
| Dispersant (compound 2 shown below) | 0.65 mass part |
| Polymer (random copolymer of benzyl methacrylate and methacrylic acid (benzyl methacrylate/methacrylic acid = 72/28 by mol), molecular weight: 37,000) | 6.72 mass parts |
| Propylene glycol monomethyl ether acetate | 79.53 mass parts |

Compound 2

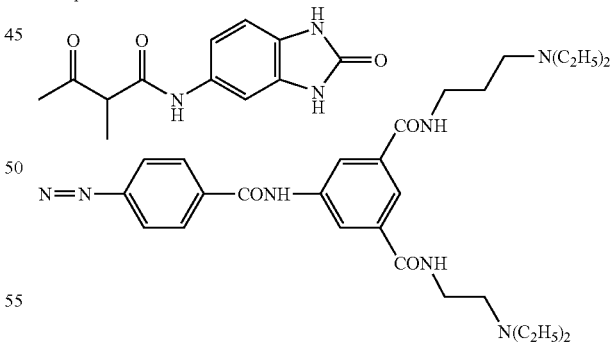

<Binder 2>

| | |
|---|---|
| Polymer (random copolymer of benzyl methacrylate and methacrylic acid (benzyl methacrylate/methacrylic acid = 78/22 by mol), molecular weight: 38,000) | 27 mass parts |
| Propylene glycol monomethyl ether acetate | 73 mass parts |

The colored photosensitive resin composition R1 was obtained by: measuring off the R pigment dispersion A and propylene glycol monomethyl ether acetate respectively in the amounts shown in Table 3, then mixing them at a temperature of 24° C. (±2° C.) and stirring the mixture at 150 rpm for 10 minutes, then measuring off methyl ethyl ketone, the binder 1, the DPHA liquid, 2-trichloromethyl-5-(p-styrylstyryl)-1,3,4-oxadiazole, 2,4-bis(trichlormethyl)-6-[4'-(N,N-bisethoxycarbonylmethyl)amino-3'-bromophenyl]-s-triazine, and phenothiazine respectively in the amounts shown in Table 3, then adding them to the above mixture in this order at a temperature of 24° C. (±2° C.) and then stirring the resultant mixture at 150 rpm for 30 minutes, then measuring off the surfactant 1 in the amount shown in Table 3, then adding the surfactant 1 to the mixture at a temperature of 24° C. (±2° C.), then stirring the resultant mixture at 30 rpm for 5 minutes, and then filtering the mixture with a nylon mesh #200.

Among the compositions shown in Table 3, the R pigment dispersion A was a dispersion obtained in the same manner as the pigment dispersion composition A of Example 1, and was adjusted to include the components in the following amounts (part by mass).

<R Pigment Dispersion A>

| | |
|---|---|
| Paste-like concentrated pigment liquid A (C.I.P.R. 177) | 23 mass parts |
| Dispersant (compound 2 shown above) | 0.8 mass part |
| Polymer (random copolymer of benzyl methacrylate and methacrylic acid (benzyl methacrylate/methacrylic acid = 72/28 by mol), molecular weight: 30,000) | 8 mass parts |
| Propylene glycol monomethyl ether acetate | 68.2 mass parts |

<Binder 1>

| | |
|---|---|
| Polymer (random copolymer of benzyl methacrylate-methacrylic acid-methyl methacrylate (benzyl methacrylate:methacrylic acid:methyl methacrylate = 38/25/37 by mol), molecular weight: 40,000) | 27 mass parts |
| Propylene glycol monomethyl ether acetate | 73 mass parts |

The colored photosensitive resin composition G1 was obtained by measuring off the G pigment dispersion 1, the Y pigment dispersion 1, and propylene glycol monomethyl ether acetate respectively in the amounts shown in Table 4, then mixing them at a temperature of 24° C. (±2° C.) and stirring the mixture at 150 rpm for 10 minutes, then measuring off methyl ethyl ketone, cyclohexanone, the binder 2, the DPHA liquid, 2-trichloromethyl-5-(p-styrylstyryl)-1,3,4-oxadiazole, 2,4-bis(trichloromethyl)-6-[4'-(N,N-bisethoxycarbonylmethyl)amino-3'-bromophenyl]-s-triazine, and phenothiazine respectively in the amounts shown in Table 4, then adding them to the above mixture in this order at a temperature of 24° C. (±2° C.), then stirring the resultant mixture at 150 rpm for 30 minutes, then measuring off the surfactant 1 in the amount shown in Table 4, then adding the surfactant 1 to the mixture at a temperature of 24° C. (±2° C.), then stirring the resultant mixture at 30 rpm for 5 minutes, and then filtering the mixture with a nylon mesh #200.

In the compositions shown in Table 4, as the 0 pigment dispersion 1, "trade name: GT-2" manufactured by Fujifilm Electronic Materials Co., Ltd. was used.

As the Y pigment dispersion 1, "trade name: CF Yellow EX3393" manufactured by Mikuni Shikiso Co., Ltd. was used.

The colored photosensitive resin composition B1 was obtained by: measuring off the B pigment dispersion 1, the B pigment dispersion 2, and propylene glycol monomethyl ether acetate respectively in the amounts shown in Table 5, then mixing them a temperature of 24° C. (±2° C.) and stirring the mixture at 150 rpm for 10 minutes, then measuring off methyl ethyl ketone, the binder 3, the DPHA liquid, 2-trichloromethyl-5-(p-styrylstyryl)-1,3,4-oxadiazole, and phenothiazine respectively in the amounts shown in Table 5, then adding them to the above mixture in this order at a temperature of 25° C. (±2° C.), then stirring the mixture at 150 rpm at a temperature of 40° C. (±2° C.) for 30 minutes, then measuring off the surfactant 1 in the amount shown in Table 5, then adding the surfactant 1 to the mixture at a temperature of 24° C. (±2° C.), then stirring the mixture at 30 rpm for 5 minutes, and then filtering the mixture with a nylon mesh #200.

In the composition shown in Table 5, as the B pigment dispersion 1, "trade name: CF Blue EX3357" manufactured by Mikuni Shikiso Co., Ltd. was used.

As the B pigment dispersion 2, "trade name: CF Blue EX3383" manufactured by Mikuni Shikiso Co, Ltd. was used.

The binder 3 had the following composition.

<Binder 3>

| | |
|---|---|
| Polymer (random copolymer of benzyl methacrylate-methacrylic acid-methyl methacrylate (benzyl methacrylate:methacrylic acid:methyl methacrylate = 36/22/42 by mol), molecular weight: 38,000) | 27 mass parts |
| Propylene glycol monomethyl ether acetate | 73 mass parts |

The contrast of the resulting color filter was measured by the same procedure as described in the [Contrast Measurement] section. The result is shown in Column (c) of Table 9.

[Production of Color Filter (Production by Lamination of Photosensitive Resin Transfer Material)]

[Production of Photosensitive Resin Transfer Material]

A thermoplastic resin layer coating liquid having the following formulation H1 was coated on a polyethylene terephthalate film temporary support with a thickness of 75 μm using a slit nozzle, followed by drying. Then, an intermediate layer coating liquid having the following formulation P1 was coated thereon, and dried. Further, the colored photosensitive resin composition K1 was coated thereon and dried. In this way, a thermoplastic resin layer with a dry film thickness of 14.6 μm, an intermediate layer with a dry film thickness of 1.6 μm, and a photosensitive resin layer with a dry film thickness of 2.4 μm were provided on the temporary support. Further, a protective film polypropylene film with a thickness of 12 μm) was adhered onto the photosensitive resin layer by pressure.

As described above, a photosensitive resin transfer material was produced in which the temporary support, the thermoplastic resin layer, the intermediate layer (oxygen blocking film), and the black (K) photosensitive resin layer were unified, and named photosensitive resin transfer material K1.

<Thermoplastic Resin Layer Coating Liquid H1>

| | |
|---|---|
| Methanol | 11.1 mass parts |
| Propylene glycol monomethyl ether acetate | 6.36 mass parts |
| Methyl ethyl ketone | 52.4 mass parts |
| Methyl methacrylate-(2-ethylhexyl acrylate)-benzyl methacrylate-methacrylic acid copolymer (copolymer composition ratio (mole ratio): Methyl methacrylate/2-ethylhexyl acrylate/benzyl methacrylate/methacrylic acid = 55/11.7/4.5/28.8, molecular weight = 90,000, Tg: about 70° C.) | 5.83 mass parts |
| Styrene-acrylic acid copolymer (copolymerization composition ratio (mole ratio): Styrene/acrylic acid = 63/37, molecular weight = 10,000, Tg: about 100° C.) | 13.6 mass parts |
| Compound obtained by dehydration-condensation of bisphenol A with 2 equivalents of pentaethylene glycol monomethacrylate (2,2-bis[4-methacryloxypolyethoxy)phenyl]propane manufactured by Shin-Nakamura Chemical Co., Ltd.) | 9.1 mass parts |
| Surfactant 1 described above | 0.54 mass part |

<Intermediate Layer Coating Liquid P1>

| | |
|---|---|
| PVA205 (polyvinyl alcohol, manufactured by Kuraray Co., Ltd., saponification degree = 88%, polymerization degree 550) | 32.2 mass parts |
| Polyvinylpyrrolidone (K-30 manufactured by ISP Japan Ltd.) | 14.9 mass parts |
| Distilled water | 524 mass parts |
| Methanol | 429 mass parts |

Photosensitive resin transfer materials R101, G101 and B1101 were produced in the same manner as the production of the photosensitive resin transfer material K1, except that the colored photosensitive resin composition K1 used in production of the photosensitive resin transfer material K1 was replaced respectively by colored photosensitive resin compositions R101, G101 or B101 having the compositions shown in Tables 6 to 8 below. The methods for producing the colored photosensitive resin compositions R101, G101 and B101 were similar to the methods for producing the colored photosensitive resin compositions R1, G1 or B1, respectively.

TABLE 6

<Colored photosensitive resin composition R101>

| Composition components | Content (Unit: mass part(s)) |
|---|---|
| R pigment dispersion A | 44.5 |
| Propylene glycol monomethyl ether acetate | 7.6 |
| Methyl ethyl ketone | 37 |
| Binder 1 | 0.8 |
| DPHA liquid | 4.4 |
| 2-Trichloromethyl-5-(p-styrylstyryl)-1,3,4-oxadiazole | 0.14 |
| 2,4-Bis(trichloromethyl)-6-[4-(N,N-diethoxycarbonylmethyl)amino-3-bromophenyl]-s-triazine | 0.06 |
| Phenothiazine | 0.01 |
| Additive 1 | 0.52 |
| Surfactant 1 | 0.06 |

TABLE 7

<Colored photosensitive resin composition G101>

| Composition components | Content (Unit: mass part(s)) |
|---|---|
| G pigment dispersion 1 (C.I.P.G.36) | 28 |
| Y pigment dispersion 1 (C.I.P.Y.150) | 15 |

TABLE 7-continued

<Colored photosensitive resin composition G101>

| Composition components | Content (Unit: mass part(s)) |
|---|---|
| Propylene glycol monomethyl ether acetate | 29 |
| Methyl ethyl ketone | 26 |
| Cyclohexanone | 1.3 |
| Binder 2 | 3.0 |
| DPHA liquid | 4.3 |
| 2-Trichloromethyl-5-(p-styrylstyryl)-1,3,4-oxadiazole | 0.15 |
| 2,4-Bis(trichloromethyl)-6-[4-(N,N-diethoxycarbonylmethyl)amino-3-bromophenyl]-s-triazine | 0.06 |
| Phenothiazine | 0.01 |
| Surfactant 1 | 0.07 |

TABLE 8

<Colored photosensitive resin composition B101>

| Composition components | Content (Unit: mass part(s)) |
|---|---|
| B pigment dispersion 1 (C.I.P.B.15:6) | 8.6 |
| B pigment dispersion 2 (C.I.P.B.15:6 + C.I.P.V.23) | 15 |
| Propylene glycol monomethyl ether acetate | 28 |
| Methyl ethyl ketone | 26 |
| Binder 3 | 18.5 |
| DPHA liquid | 4.3 |
| 2-Trichloromethyl-5-(p-styrylstyryl)-1,3,4-oxadiazole | 0.17 |
| Phenothiazine | 0.02 |
| Surfactant 1 | 0.06 |

In the compositions shown in Table 6, as the additive 1, a phosphoric-ester-based special surfactant (trade name: HIPLAAD ED152, manufactured by Kusumoto Chemicals Ltd.) was used.

[Formation of Black (K) Image]

A non-alkali glass substrate was washed with a rotating brush having nylon hairs while spraying a glass cleaner liquid regulated at 25° C. by a shower for 20 seconds, then the glass substrate was washed with pure water shower. Thereafter, a silane coupling solution (a 0.3 mass % aqueous solution of N-β(aminoethyl)γ-aminopropyltrimethoxysilane, trade name: KBM603, manufactured by Shin-Etsu Chemical Co., Ltd.) was sprayed for 20 seconds by a shower, and the substrate was washed with a pure water shower. This substrate was heat-treated by a substrate pre-heating apparatus at 100° C. for 2 minutes, and was supplied to the next laminator.

The protective film of the photosensitive resin transfer material K1 was peeled off, and the substrate heated to 100° C. was laminated with the photosensitive resin transfer material K1 at a rubber roller temperature of 130° C., a linear pressure of 100 N/cm, and a conveying rate of 2.2 n/min, using a laminator (Lacmic II type) manufactured by Hitachi Industries Co., Ltd.).

After the temporary support was peeled off at the interface with the thermoplastic resin layer, the photosensitive resin was pattern-exposed by using a proximity-type exposure machine having an ultrahigh pressure mercury lamp (manufactured by Hitachi High-Tech Electronics Engineering Co. Ltd) at an exposure of 70 mJ/cm$^2$ with a distance of 200 μm between the thermoplastic resin layer and the surface of the exposure mask (quartz exposure mask having image pattern), while allowing the substrate and the mask to stand straight.

Then, shower development was performed with a triethanolamine-based developer (containing 30% triethanolamine, T-PD2, trade name, a product of FUJIFILM Corporation, diluted by 1/12 with purified water (or a dilute solution obtained by adding 11 parts of purified water to 1 part T-PD2)) at 30° C. for 50 seconds at a flat nozzle pressure of 0.04 MPa, so that the thermoplastic resin layer and the interlayer were removed.

Subsequently, using a sodium-carbonate-based developer (containing 0.38 mol/l of sodium bicarbonate, 0.47 mol/l of sodium carbonate, and 5% of sodium dibutylnaphthalene-sulfonate, an anionic surfactant, an anti-foaming agent, and a stabilizer, trade name: T-CD1, manufactured by Fuji Photo Film Co., Ltd., diluted by 1/5 with purified water), another shower developing was performed at 29° C. for 30 seconds under a cone-type nozzle pressure of 0.15 MPa, to develop the photosensitive resin layer, so that the patterning image was obtained.

Subsequently, using a cleaner (a dilute solution containing T-SD3, trade name, manufactured by Fuji Photo Film Co., Ltd., diluted by 1/10 with purified water), the residue was removed by a shower and a rotating brush having nylon hairs at 33° C. for 20 seconds under a cone-type nozzle pressure of 0.02 MPa, so that a black (K) image was obtained. Thereafter, after the substrate was subjected to post exposure to light of 500 mJ/cm$^2$ from the resin layer side emitted by an ultrahigh pressure mercury lamp, heat-treatment was performed at 220° C. for 15 minutes.

The substrate having the K image formed thereon was washed with a brush in the same manner as described above, and then washed with pure water shower, and then supplied to a substrate pre-heating apparatus without using a silane coupling liquid.

[Formation of Red (R) Pixels]

Heat-treated red (R) pixels were obtained by using the photosensitive resin transfer material R101, in the same manner as the formation with the photosensitive resin transfer material K1. The exposure was 40 mJ/cm$^2$, and the development with the sodium-carbonate-based developer was performed at 35° C. for 35 seconds. The thickness of the photosensitive layer R101, and the coating amount of the pigment (C.I.P.R.177) are shown below.

| Thickness of the photosensitive resin layer (μm) | 2.00 |
| Coating amount of the pigment (g/m$^2$) | 1.00 |
| Coating amount of C.I.P.R.177 (g/m$^2$) | 1.00 |

The substrate having the K image and the R pixels thereon was washed again with a brush in the same manner as described above, and washed with pure water shower, and supplied to a substrate pre-heating apparatus without using a silane coupling liquid.

[Formation of Green (G) Pixels]

Heat-treated green (G) pixels were obtained by using the photosensitive resin transfer material G101, in the same manner as the formation with the photosensitive resin transfer material R101. The exposure was 40 mJ/cm$^2$, and the development with the sodium-carbonate-based developer was performed at 34° C. for 45 seconds. The thickness of the photosensitive layer G101 and the coating amounts of the pigments (C.I.P.G.36 and C.I.P.Y.150) are shown below.

| Thickness of the photosensitive resin layer (μm) | 2.00 |
| Coating amount of the pigments (g/m$^2$) | 1.92 |
| Coating amount of C.I.P.G.36 (g/m$^2$) | 1.34 |
| Coating amount of C.I.P.Y.150 (g/m$^2$) | 0.58 |

This substrate having the K image, the R pixels, and G pixels thereon was washed again with a brush in the same manner as described above, then washed with pure water shower, then supplied to the substrate pre-heating apparatus without using a silane coupling liquid.

[Formation of Blue (B) Pixels]

Heat-treated blue (B) pixels were obtained by using the photosensitive resin transfer material B101 in the same manner as the formation with the photosensitive resin transfer material R101. The exposure was 30 mJ/cm$^2$, and the development with the sodium-carbonate-based developer was performed at 36° C. for 40 seconds. The thickness of the photosensitive resin layer B101 and the coating amounts of the pigments (C.I.P.B.15:6 and C.I.P.V.23) are shown below.

| Thickness of the photosensitive resin layer (μm) | 2.00 |
| Coating amount of the pigments (g/m$^2$) | 0.75 |
| Coating amount of C.I.P.B.15:6 (g/m$^2$) | 0.705 |
| Coating amount of C.I.P.V.23 (g/m$^2$) | 0.045 |

This substrate having the K image, the R pixels, the G pixels, and the B pixels thereon was baked at 240° C. for 50 minutes to obtain a color filter A1.

The contrast of the resulting color filter was measured by the same procedure as described in the [Contrast Measurement] section. The result is shown in Column (d) of Table 9.

Example 2

A pigment solution B, a pigment dispersion B, a paste-like concentrated pigment liquid B, and a pigment dispersion composition B were prepared in the same manner as in Example 1, except that the pigment dispersing agent B (the exemplified compound (c) shown above) was used in place of the pigment dispersing agent A in the [Preparation of concentrated pigment liquid] of Example 1. The particle size and monodispersity of the pigment dispersion liquid were measured in the course of the process by the same method as in Example 1. As a result, the number average particle size and the Mv/Mn ratio were 26 nm and 1.28, respectively. The pigment dispersing agent B was synthesized according to the method of preparation of the pigment dispersing agent c described in JP-B-5-72943.

A colored photosensitive resin composition film B, a color filter B, a color filter B1, and a liquid crystal display device were also produced in the same manner as in Example 1, and the contrast was measured in the same manner.

Example 3

A pigment solution C, a pigment dispersion C, a paste-like concentrated pigment liquid C, and a pigment dispersion composition C were prepared in the same manner as in Example 1, except that the pigment dispersing agent C (the compound represented by formula (IV)) was used in place of the pigment dispersing agent A in the [Preparation of concentrated pigment liquid] of Example 1. The particle size and monodispersity of the pigment dispersion liquid were measured in the course of the process by the same method as in Example 1. As a result, the number average particle size and the Mv/Mn ratio were 26 nm and 1.28, respectively. The pigment dispersing agent C was synthesized according to the method of Synthesis Example 1 described in JP-A-2001-31885.

A colored photosensitive resin composition film C, a color filter C, a color filter C1, and a liquid crystal display device were also produced in the same manner as in Example 1, and the contrast was measured in the same manner.

Example 4

A pigment solution D, a pigment dispersion D, a paste-like concentrated pigment liquid D, and a pigment dispersion composition D were prepared in the same manner as in Example 1, except that 1-methyl-2-pyrrolidone (popularly called N-methylpyrrolidone or NMP) was used in place of dimethylsulfoxide in the [Preparation of concentrated pigment liquid] of Example 1. The particle size and monodispersity of the pigment dispersion liquid were measured in the course of the process by the same method as in Example 1. As a result, the number average particle size and the Mv/Mn ratio were 28 nm and 1.31, respectively.

A colored photosensitive resin composition film D, a color filter D, a color filter D1, and a liquid crystal display device were also produced in the same manner as in Example 1, and the contrast was measured in the same manner.

Example 5

A pigment solution E, a pigment dispersion E, a paste-like concentrated pigment liquid E, and a pigment dispersion composition E were prepared in the same manner as in Example 4, except that the pigment dispersing agent B was used in place of the pigment dispersing agent A in the [Preparation of concentrated pigment liquid] of Example 4. The particle size and monodispersity of the pigment dispersion liquid were measured in the course of the process by the same method as in Example 4. As a result, the number average particle size and the Mv/Mn ratio were 28 nm and 1.31, respectively.

A colored photosensitive resin composition film E, a color filter E, a color filter E1, and a liquid crystal display device were also produced in the same manner as in Example 4, and the contrast was measured in the same manner.

Example 6

A pigment solution F, a pigment dispersion F, a paste-like concentrated pigment liquid F, and a pigment dispersion composition F were prepared in the same manner as in Example 4, except that the pigment dispersing agent C was used in place of the pigment dispersing agent A in the [Preparation of concentrated pigment liquid] of Example 4. The particle size and monodispersity of the pigment dispersion liquid were measured in the course of the process by the same method as in Example 4. As a result, the number average particle size and the Mv/Mn ratio were 28 nm and 1.31, respectively. The dispersing agent was added in such an amount that the mass of the solid became the same as that in Example 4.

A colored photosensitive resin composition film F, a color filter F, a color filter F1, and a liquid crystal display device were also produced in the same manner as in Example 4, and the contrast was measured in the same manner.

Comparative Example 1

The compounds below were added to a double arm kneader and kneaded at a temperature of 100° C. to 110° C. for 8 hours. The mixture was then poured into 100 parts of an aqueous 1% hydrochloric acid solution at 80° C. and stirred for 1 hour. Thereafter, the mixture was filtered, washed with hot water, dried, and pulverized, so that a pulverized pigment was obtained.

| | |
|---|---|
| Pigment (Pigment Red 177) | 40 mass parts |
| Pulverized sodium chloride | 400 mass parts |
| Diethylene glycol | 80 mass parts |

A pigment dispersion composition G having the composition below was prepared as described below using a bead dispersing machine (the number average particle size and Mv/Mn of the pigment fine particles to be added were 38 nm and 1.66, respectively).

| | |
|---|---|
| The pulverized pigment described above | 6.4 g |
| Pigment-dispersing agent A | 0.6 g |
| Polyvinylpyrrolidone (manufactured by Wako Pure Chemical Industries, Ltd., trade name: K30, molecular weight: 40,000) | 6 g |
| Methacrylic acid/benzyl methacrylate copolymer* | 15.8 g |
| 1-Methoxy-2-propylacetate | 45.3 g |

(*molar ratio 28/72, weight average molecular weight: 30,000, 40 mass % 1-methoxy-2-propylacetate solution)

Into a 1-methoxy-2-propylacetate solution, was charged the pigment dispersing agent A, the above-described pulverized pigment (Pigment Red 177), 6 g of polyvinyl pyrrolidone and a methacrylic acid/benzyl methacrylate copolymer, followed by stirring, to prepare a mixture solution. Then, the mixture was subjected to dispersion treatment for 9 hours by using zirconia beads 0.65 mm in diameter and a Motor Mill M-50 (manufactured by Eiger Japan Co., Ltd.) under a condition that the circumferential velocity was set at 9 m/s.

A colored photosensitive resin composition film G, a color filter G, a color filter G1, and a liquid crystal display device were also produced in the same manner as in Example 1 except that the pigment dispersion composition G was used instead, and the contrast was measured in the same manner.

The results shown in Columns (a) to (d) of Table 9 indicate that each product containing the pigment fine particles produced by the method of producing fine particles of an anthraquinone structure-containing pigment of the present invention produces a high contrast and is superior to the product of Comparative Example 1 (with the pigment dispersion G) produced by a conventional salt milling method. Concerning the results shown in Table 9, the contrast difference between each example of the present invention and the comparative example corresponds to a visually distinguishable difference in the sharpness of black during black display on a general liquid crystal display screen or a visually distinguishable difference in the brightness of red during red display.

[Measurement of Weather Resistance]

The color filters A to G and A1 to G1 were each irradiated with 90 mW/cm$^2$ light from a metal halide lamp for 12 hours. The change in chromaticity (color difference) before and after the irradiation was measured. The results are shown in Columns (e) and (f) of the table. The chromaticity in the present invention was determined by using a microspectrophotometer (OSP100 or 200, manufactured by Olympus Optics), and expressed as values xyY in the xyz color system that were calculated as the result obtained at a visual field angle of 2 degrees to a F 10 light source. The difference in chromaticity was expressed by the color difference in the La*b* color system. The color difference is desirably smaller.

The results shown in Columns (e) and (f) of Table 9 indicate that each color filter according to the present invention has excellent weather resistance as compared with that of the color filter G or G1 of the comparative example. Therefore, it is shown that highly weather-resistant color filters can be produced using the pigment fine particles produced by the production method of the present invention or a dispersion composition thereof. Concerning the results shown in Table 9, a color difference of 2.0 or more can be distinguished by some observers, and the difference in color difference between the product according to the present invention and the product of the comparative example should increase to become significant on a display screen after long term use (for example, after one year or more under general operation conditions).

(Formation of Protrusion for Controlling Orientation of Liquid Crystal)

Using a coating liquid for a positive type photosensitive resin layer described below, a protrusion for controlling orientation of liquid crystal was formed on the ITO transparent electrode formed with the above-described spacer.

Herein, exposure, development, and bake steps were carried out according to the following method.

A proximity-type exposure equipment (manufactured by Hitachi High-Tech Electronics Engineering Co., Ltd.) was set so that a certain photo mask would be located at the distance of 100 μm from the surface of the photosensitive resin layer. A proximity exposure was carried out through the said photo mask in an exposure energy of 150 mJ/cm$^2$ using an ultra-high pressure mercury lamp.

Subsequently, development was conducted by spraying a 2.38% tetramethyl ammonium hydroxide solution on to the substrate at 33° C. for 30 seconds using a shower-type developing apparatus. In this manner, unnecessary portions (exposed portions) of the photosensitive resin layer were removed by development. Thereby, on the substrate at the same side as the color filter, was formed the objective protrusion for controlling orientation of liquid crystal that was made by patterning the photosensitive resin layer into a desired shape.

After that, the substrate for a liquid crystal display device having formed thereon the protrusion for controlling orientation of the liquid crystal was baked under the conditions of 230° C. for 30 minutes. Thereby, a cured protrusion for controlling orientation of the liquid crystal was formed on the substrate for a liquid crystal display device.

| | | Contrast | | | Color difference | |
|---|---|---|---|---|---|---|
| | Film of the pigment | Film of the colored | Color filter | | Color filter | |
| Examples | dispersion composition (a) | photosensitive resin composition (b) | (Coating method) (c) | (Laminating method) (d) | (Coating method) (e) | (Laminating method) (f) |
| Example 1 | 12000 | 11700 | 7000 | 6900 | 0.4 | 0.5 |
| Example 2 | 12000 | 11700 | 7000 | 6900 | 0.4 | 0.5 |
| Example 3 | 12000 | 11700 | 7000 | 6900 | 0.4 | 0.5 |
| Example 4 | 11800 | 11500 | 6800 | 6700 | 0.4 | 0.5 |
| Example 5 | 11800 | 11500 | 6800 | 6700 | 0.4 | 0.5 |
| Example 6 | 11800 | 11500 | 6800 | 6700 | 0.4 | 0.5 |
| Comparative example 1 | 7200 | 7000 | 3200 | 3100 | 1.8 | 1.9 |

[Evaluation of Liquid Crystal Display Device]

Liquid crystal display devices were prepared by using the color filters A to F and A1 to F1, and the display characteristics thereof were evaluated.

(Formation of ITO Electrode)

A glass substrate having a color filter formed thereon was loaded in a sputter apparatus, and 1300 Å thick ITO (indium tin oxide) was vacuum deposited at 10° C. on the whole surface of the said glass substrate. Thereafter, annealing at 240° C. for 90 minutes was performed, to crystallize the ITO. Thus, ITO transparent electrode was formed.

(Formation of Spacer)

A spacer was formed on the thus-prepared ITO transparent electrode in the same manner as the spacer-forming method described in Example 1 of JP-A-2004-240335.

<Formulation of Positive-Type Photosensitive-Resin-Layer Coating Liquid>

| | |
|---|---|
| Positive-type resist solution (FH-2413F manufactured by Fuji Film Electronics Materials) | 53.3 mass parts |
| Methyl ethyl ketone | 46.7 mass parts |
| Megafac F-780F (manufactured by Dainippon Ink & Chemicals Incorporation) | 0.04 mass part |

(Production of Liquid Crystal Display Devices)

An alignment film composed of polyimide was further provided on the thus-obtained substrate for a liquid crystal display device.

Thereafter, a sealing agent made of an epoxy resin was printed at the positions corresponding to the outer frame of the black matrix that was disposed so as to surround the periphery of the pixels of the color filter. In addition, after dropping thereon a liquid crystal for MVA-mode, the above-described substrate and a counter substrate were stuck together. The stuck substrates were subjected to a thermal processing to cure the sealing agent. On each surface of the thus-obtained liquid crystal cell, a polarizing plate HLC2-2518 manufactured by Sanritz Corporation was stuck together. Subsequently, a backlight with a three-wavelength cold-cathode tube light source (FWL18EX-N manufactured by Toshiba Lighting & Technology Corporation) was formed, and the backlight was set at the back side of the liquid crystal cell provided with the polarizing plates. Thus, the liquid crystal display device was produced.

Liquid crystal display devices prepared by using the color filters according to the present invention had excellent display characteristics superior in display blackness and red reproducibility, compared to liquid crystal display devices prepared by using the color filters G and G1 of Comparative Examples.

INDUSTRIAL APPLICABILITY

According to the method of producing fine particles of an anthraquinone structure-containing pigment of the present invention, it is possible to produce nanometer-sized fine particles of an anthraquinone structure-containing pigment that have a sharp particle size distribution. Therefore, the fine particles of an anthraquinone structure-containing pigment produced by the producing method of the present invention are suitable for use in color filters and liquid crystal display devices.

Having described our invention as related to the present embodiments, it is our intention that the invention not be limited by any of the details of the description, unless otherwise specified, but rather be construed broadly within its spirit and scope as set out in the accompanying claims.

The invention claimed is:

1. A method of producing fine particles of an anthraquinone structure-containing pigment, comprising: mixing a solution of an anthraquinone structure-containing pigment dissolved in a good solvent with a solvent that is compatible with the good solvent but is a poor solvent for the pigment, to form fine particles of nanometer-sized pigments, wherein the good solvent is a sulfoxide-series solvent, an amide-series solvent, or a mixed solvent thereof.

2. The method of producing fine particles of an anthraquinone structure-containing pigment according to claim 1, wherein the good solvent contains a pigment dispersing agent and the pigment dispersing agent is a pigment dispersing agent including a graft copolymer having a nitrogen atom and an ether group.

3. The method of producing fine particles of an anthraquinone structure-containing pigment according to claim 1, wherein the good solvent contains a pigment dispersing agent and the pigment dispersing agent is a pigment dispersing agent containing at least one kind of compound represented by formula (I):

$$A\text{-}N\!\!=\!\!N\text{---}X\text{---}Y \quad \text{Formula (I)}$$

wherein A represents a component capable of forming an azo dye together with X—Y; X represents a single bond, or a group selected from divalent connecting groups represented by structural formulae of formulae (i) to (v) set forth below; and Y represents a group represented by the following formula (II);

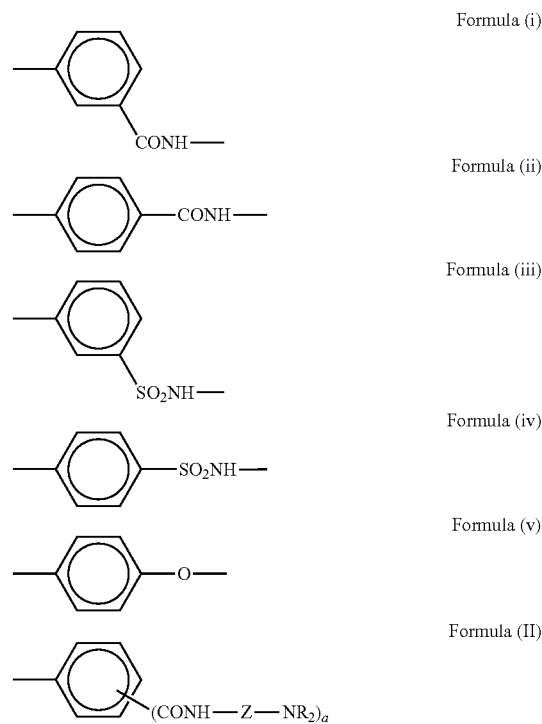

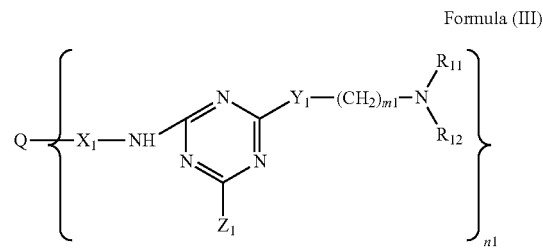

wherein Z represents a lower alkylene group; —NR$_2$ represents a lower alkylamino group, or a nitrogen-containing, 5- or 6-membered, saturated heterocyclic group; and a represents 1 or 2.

4. The method of producing fine particles of an anthraquinone structure-containing pigment according to claim 1, wherein the good solvent contains a pigment dispersing agent and the pigment dispersing agent is a pigment dispersing agent containing at least one kind of compound represented by formula (III):

wherein Q represents a residue of an organic dye selected from anthraquinone-series dyes, azo-series dyes, phthalocyanine-series dyes, quinacridone-series dyes, dioxazine-series dyes, anthrapyrimidine-series dyes, anthanthrone-series dyes, indanthrone-series dyes, flavanthrone-series dyes, pyranthrone-series dyes, perynone-series dyes, perylene-series dyes, and thioindigo-series dyes; $X_1$ represents —CONH—$Y_2$-, —SO$_2$NH—$Y_2$-, or —CH$_2$NHCOCH$_2$NH—$Y_2$-; $Y_2$ represents an alkylene group or an arylene group, each of which may be substituted; $R_{11}$ and $R_{12}$ each independently represent a substituted or unsubstituted alkyl group, alternatively, $R_{11}$ and $R_{12}$ represent groups that bond together to form a heterocyclic group which at least contains a nitrogen atom; $Y_1$ represents —NH— or —O—; $Z_1$ represents a hydroxyl group or a group represented by formula (IIIa) with the proviso that in the case where n1 is 1, $Z_1$ may be —NH—$X_1$-Q; m1 represents an integer of 1 to 6; and n1 represents an integer of 1 to 4; and

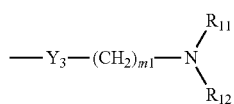

Formula (IIIa)

wherein $Y_3$ represents —NH— or —O—; and m1, $R_{11}$, and $R_{12}$ have the same meanings as those in formula (III).

5. The method of producing fine particles of an anthraquinone structure-containing pigment according to claim 1, wherein number-averaged particle diameter of the fine particles of a pigment produced by the method is 5 to 80 nm.

6. The method of producing fine particles of an anthraquinone structure-containing pigment according to claim 1, wherein the ratio (Mv/Mn) of volume-averaged diameter (Mv) to number-averaged diameter (Mn) of the fine particles of a pigment produced by the method is 1.0 to 1.4.

7. Fine particles of an anthraquinone structure-containing pigment produced by a method of producing fine particles of an anthraquinone structure-containing pigment, comprising: mixing a solution of an anthraquinone structure-containing pigment dissolved in a good solvent with a solvent that is compatible with the good solvent but is a poor solvent for the pigment, to form fine particles of nanometer-sized pigments, wherein the fine particles are nanometer-sized particles.

8. The fine particles of an anthraquinone structure-containing pigment according to claim 7, wherein the anthraquinone structure-containing pigment is C.I.P.R. 177.

9. The fine particles of an anthraquinone structure-containing pigment according to claim 7, wherein number-averaged particle diameter of the fine particles of a pigment is 5 to 80 nm.

10. The fine particles of an anthraquinone structure-containing pigment according to claim 7, wherein the ratio (Mv/Mn) of volume-averaged diameter (Mv) to number-averaged diameter (Mn) of the fine particles of a pigment is 1.0 to 1.4.

11. A method of producing a colored pigment dispersion composition, comprising the step of (i) extracting the fine particles of a pigment according to claim 7 into an organic solvent and adding a binder to the thus-obtained extract or (ii) extracting the fine particles of a pigment according to claim 9 into an organic solvent containing a binder.

12. A colored pigment dispersion composition produced by a method comprising the step of
(i) extracting fine particles of a pigment produced by mixing a solution of an anthraquinone structure-containing pigment dissolved in a good solvent with a solvent that is compatible with the good solvent but is a poor solvent for the pigment, to form fine particles of nanometer-sized pigments, into an organic solvent and adding a binder to the thus-obtained extract or
(ii) extracting fine particles of a pigment produced by mixing a solution of an anthraquinone structure-containing pigment dissolved in a good solvent with a solvent that is compatible with the good solvent but is a poor solvent for the pigment, to form fine particles of nanometer-sized pigments, into an organic solvent containing a binder.

13. A colored photosensitive resin composition, comprising at least
(a) a colored pigment dispersion composition produced by a method comprising the step of
(i) extracting fine particles of a pigment produced by mixing a solution of an anthraquinone structure-containing pigment dissolved in a good solvent with a solvent that is compatible with the good solvent but is a poor solvent for the pigment, to form fine particles of nanometer-sized pigments, into an organic solvent and adding a binder to the thus-obtained extract or
(ii) extracting fine particles of a pigment produced by mixing a solution of an anthraquinone structure-containing pigment dissolved in a good solvent with a solvent that is compatible with the good solvent but is a poor solvent for the pigment, to form fine particles of nanometer-sized pigments, into an organic solvent containing a binder,
(b) a binder,
(c) a monomer or an oligomer, and
(d) a photopolymerization initiator or a photopolymerization initiator system.

14. A photosensitive resin transfer material, having at least a photosensitive resin layer containing a colored photosensitive resin composition comprising at least
(a) a colored pigment dispersion composition produced by a method comprising the step of
(i) extracting fine particles of a pigment produced by mixing a solution of an anthraquinone structure-containing pigment dissolved in a good solvent with a solvent that is compatible with the good solvent but is a poor solvent for the pigment, to form fine particles of nanometer-sized pigments, into an organic solvent and adding a binder to the thus-obtained extract or
(ii) extracting fine particles of a pigment produced by mixing a solution of an anthraquinone structure-containing pigment dissolved in a good solvent with a solvent that is compatible with the good solvent but is a poor solvent for the pigment, to form fine particles of nanometer-sized pigments, into an organic solvent containing a binder,
(b) a binder,
(c) a monomer or an oligomer, and
(d) a photopolymerization initiator or a photopolymerization initiator system formed on a temporary support.

15. A color filter, prepared by using a colored photosensitive resin composition comprising at least
(a) a colored pigment dispersion composition produced by a method comprising the step of
(i) extracting fine particles of a pigment produced by mixing a solution of an anthraquinone structure-containing pigment dissolved in a good solvent with a solvent that is compatible with the good solvent but is a poor solvent for the pigment, to form fine particles of nanometer-sized pigments, into an organic solvent and adding a binder to the thus-obtained extract or
(ii) extracting fine particles of a pigment produced by mixing a solution of an anthraquinone structure-containing pigment dissolved in a good solvent with a solvent that is compatible with the good solvent but is a poor solvent for the pigment, to form fine particles of nanometer-sized pigments, into an organic solvent containing a binder,
(b) a binder, (c) a monomer or an oligomer, and (d) a photopolymerization initiator or a photopolymerization initiator system.

16. A liquid crystal display device installed with a color filter prepared by using a colored photosensitive resin composition comprising at least (a) a colored pigment dispersion composition produced by a method comprising the step of (i) extracting fine particles of a pigment produced by mixing a solution of an anthraquinone structure-containing pigment dissolved in a good solvent with a solvent that is compatible with the good solvent but is a poor solvent for the pigment, to form fine particles of nanometer-sized pigments, into an organic solvent and adding a binder to the thus-obtained extract or (ii) extracting fine particles of a pigment produced by mixing a solution of an anthraquinone structure-containing pigment dissolved in a good solvent with a solvent that is compatible with the good solvent but is a poor solvent for the pigment, to form fine particles of nanometer-sized pigments, into an organic solvent containing a binder, (b) a binder, (c) a monomer or an oligomer, and (d) a photopolymerization initiator or a photopolymerization initiator system.

* * * * *